United States Patent
Asakawa et al.

(10) Patent No.: US 6,280,897 B1
(45) Date of Patent: Aug. 28, 2001

(54) PHOTOSENSITIVE COMPOSITION, METHOD FOR FORMING PATTERN USING THE SAME, AND METHOD FOR MANUFACTURING ELECTRONIC PARTS

(75) Inventors: Koji Asakawa, Kawasaki; Naoko Kihara, Matsudo; Naomi Shida, Kawasaki; Toru Ushirogouchi; Takeshi Okino, both of Yokohama; Makoto Nakase, Tokyo; Takuya Naito, Kawasaki; Satoshi Saito, Yokohama, all of (JP)

(73) Assignee: Kabushiki Kaisha Toshiba, Kawasaki-shi (JP)

( * ) Notice: Subject to any disclaimer, the term of this patent is extended or adjusted under 35 U.S.C. 154(b) by 0 days.

(21) Appl. No.: 08/997,623

(22) Filed: Dec. 23, 1997

(30) Foreign Application Priority Data

Dec. 24, 1996 (JP) .................................................... 8-344037
Jan. 21, 1997 (JP) .................................................... 9-008819
Jul. 15, 1997 (JP) .................................................... 9-189929

(51) Int. Cl.$^7$ .............................. G03F 7/004; G03F 7/30
(52) U.S. Cl. ...................... 430/270.1; 430/326; 430/330; 430/905; 430/910
(58) Field of Search .............................. 430/270.1, 905, 430/910, 326, 330

(56) References Cited

U.S. PATENT DOCUMENTS

| | | | | |
|---|---|---|---|---|
| 5,443,690 | * | 8/1995 | Takechi et al. | 430/286.1 |
| 5,851,727 | * | 12/1998 | Choi et al. | 430/270.1 |
| 5,962,184 | * | 10/1999 | Allen et al. | 430/270.1 |
| 5,968,713 | * | 10/1999 | Nozaki et al. | 430/326 |

OTHER PUBLICATIONS

K. Maeda, et al. "Novel Alkaline–Soluble Alicyclic Polymer Poly(TCDMACOOH) for ArF Chemically Amplified Positive Resists", Proc. SPIE, vol. 2724, Mar. 11, 1996, pp. 377–385.

S. Takechi, et al. "Impact of 2–Methyl–2–Adamantyl Group Used for 193–nm Single–Layer Resist", Journal of Photopolymer Science and Technology, vol. 9, No. 3, Jun. 29, 1996, pp. 475–487.

K. Nozaki, et al. "Novel Polymer for a 193–nm Resist", Journal of Photopolymer Science and Technology, vol. 9. No. 3, Jun. 29, 1996, pp. 509–522.

* cited by examiner

Primary Examiner—John S. Chu
(74) Attorney, Agent, or Firm—Oblon, Spivak, McClelland, Maier & Neustadt, P.C.

(57) ABSTRACT

A photosensitive composition comprising a polymer having a repeating segment represented by the following general formula (1A) and a compound which is capable of generating an acid by irradiation of an actinic radiation.

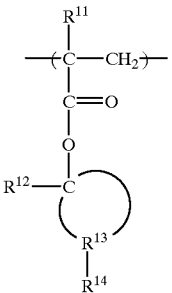

(1A)

wherein $R^{11}$ is a hydrogen atom, an aliphatic hydrocarbon group, an alcoxy group, a halogen atom or a cyano group, $R^{12}$ is an aliphatic hydrocarbon group or a cyclic olefin, $R^{13}$ is either one of (a) a straight-chain olefin having 2 to 12 carbon atoms, a cyclic olefin or a heterocyclic group and (b) a hydrocarbon group represented by —$(CH_2)_m$—(m is an integer of 3 to 9), and $R^{14}$ is a hydrophilic group.

12 Claims, 2 Drawing Sheets

PHOTOSENSITIVE COMPOSITION, METHOD FOR FORMING PATTERN USING THE SAME, AND METHOD FOR MANUFACTURING ELECTRONIC PARTS

BACKGROUND OF THE INVENTION

This invention relates to a photosensitive composition suited as a resist used in a fine working of a semiconductor device (particularly large scale integrated circuit (LSI)), a thin-film magnetic head such as hard disc drive and a liquid crystal display, and a method for forming a pattern and a method for manufacturing electronic parts.

In the field of electronic parts to which various kinds of fine workings are required, including a semiconductor integrated circuit device such as LSI, a thin-film magnetic head such as hard disc drive, and a liquid crystal display, a fine pattern is formed by means of a photolithography technique using a resist. Particularly, the formation of a more fine resist pattern has recently been required with the diversification as well as realization of a wide variety of functions and high density. As one measure for forming a fine resist pattern, for example, there is a realization of short wavelength of a light source for light exposure. Recently, a technique for forming a resist pattern using, as a light source for light exposure, short-wavelength light such as ArF excimer laser (193 nm) and quintuple harmonic (213 nm) of YAG laser has been developed.

However, since a normal resist material transmits light in this wave-length in an order of only about 1/30 micron so that exposure light cannot sufficiently reach the part far from the surface of a resist film at the exposure, i.e. the substrate side portion of the resist film. As a result, such a resist material has a problem that it is difficult to form a fine pattern even if exposure light source with a short wavelength is used.

In order to sufficiently exert an effect for realize such short wavelength of the exposure light thereby forming a fine pattern, a resist having high transparency to light with the above wavelength is essential. Furthermore, in order to perform a fine working of a wiring pattern by making using of the resulting resist pattern as an etch mask, it is required for the resist to have sufficient dry etch resistance.

Therefore, Jnp. Pat. Appln. KOKAI Publication No. (hereinafter referred to as JP-A-)4-39665 discloses, as a resist material having excellent light transparency, a resist comprising copolymer obtained by copolymerizing a monomer having an aliphatic hydrocarbon in its skeleton and a monomer having an alkali-solubility. This resist has excellent light transparency and sufficient dry etch resistance, but is inferior in solubility to a developer. The copolymer to be contained in this resist is a polymer obtained by copolymerizing two kinds of monomers having physical properties which conflict each other, i.e. alicyclic compound exhibiting no alkali-solubility and carboxylic acid compound strongly exhibiting an alkali-solubility. Accordingly, when a resist pattern is formed by using such a resist, it is not avoided that only the portion exhibiting the alkali-solubility dissolves in case of development to cause heterogeneous dissolution. As a result, sufficient resolution is not easily obtained and a crack or a surface roughness is liable to be caused by partial dissolution at the non-exposure part of the resist film so that a reproducibility of the pattern formation was low. Furthermore, a developer penetrates into an interface between a resist film and a substrate. In the worst case, a pattern collapses. In addition, such a copolymer is liable to cause phase separation and dissolution into a solvent is heterogeneous and, therefore, there is a large problem about selection of a solvent for coating and coating properties onto the substrate.

A resist containing a conjugated heteroaromatic ring compound is proposed in Jpn. Pat. Appl. No. 5-4953. Such a resist is superior in dry etch resistance, and the alkali-solubility, solubility in a solvent and adhesion with a substrate are the same as those of a conventional phenol resin. However, since the transparency to the above short-wavelength light is inferior to the former, a pattern can not be formed in high precision.

As described above, it is desired to develop a resist material which exhibits high transparency to short-wavelength light such as ArF excimer laser and $F_2$ excimer laser with excellent alkali-solubility, and which has good resolution and good reproducibility as well as sufficient dry etch resistance for a fine working. However, a resist material provided with such conditions is still to be obtained.

In order to obtain sufficient dry etch resistance, an alicyclic compound is preferably a polycyclic one and, therefore, a bulky substituent tends to be selected as a substituent of an acrylic ester.

However, when a bulky alicyclic compound is selected as a substituent in order to improve the dry etch resistance, the following disadvantage arises. That is, an acidic group which imparts an alkali-solubility to a polymer, such as carboxyl group, constitutes a backbone chain of the same acrylic unit of a copolymer, together with the alicyclic compound. Therefore, a distance from the backbone chain of the acidic group normally becomes shorter than that of a bulky ester group. In case of a high-dimensional structure of the copolymer, it is not avoided to be exerted by an influence of steric hindrance of an alicyclic substituent having high hydrophobic nature. That is, approach of the alkaline molecular in a developer to an acidic group or an interaction between a resist film and the surface of a substrate is inhibited. Accordingly, it becomes difficult to obtain suitable dissolution characteristics of the resist film to the developer so that sufficient adhesion between the resist film and substrate can not be obtained.

As a result, sufficient resolution cannot be easily obtained and a crack or surface roughness is liable to be caused by partial dissolution at the non-exposure part of the resist film so that the reproducibility of the formation of a pattern was low. Besides, since the adhesion between the resulting resist pattern and substrate is not sufficient, a developer penetrates into an interface between a resist film and a substrate. In the worst case, a pattern collapses.

As a resist which has sufficiently high dry etch resistance and is capable of performing an alkaline development, for example, there is a chemically amplified resist as disclosed in JA-P-63-27829. This chemically amplified resist is a composition containing an alkali-soluble resin, a solubility inhibitor and a compound which is capable of generating an acid by irradiation of an actinic radiation (photo-acid generator), and the solubility in an alkaline developer is inhibited by a solubility inhibitor in the state of non-exposure. On the other hand, when the resist film formed on the substrate is irradiated by ultraviolet rays, X-rays or high-energy electron beam, this photo-acid generator is decomposed to generate an acid. Furthermore, this acid acts as a catalyst by subjecting to a baking treatment, thereby decomposing a solubility inhibitor. Consequently, the light-exposed portion of the resist film selectively exhibit an alkali-solubility and dissolves in a developer to form a pattern. Such a resist is a positive type resist.

Such a chemically amplified resist makes is possible to enhance an alkali-solubility of only the light-exposed portion in the resist film by the following baking step using, as a catalyst, a trace amount of an acid generated by a short-time light exposure, thereby differentiating the solubility from that of the non-exposure portion. Therefore, the formation of a resist pattern using the chemically amplified resist has such an advantage that an amount of the exposure light can be reduced and high sensitivity can be easily performed. On the other hand, it is necessary to perform higher sensitization of a resist due to requirements of high densification and high productivity of a device.

In the chemically amplified resist, high sensitization can be performed by baking at high temperature at the step following the light exposure, thereby allowing to proceed a thermal reaction. However, long-time baking is generally accompanied by deterioration of a pattern profile. A method of adding a large amount of a photo-acid generator as a catalyst of the thermal reaction to increase an amount of an acid generated by the light exposure is also considered to be an effective technique. In this case, however, the transparency in the wavelength of the exposure light is lowered, thereby also causing deterioration of a pattern profile. In an electron beam resist whose transparency is not a particular object, the improvement in sensitivity by such a technique is advantageous. On the other hand, a reduction in drawing time as a result of the realization of high densification of the device is a large problem in view of photolithography so that high sensitization of the resist is desired.

As described above, a measure capable of performing the improvement in sensitivity, which is better than that by the chemically amplified resist, is required as a resist having an alkaline-solubility, high dry etch resistance and high sensitivity. Particularly, in a 1 Gbit DRAM device, the production by an electron beam direct drawing is now studying and high sensitivity is essential. Therefore, a measure of high sensitization having an effect larger than that of the chemically amplified resist has been required.

BRIEF SUMMARY OF THE INVENTION

The object of this invention to provide a photosensitive composition suited for use as a resist material which exhibits high light transmission to deep ultraviolet rays having a short wavelength, and has excellent alkali-solubility, good adhesion with a substrate and good dry etch resistance.

Further object of this invention is to provide a photosensitive composition which is capable of forming a resist pattern having high contrast, excellent alkali-solubility after light exposure and good adhesion with a substrate, in high resolution, with maintaining transparency to short-wavelength light and high dry etch resistance.

Still further object of this invention is to provide a photosensitive composition for alkaline development, which is capable of forming a resist pattern having high sensitivity and high resolution to irradiation of an actinic radiation and having sufficient dry etch resistance by means of an alkaline development.

Still further object of this invention is to provide a method of forming a pattern using the above photosensitive composition, and a method of manufacturing electronic parts.

According to this invention, there is provided a photosensitive composition comprising a polymer having a repeating segment represented by the following general formula (1A) and a compound which is capable of generating an acid by irradiation of an actinic radiation;

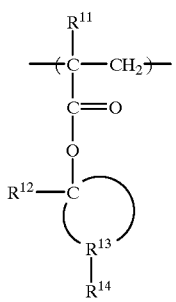

(1A)

wherein $R^{11}$ is a hydrogen atom, an aliphatic hydrocarbon group, an alcoxy group, a halogen atom or a cyano group; $R^{12}$ is an aliphatic hydrocarbon group or a cyclic olefin; $R^{13}$ is either one of (a) a straight chain olefin having 2 to 12 carbon atoms, a cyclic olefin or a hetrocyclic group and (b) a hydrocarbon group represented by —$(CH_2)_m$— (m is an integer of 3 to 9); and $R^{14}$ is a hydrophilic group.

According to this invention, there is also provided a photosensitive composition comprising a polymer having a repeating segment represented by the following general formula (1B) and a compound which is capable of generating an acid by irradiation of an actinic radiation, wherein the composition has an aromatic ring with conjugation length of 4 to 12, the aromatic ring is contained in a component copolymerized with the polymer, or the aromatic ring is contained in another compound separately added;

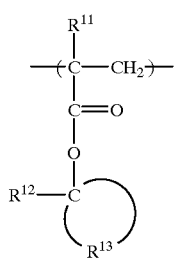

(1B)

wherein $R^{11}$ is a hydrogen atom, an aliphatic hydrocarbon group, an alcoxy group, a halogen atom or a cyano group; $R^{12}$ is an aliphatic hydrocarbon group or a cyclic olefin; and $R^{13}$ is either one of (a) a straight chain olefin having 2 to 12 carbon atoms, a cyclic olefin or a heterocyclic group and (b) a hydrocarbon group represented by —$(CH_2)_m$— (m is an integer of 3 to 9).

According to this invention, there is also provided a photosensitive composition comprising:

a polymer having at least one selected from the group consisting of a repeating segment represented by the following general formula (2) and a repeating segment represented by the following general formula (3); and a compound which is capable of generating an acid by irradiation of an actinic radiation, (2)

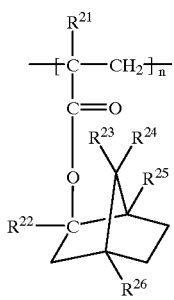

wherein $R^{21}$ is a hydrogen atom, an aliphatic hydrocarbon group, an alcoxy group, a halogen atom or a cyano group; $R^{22}$ is an aliphatic hydrocarbon group or a cyclic olefin; and $R^{23}$, $R^{24}$, $R^{25}$ and $R^{26}$ may be the same or different and are individually a hydrogen atom or a hydrocarbon group having 6 carbon atoms or less, (3)

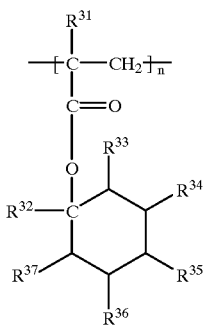

wherein $R^{31}$ is a hydrogen atom, an aliphatic hydrocarbon group, an alcoxy group, a halogen atom or a cyano group; $R^{32}$ is an aliphatic hydrocarbon group or a cyclic olefin; and at least one of $R^{33}$, $R^{34}$, $R^{35}$, $R^{36}$ and $R^{37}$ is a hydrocarbon group having 6 carbon atoms or less and the rest of them may be the same or different and are individually selected from the group consisting of a hydrogen atom, an aliphatic hydrocarbon, an alcoxy group, a halogen atom and a cyano group.

According to this invention, there is also provided a photosensitive composition comprising a polymer having a repeating segment represented by the following general formula (4) and a compound which is capable of generating an acid by irradiation of an actinic radiation;

(4)

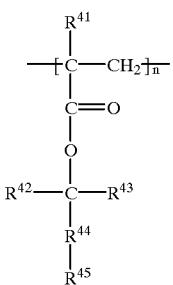

wherein $R^{41}$ is a hydrogen atom, an aliphatic hydrocarbon group, an alcoxy group, a halogen atom or a cyano group; $R^{42}$ and $R^{43}$ may be the same or different and are individually an aliphatic hydrocarbon or a cyclic olefin; $R^{44}$ is a cyclic olefin or a heterocyclic group; and $R^{45}$ is a hydrophilic group.

According to this invention, there is also provided a photosensitive composition comprising a polymer having a repeating segment represented by the following general formula (6) and a compound which is capable of generating an acid by irradiation of an actinic radiation:

(6)

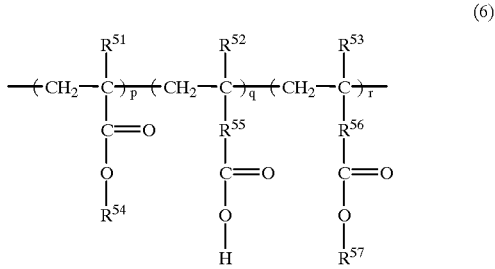

wherein $R^{51}$, $R^{52}$ and $R^{53}$ may be the same or different and are individually a hydrogen atom, a halogen atom, a cyano group or a univalent organic group; $R^{54}$ is a univalent alicyclic organic group; $R^{55}$ and $R^{56}$ may be the same or different and are individually a divalent group containing at least one of C, N, S or O; and $R^{57}$ is a univalent organic group which is capable of generating an alkali-soluble group as it is decomposed by a catalytic action of an acid; and p, q and r are individually a natural number which satisfies $p \geq 0$, $q > 0$ and $r \geq 0$ (provided p and r are not 0, simultaneously).

According to the present invention, a photosensitive composition comprising a polymer having at least one of a repeating segment represented by the following general formula (7) and a repeating segment represented by the following general formula (8), and a compound which is capable of generating an acid by irradiation of an actinic radiation;

(7)

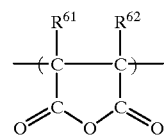

wherein $R^{61}$ and $R^{62}$ may be the same or different and are individually a halogen atom, a hydrogen atom, an alkyl group, an aromatic group or a univalent substituent, provided at least one of $R^{61}$ and $R^{62}$ is a halogen atom;

(8)

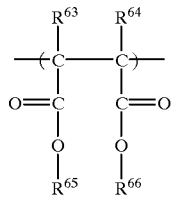

wherein $R^{63}$ and $R^{64}$ may be the same or different and are individually a halogen atom, a hydrogen atom, an alkyl group, an aromatic group or a univalent substituent, provided at least one of $R^{63}$ and $R^{64}$ is a halogen atom; and $R^{65}$ and $R^{66}$ are individually a hydrogen atom, an alkyl group, an aromatic group or a univalent substituent.

According to the present invention, there is also provided a method for forming a pattern, which comprises the steps of:

coating any one of the above photosensitive compositions on a substrate, and drying the composition with heating thereby forming a resin layer;

exposing a predetermined area of said resin layer to a pattern exposure by means of light irradiation;

performing a heat treatment of said resin layer after the pattern exposure; and developing said resin layer after the heat treatment by using an alkaline developer.

According to this invention, there is also provided a method for manufacturing electronic parts, which comprises the steps of:

coating any one of the above photosensitive compositions on a substrate thereby forming a resist film;

exposing a predetermined area of said resist film to a pattern exposure by means of light irradiation;

developing said resin film after the pattern exposure by using a developer thereby forming a resist pattern; and performing a patterning of the substrate by making use of the resist pattern as an etch mask.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

Figure 1:
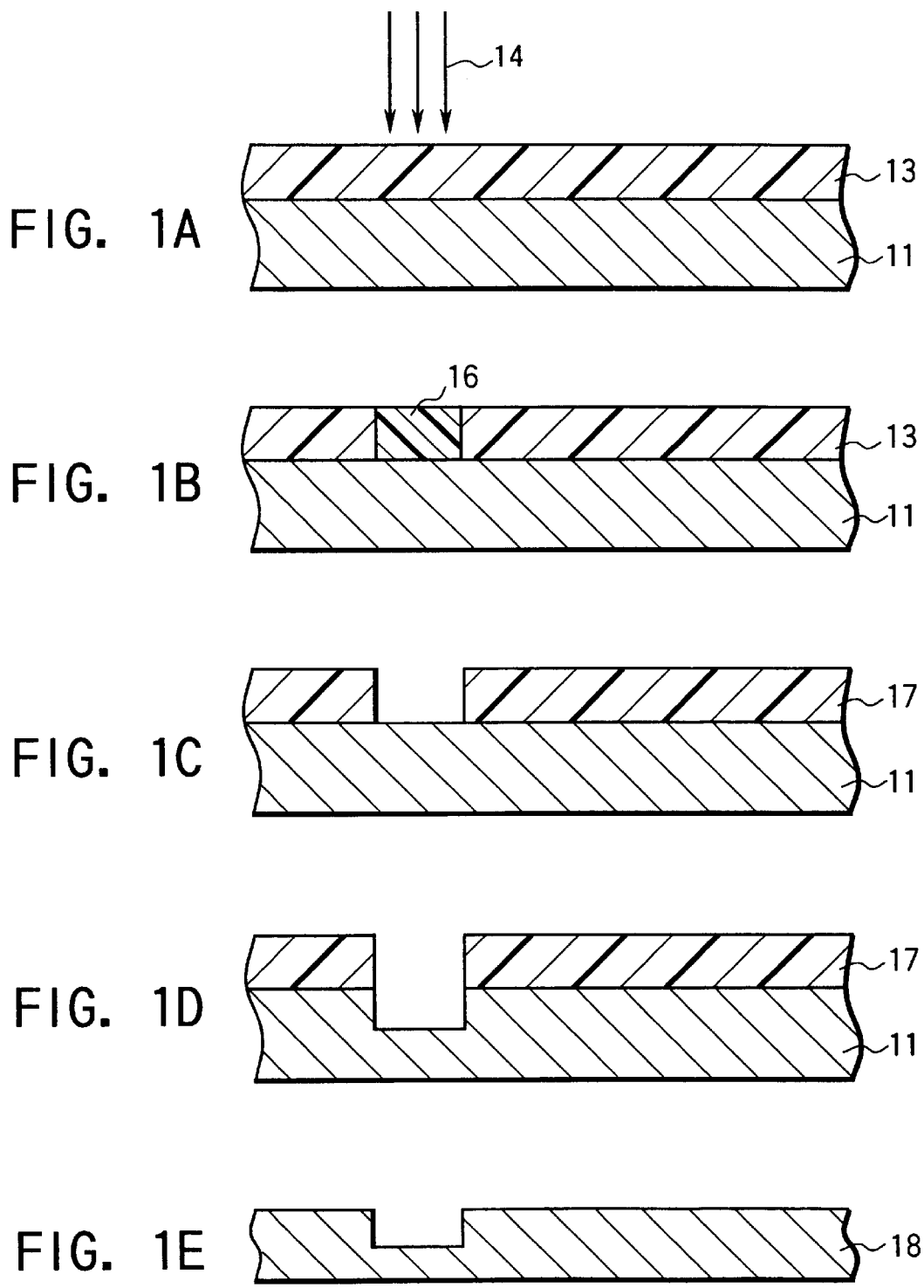
FIGS. 1A to 1E illustrate sectional views schematically showing a part of the manufacturing process of electronic parts using the photosensitive composition of this invention.

This invention will be explained in detail below.

The photosensitive composition of the first embodiment of this invention contains a polymer having a repeating segment represented by the above general formula (1A), (1B) or (4).

In the above general formulas (1A) and (1B), the alcoxy group to be introduced as $R^{11}$ is not specifically limited, and examples thereof are methoxy group and ethoxy group. Examples of the aliphatic hydrocarbon group to be introduced as $R^{12}$ are methyl group and ethyl group. Furthermore, examples of the cyclic olefin are cyclobutane ring, cyclopentane ring, cyclohexane ring, cycloheptane ring, cyclooctane ring, those wherein crosslinking hydrocarbon is introduced, spiro ring (e.g. spiroheptane, spirooctane, etc.), terpene ring (e.g. norbonyl ring, bornene ring, menthyl ring, menthane ring, etc.), steroid (e.g. thujane, sabinane, thujone, carane, carene, pinane, norpinane, bornane, fencane, tricyclene, cholesteric ring, etc.), bile acid, digitaloid ring, camphor ring, iso-camphor ring, sesquiterpene ring, santon ring, diterpene ring, triterpene ring and steroid saponins. These cyclic olefins may contain an oxygen atom in the ring to form furan or pyran.

$R^{13}$ in the general formulas (1A) and (1B) may contains a branch in the structure, and may contains an oxygen atom or an nitrogen atom in the ring. In view of the stability of the cyclic portion, a six-membered ring or five-membered ring having slight strain therein or a combination thereof is preferable as $R^{13}$.

Example of the hydrophilic group introduced as $R^{14}$ in the general formula (1A) are hydroxyl group and carboxyl group.

Examples of the repeating segment represented by the general formula (1B) are those represented by the following general formula (2) or (3).

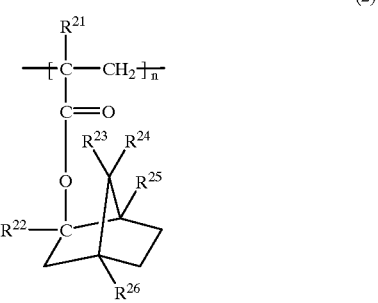

(2)

wherein $R^{21}$ is a hydrogen atom, an aliphatic hydrocarbon group, an alcoxy group, a halogen atom or a cyano group; $R^{22}$ is an aliphatic hydrocarbon group or a cyclic olefin; and $R^{23}$, $R^{24}$, $R^{25}$ and $R^{26}$ may be the same or different and are individually a hydrogen atom or a hydrocarbon group having 6 carbon atoms or less.

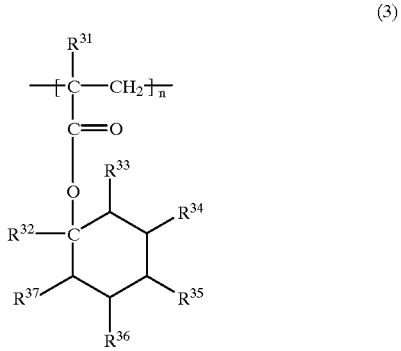

(3)

wherein $R^{31}$ is a hydrogen atom, an aliphatic hydrocarbon group, an alcoxy group, a halogen atom or a cyano group; $R^{32}$ is an aliphatic hydrocarbon group or a cyclic olefin; and at least one of $R^{33}$, $R^{34}$, $R^{35}$, $R^{36}$ and $R^{37}$ is a hydrocarbon group having 6 carbon atoms or less and the rest of them may be the same or different and are individually selected from the group consisting of a hydrogen atom, an aliphatic hydrocarbon, an alcoxy group, a halogen atom and a cyano group.

As $R^{21}$ in the general formula (2) and $R^{31}$ in the general formula (3), it is possible to introduce the same groups as those of $R^{11}$ in the above general formulas (1A) and (1B). As $R^{22}$ in the general formula (2) and $R^{32}$ in the general formula (3), it is possible to introduce the same groups as those of $R^{12}$ in the above general formulas (1A) and (1B).

In the general formula (2), even when a hydrogen atom is introduced into all of $R^{23}$ to $R^{26}$, the structure becomes flexible compared with an adamantyl derivative and, therefore, it is preferable. When a hydrocarbon group having 6 carbon atoms or less is introduced into at least one of $R^{23}$ to $R^{26}$, the symmetry becomes small and, therefore, it is advantageous in view of the improvement in solubility. Examples of the hydrocarbon group to be introduced are methyl group, ethyl group and isopropyl group. Among them, methyl group is particularly preferable. Such a hydrocarbon group can be introduced as any one of $R^{33}$ to $R^{37}$.

In the general formula (4), examples of the aliphatic hydrocarbon group or alcoxy group to be introduced as $R^{41}$ are those as described above. As the cyclic olefin to be introduced as $R^{42}$ and $R^{43}$, there can be used those as described above. Examples of the heterocyclic group which can be introduced as $R^{44}$ are cyclobutane ring, cyclopentane ring, cyclohexane ring, cycloheptane ring, cyclooctane ring, those wherein crosslinking hydrocarbon is introduced, spiro ring (e.g. spiroheptane, spirooctane, etc.), terpene ring (e.g. norbonyl ring, bornene ring, menthyl ring, menthane ring, etc.), steroid (e.g. thujane, sabinane, thujone, carane, carene, pinane, norpinane, bornane, fencane, tricyclene, cholesteric ring, etc.), bile acid, digitaloid ring, camphor ring, iso-camphor ring, sesquiterpene ring, santon ring, diterpene ring, triterpene ring and steroid saponins. Examples of the hydrophilc group to be introduced as $R^{45}$ are hydroxyl group, carboxyl group, sulfonyl group and carbonyl group.

As a repeating segment represented by the general formula (4), for example, there can be used those represented by the following general formula (5):

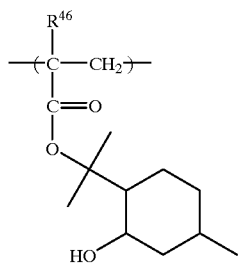

(5)

wherein $R^{46}$ is a hydrogen atom, an aliphatic hydrocarbon group, an alcoxy group, a halogen atom or a cyano group.

In the first photosensitive composition of this invention, the polymer may be a homopolymer having only the above repeating segment or a copolymer having the other repeating segment, and is used as an alkali-soluble resin. In case of preparing the copolymer, for example, a monomer having an alicyclic skeleton, a monomer whose alkali-solubility changes with an acid, and a monomer having an alkali-soluble group can be used in combination with a monomer having a hydroxyalkyl ester on the side chain, that is, the repeating segment represented by any one of the above general formulas (1) to (4). In this case, a proportion of an alkali-soluble compound having a functional group on the side chain is from about 20 to 80 mole %. If the proportion is less than 20 mole %, the dry etch resistance is lowered. On the other hand, if the proportion exceeds 80 mole %, it becomes impossible to impart a change in solubility to an alkaline solution and it is likely to become impossible to form a pattern. When the monomer having an alicyclic skeleton is used in combination as a copolymerization component, the proportion of the repeating segment represented by the above general formulas (1) to (4) may be adjusted to 20 mole % or less as far as the dry etch resistance is not adversely affected.

Examples of the monomer having an alicyclic skeleton which can be copolymerized are methacrylic acid, acrylic acid, α-cyanoacrylic acid, ethylene, vinyl alcohol an hydroxystyrene, which respectively have cyclobutane ring, cyclopentane ring, cyclohexane ring, cycloheptane ring, cyclooctane ring, those wherein crosslinking hydrocarbon is introduced, spiro ring (e.g. spiroheptane, spirooctane, etc.), terpene ring (e.g. norbonyl ring, bornene ring, menthyl ring, menthane ring, etc.), steroid (e.g. thujane, sabinane, thujone, carane, carene, pinane, norpinane, bornane, fencane, tricyclene, cholesteric ring, etc.), bile acid, digitaloid ring, camphor ring, iso-camphor ring, sesquiterpene ring, santon ring, diterpene ring, triterpene ring and steroid saponins on the side chain.

Furthermore, the repeating segments represented by the above general formula (1) to (4) may be copolymerized with a polymerizable compound containing an aromatic ring having a conjugation length of 4 to 12 and the resultant may be used as a copolymer. In case of such a copolymer, the solubility to a resist solvent or an alkaline developer improve and the dry etch resistance improves. Examples of the polymerizable compound containing an aromatic ring having a conjugation length of 4 to 12 are vinylnaphthalene, vinylnaphthol, naphthyl methacrylate and naphthyl acrylate. These monomers may be substituted with an aliphatic hydrocarbon group, an alcoxy group, a halogen atom or a cyano group at the α-position. It is also possible to use anthracene in place of naphthalene.

In the aromatic ring having a conjugation length of 4 to 12, the absorption to light of 193 nm, which is remarkably observed in the benzene ring, shifts to the long-wavelength side. Therefore, the strong absorption, which exceeds 30 per 1 μm to light of 193 nm in the case of benzene ring, is reduced to about 3 to 5 in the case of naphthalene ring. Accordingly, the transmittance of 193 nm is remarkably improved. Since such a compound is an aromatic ring, the adhesion, solubility and dry etch resistance of a conventional resist containing the benzene ring are not deteriorated.

Although the absorption to light of 193 nm of the aromatic ring having a conjugation length of 4 to 12 is smaller than that of the benzene ring, it is considerably greater than that of the aliphatic cyclic compound. Therefore, in order to prepare a resist for wavelength of 193 nm, it is effective to use as a copolymer obtained by using in combination with the repeating segments of the above general formulas (1) to (4).

It is desired that the copolymer containing an aromatic ring having a conjugation length of 4 to 12 transmits at least 10% of light with a wavelength of 193 nm. In order to attain this level, an amount of the aromatic ring having a conjugation length of 4 to 12 to be introduced is preferably decided according to a film thickness of the resist. Specifically, if the film thickness of the resist is not less than 1 μm, the amount of the aromatic ring is preferably not more than 20%. If the film thickness of the resist is from 0.5 to 1 μm, the amount of the aromatic ring is preferably not more than 30%. If the film thickness of the resist is from 0.3 to 0.5 μm, the amount of the aromatic ring is preferably not more than 50%. If the film thickness of the resist from 0.2 to 0.3 μm, the amount of the aromatic ring is preferably not more than 70%. If the film thickness of the resist is less than 0.2 μm, the amount of the aromatic ring is preferably not more than 100%.

The copolymer containing an aromatic ring having a conjugation length of 4 to 12 has more preferably a transmittance of not less than 30% to light with a wavelength of 193 nm. In order to ensure the transmittance of not less than 30%, the amount of the aromatic ring to be introduced is preferably decided as follows according to a film thickness of the resist. That is, if the thickness of the resist film is not less than 1 μm, the amount is preferably not more than 10%. If the film thickness is from 0.5 to 1 μm, the amount is preferably not more than 20%. If the film thickness is from 0.3 to 0.5 μm, the amount is preferably not more than 30%. If the film thickness is from 0.2 to 0.3 μm, the amount is preferably not more than 50%. If the film thickness is from 0.16 to 0.2 μm, the amount is preferably not more than 70%. If the thickness is less than 0.16 μm, the is preferably not more than 100%.

In order to ensure the solubility at the occasion of development, the proportion of the aromatic ring having a conjugation length of 4 to 12 in the copolymer is preferably not less than 1%, more preferably not less than 5%. In order to further improve the adhesion between the resist film and substrate, the proportion of the aromatic ring in the copolymer is not less than 15%, most preferably.

Since the aromatic ring having a conjugation length of 4 to 12 is superior in dry etch resistance, it can functions as the aliphatic cyclic compound. However, since the aromatic ring having a conjugation length of 4 to 12 is slightly inferior in transparency, it is more preferable to use it in combination with the repeating segments of the above general formulas (1) to (4).

Examples of the monomer whose alkali-solubility varies with an acid are methacrylic acid, acrylic acid, α-cyanoacrylic acid, vinyl alcohol and hydroxystyrene, which respectively have esters such as t-butyl ester, isopropyl ester, ethyl ester, methyl ester and benzyl ester; ethers such as tetrahydropyranyl ether; alcoxycarbonates such as t-butoxycarbonate, methoxycarbonate and ethoxycarbonate; silyl ethers such as trimethylsilyl ether, triethylsilyl ether and triphenylsilyl ether; esters such as isopropyl ester, tetrahydropyranyl ester, tetrahydrofuranyl ester, methoxyethoxymethyl ester, 2-trimethylsilylethoxymethyl ester, 3-oxocyclohexyl ester, isobornyl ester, trimethylsilyl ester, triethylsilyl ester, isopropyldimethylsilyl ester, di-t-butylmethylsilyl ester, oxazole, 3-alkyl 1,3-oxazoline, 4-alkyl-5-oxo-1,3 oxazoline and 5-alkyl-4-oxo-1,3-dioxolane; ethers such as t-butoxycarbonyl ether, t-butoxymethyl ether, 4-pentenyloxymethyl ether, tetrahydropyranyl ether, tetrahydrothiopyranyl ether, 3-bromotetrahydropyranyl ether, 1-methoxycyclohexyl ether, 4-methoxytetrahydropyranyl ether, 4-methoxytetrahydrothiopyranyl ether, 1,4-dioxan-2-yl ether, tetrahydrofuranyl ether, tetrahydrothiofuranyl ether, 2,3,3a,4,5,6,7,7a-octahydro-7,8,8-trimethyl-4,7-methanobenzofuran-2-yl ether, t-butyl ether, trimethylsilyl ether, triethylsilyl ether, triisopropylsilyl ether, dimethylisopropylsilyl ether, diethylisopropylsilyl ether, dimethylcexylsilyl ether and t-butyldimethylsilyl ether; acetals such as methylene acetal, ethylidene acetal and 2,2,2-trichloroethylidene acetal; ketals such as 1-t-butylethylidene ketal, isopropylidene ketal (acetonide), cyclopentylidene ketal, cyclohexylidene ketal and cycloheptylidene ketal; cyclic orthoesters such as methoxymethylene acetal, ethoxymethylene acetal, dimethoxymethylene orthoester, 1-methoxyethylidene orthoester, 1-ethoxyethylidene orthoester, 1,2-dimethoxyethylidene orthoester, 1-N,N-dimethylaminoethylidene orthoester and 2-oxacyclopentylidene orthoester; silylketene acetals such as trimethylsilyl ketene acetal, triethylsilyl ketene acetal and t-butyldimethylsilyl ketene acetal; silyl ethers such as di-t-butylsilyl ether, 1,3,1',1',3',3'-tetraisopropyldisiloxanylidene ether and tetra-t-butoxydisiloxane-1,3-diylidene ether; non-cyclic acetals and ketals, such as dimethyl acetal, dimethyl ketal, bis-2,2,2,-trichloroethyl acetal, bis-2,2,2,-trichloroethyl ketal, diacetyl actal and diacetyl ketal; cyclic acetals and ketals, such as 1,3-dioxane, 5-methylene-1,3-dioxane, 5,5-dibromo-1,3-dioxane, 1,3-dioxolane, 4-bromomethyl-1,3-dioxolane, 4,3'-butenyl-1,3-dioxolane and 4,5-dimethoxymethyl-1,3-dioxolane; and cyanohydrins such as O-trimethylsilylcyanohydrin, O-1-ethoxyethylcyanohydrin and O-tetrahydropyranylcyanohydrin on the side chain.

Examples of the monomer having an alkali-soluble group are methacrylic acid, acrylic acid, α-cyanoacrylic acid, α-chloroacrylic acid, vinyl alcohol, hydroxyethylmethacrylic acid and hydroxyethylacrylic acid. A proportion of each polymerizable component in the copolymer is not specifically limited as far as it satisfies the above conditions, and can be appropriately changed according to the solubility of the resin.

When the above polymer contains no aromatic substituent, the transparency at 193 nm is remarkably improved, preferably. Specifically, the absorption at 193 nm of this polymer is preferably not more than 2 per 1 micron. In order to adjust the absorption at 193 nm of the polymer to not more than 2 per 1 micron, the following monomer prepared by using an acidic substituent in combination with an alicyclic compound is preferable. Examples thereof are alkyl group containing a ketone oxime structure (e.g. propanone oxime or propanal oxime group, hydroxyiminopentanone and dimethylglyoxime); alkyl group containing a dicarboxylic acid imide (e.g. succinimide and pyrrolidinedione) or a N-hydroxysuccinimide structure; substituent containing a dicarbonylmethylene structure (e.g. cyclopenetene-1,3-dione, acetylacetone and 3-methyl-2,4-pentanedione); carboxyl group; substituent having a sulfamide structure; alkyl group having a polysubstituted sulfonylmethane structure; alkyl group containing thiol (e.g. hexanethiol); alocoholol containing an enol structure (e.g. hydroxycyclopentenone); substituent containing a furfuryl alcohol structure; and alkyl group containing an amic acid structure.

However, such a compound is inferior in solubility in an organic solvent, and is very inferior in solubility in an alkaline developer. When the solubility in the alkaline developer is enhanced, the adhesion between the resist pattern and substrate is lowered, thereby causing frilling of the pattern. Besides, the property such as alkali-solubility and adhesion of the resulting pattern conflicts with the dry etch resistance, further with the solubility-inhibiting effect. Therefore, when each property is imparted to the other polymerizable compound and a plurality of monomers are copolymerized, the resulting effect is likely to be reduced.

Inventors have intensively studied with paying attention to the fact that the performance of the photosensitive composition can be further improved by imparting two or more characteristics described above to one sort of a monomer. As a result, the following knowledge was obtained. That is, as a result of a molecular orbital calculation, it has been found that a monomer prepared by esterifying a tertiary alcohol functions as a solubility-inhibiting group because the compound is liable to be decomposed by an acid to generate an alkali-soluble group. This is because a substance formed by the reaction in the presence of an acid catalyst is thermodynamically stable compared with a decomposition product of an esterified compound of a primary or secondary alcohol. Accordingly, a polymer containing a tertiary alcohol ester is suited for use as a component of the photosensitive composition in view of being capable of increasing a difference in rate of dissolution to a developer between the part whose solubility is increased by decomposition with an acid and the part which is not decomposed. Furthermore, when the alcohol is a cyclic compound, the dry etch resistance can be enhanced. However, it has been found by the molecular dynamic calculation that, when this cyclic compound has a structure like a bulky admantyl derivative having high rigidity, the reaction between the cyclic compound and an acid as a catalyst does not proceed easily so that the sensitivity is lowered in case of using the photosensitive composition. According to these considerations, inventors have found that the solubility-inhibiting effect is imparted and, at the same time, a resist pattern having high dry etch resistance can be formed by blending a polymer having a repeating segment represented by any one of the above general formulas (1) to (4) as a main component of the photosensitive material.

Particularly, the polymer having a repeating segment represented by the above general formula (2) or (3) is advantageous compared with a polymer having a skeleton such as adamantyl derivative by the following reason.

First, a certain degree of flexibility is required to a basic skeleton of the polymer to be blended in the photosensitive composition to be used as a resist. When a predetermined area of a resist film is dissolved in a developer, it is normally dissolved in the form of a random coil. Therefore, when the flexibility of a polymer chain is not sufficient like the adamantyl derivative, uniform dissolution is inhibited by crystallization or formed liquid crystal state. The term "random coil" used herein means a state which arises when an amorphous polymer is dissolved in a solvent, and a radius of gyration of the polymer chain is proportional to the power of 0.5 to 0.6 of a polymerization degree.

Then, the motion of a molecular chain can be assumed by performing a molecular dynamic calculation (MD). For example, when a hydrogen atom of carboxylic acid of polymethacrylate is esterified by using an aliphatic cyclic olefin having a rigid structure (e.g. adamantyl and tetradecanyl) and then the calculation is performed assuming the polymerization degree is 50, it is confirmed that the motion of the molecular chain is restricted. On the other hand, when a six-membered ring (e.g. cyclohexane and menthyl) is introduced into the above compound, a substituent of the six-membered ring can vary between the boat conformation and the chair conformation so that the flexibility of the polymer chain increases.

Furthermore, when a substituent such as methyl group is added to an aliphatic cyclic olefin, the solubility increases. The following fact can be thermostatistically explained. That is, when such a substituent is introduced, the number of conformations of the polymer chain increases so that an entropy increased. As a result, a mixing free energy decreases at the occasion of dissolution and the solubility increases.

A photosensitive composition comprising alicyclic hydrocarbon having a hydroxyl group or carboxylic acid, the adhesion to the substrate is improved and solubility to developer is also increased. These alicyclic hydrocarbon can be synthesized by following procedures. First, a compound such as cyclohexane, menthol, norbornene, isobornene, tricyclodecanyl or adamantane is oxydized to obtain diol such as cyclohexanediol, menthanediol, norbornenediol, isobornenediol, tricyclodecanediol or adamantanediol. Then resultant diol is allowed to form an ester bond with acrylic acid or methacrylic acid, thereby desired alicyclic hydrocarbon can be obtained. Alternatively, it is possible to use carboxylic acid such as cyclohexanecarboxylic acid, menthanecarboxylic acid, norbornenecarboxylic acid, isobornenecarboxylic acid, tricyclodecanylcarboxylic acid and adamantanecarboxylic acid. First, these carboxylic acid are oxydized to obtain cyclohexanol carboxylic acid, mentholcarboxylic acid, norborneolcarboxylic acid, isoborneolcarboxylic acid, tricyclodecanolcarboxylic acid or adamantanolcarboxylic acid, then these resultant compounds are allowed to form ester bond with acrylic acid or methacrylic acid.

An amount of a repeating segment represented by any one of the above general formulas (1) to (4) is preferably from about 5 to 80 mole %, more preferably from about 30 to 60 mole %, based on the solid content of the first photosensitive composition of this invention. If the content of the above repeating segment is less than 5 mole %, it becomes difficult to sufficiently exert the effect of this invention. On the other hand, if it exceeds 80 mole %, the solubility in the resist solvent and developer is likely to be deteriorated.

In the followings, the method of synthesizing a polymer or a copolymer having a repeating segment represented by the above general formula will be explained. First, each monomer is dissolved in a predetermined solvent, e.g. toluene, THF (tetrahydrofuran), etc. and, furthermore, AIBN (azobisisobutyronitrile) is used as an initiator and the solution was subjected to a radical polymerization. Alternatively, a living anion polymerization or a living cation polymerization may also be used. Then, the polymerized polymer was dropped in a poor solvent and a solid content is precipitated. The poor solvent can be selected according to a polarity of the polymer. In case of the polymer having high polarity, hexane can be used. In case of the polymer having low polarity, methanol, ethanol and water etc. can be used as the poor solvent. The solid content thus obtained is sufficiently dried in vacuum, thereby making it possible to obtain a polymer contained in the first photosensitive composition.

A weight-average molecular weight of the polymer obtained according to above procedure is preferably from 3000 to 100000, more preferably from 5000 to 20000. If the weight-average molecular weight is less than 3000, it becomes drastically difficult to form a film at the occasion of coating. On the other hand, if it exceeds 100000, it is likely to become difficult to dissolve the polymer in the resist solvent and developer.

Since the above polymer itself has a photographic sensitivity to the dosage of not less than several hundreds mJ/cm$^2$, the photosensitive material can be prepared without blending other photosensitive agent components. In view of the durability of a lens material, the dosage on light exposure is preferably not more than 200 mJ/cm$^2$, more preferably not more than 50 mJ/cm$^2$.

Accordingly, in the first invention, a compound which is capable of generating an acid by irradiation of an actinic radiation (hereinafter referred to as a "photo-acid generator") as a photosensitive agent is blended to the polymer. To the first photosensitive composition, a solubility inhibitor may be blended, if necessary.

In this case, a photosensitive composition may be prepared by blending a photo-acid generator containing no aromatic ring (e.g. CMS-105, DAM-301, NDI-105 and EPI-105 (manufactured by Midori Kagaku Co.)) and a dissolution inhibitor (those prepared by combining adamantane-tert-butyl ester or tert-butyl cholate). In order to prevent deterioration of the heat resistance, it is desired to blend a compound having an aromatic ring as the photo-acid generator or solubility inhibitor.

Examples of the photo-acid generator having the aromatic compound are triphenylsulfonium triflate, diphenyliodonium triflate and naphthoquinone diazide. Specific examples of the photo-acid generator to be used are shown in the following chemical formulas.

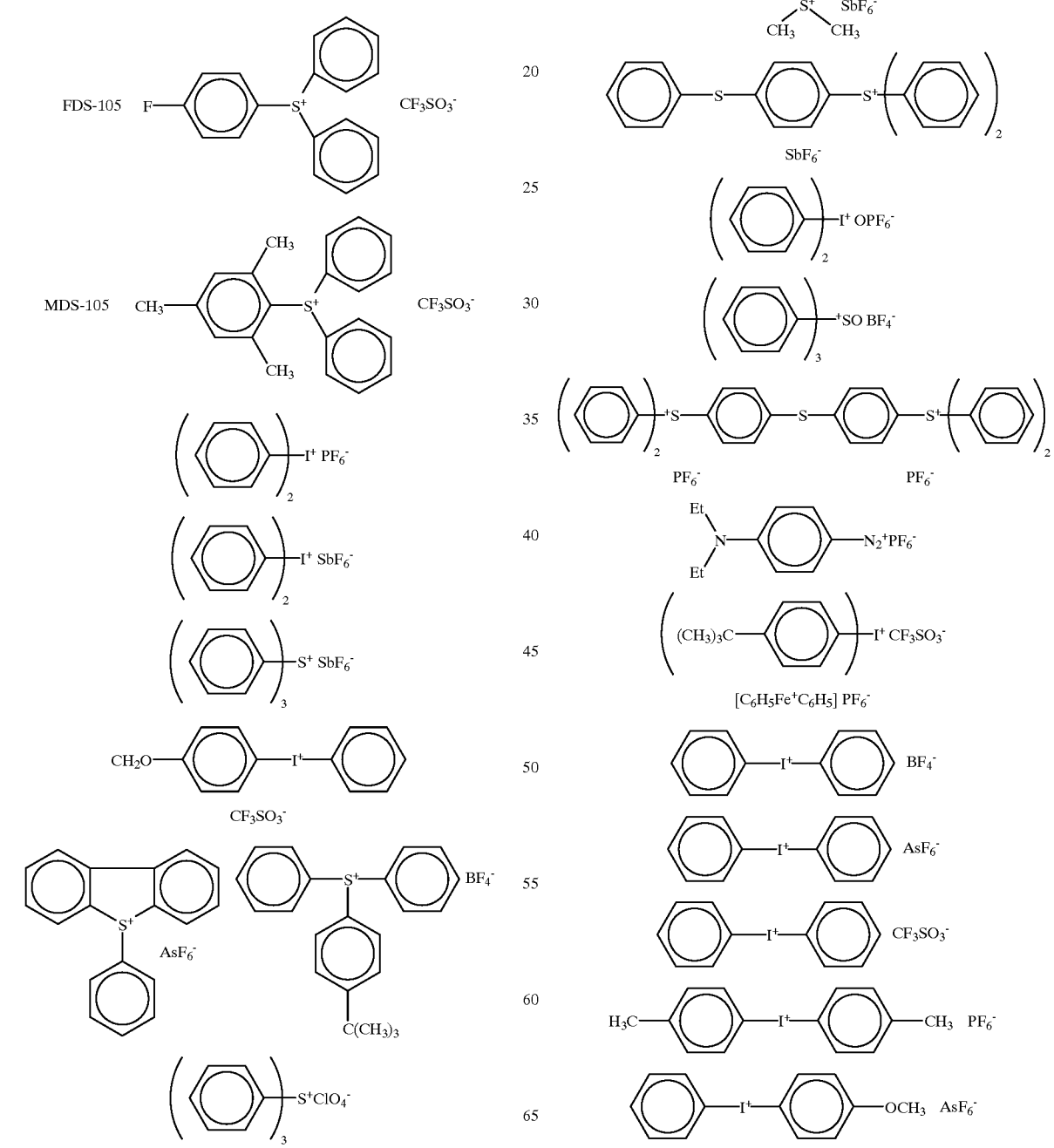

-continued
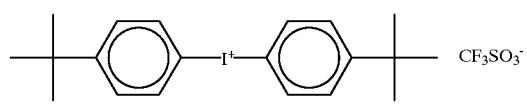
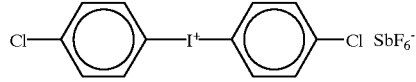
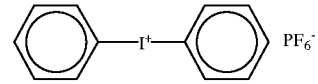
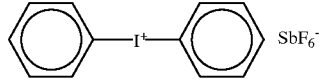
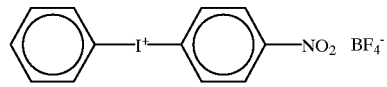
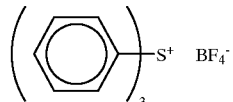
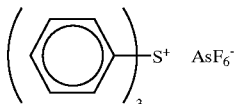
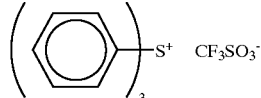
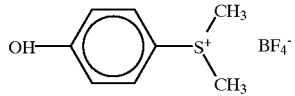
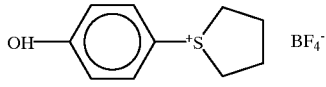
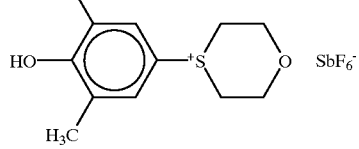
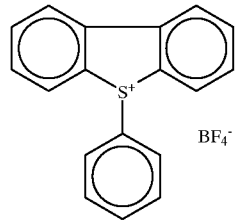
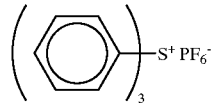
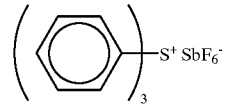
-continued
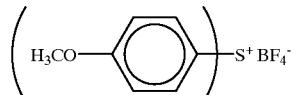
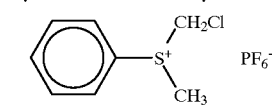
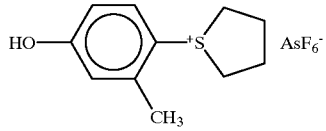
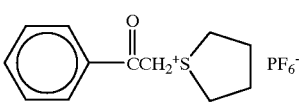
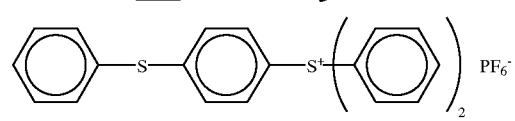
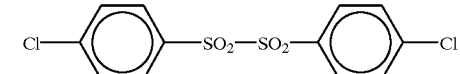
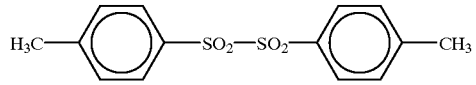
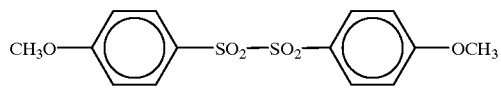
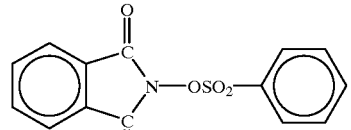
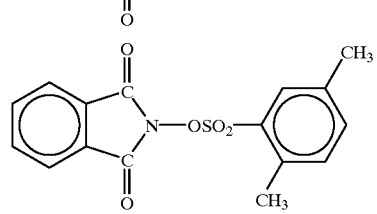
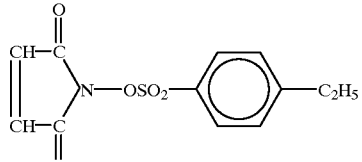
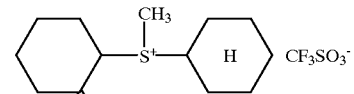
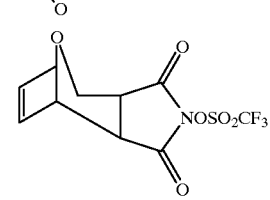

-continued

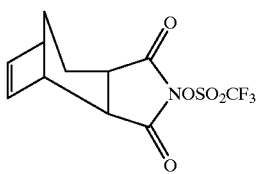
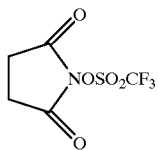
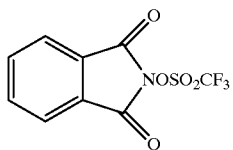
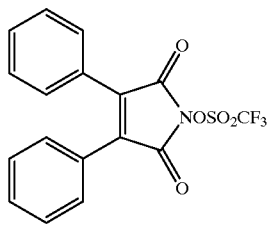
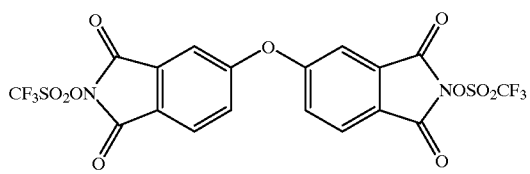
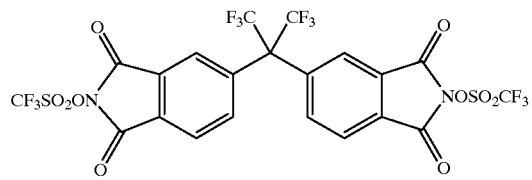
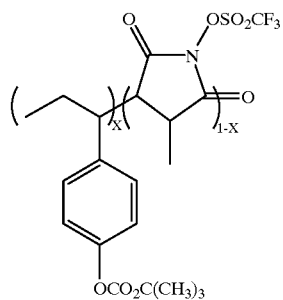
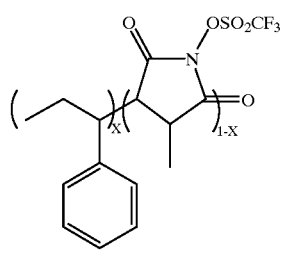

-continued

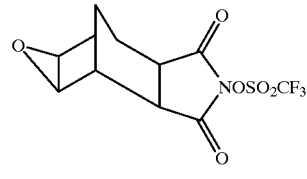
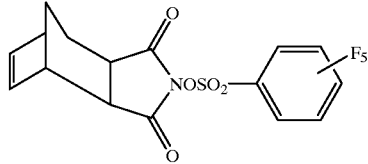
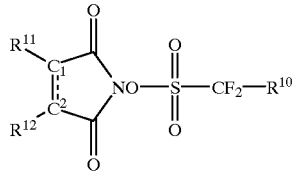

wherein $C^1$ and $C^2$ form a single bond or a double bond; $R^0$ is a hydrogen atom, a fluorine atom, or an alkyl or aryl group which may be substituted with a fluorine atom; and $R^1$ and $R^2$ may be the same or different and are individually a univalent organic group, and $R^1$ and $R^2$ may be connected together to form a cyclic structure.

It is most preferable to use a conjugated polycyclic aromatic compound so as not to deteriorate the transparency to short-wavelength light as the object of this invention.

The term "conjugated compound aromatic ring" means that a plurality of aromatic rings have a certain fixed molecular structure in a conjugated state, and the term "conjugation" means the state where double bonds are alternatively arranged in a state closed to a plane.

Examples of such an aromatic compound are naphthalene ring, anthracene ring, phenanthrene ring, pyrene ring, naphthacene ring, chrysene ring, 3,4benzophenanthrene ring, perylene ring, pentacene ring and picene ring. Corresponding examples thereof are pyrrole ring, benzofuran ring, benzothiophene ring, indol ring, benzoxazole ring, benzothiazole ring, indazole ring, chromene ring, quinolinedinnoline ring, phthalazine ring, quinazoline ring, dibenzofuran ring, carbazole ring, acrydine ring, phenanthridine ring, phenanthroline rig, phenazine ring, thianthrene ring, indolizine ring, naphthyridine ring, purin ring, pteridine ring and fluorene ring. Particularly, compounds containing an aromatic ring (e.g. naphthalene ring, anthracene ring and phenanthrene ring) are desired because of their transparency and high dry etch resistance. These aromatic ring compounds can be introduced into a backbone skeleton or a side chain skeletone of the photo-acid generator or solubility inhibitor.

Specific examples of the photo-acid generator are onium salt and sulfonate, sulfonyl and sulfomide compounds, which have a naphthalene skeleton or a dibenzothiophene skeleton. More specific examples are sulfonium salt having a naphthalene ring, such as NAT-105 and NDS-105; naphthalene-containing chlorinated triazine such as NDI-106; sulfonic acid imide such as naphthalidyl triflate (those described above are manufactured by Midori Kagaku Co.); onium salt of dibenzothiophene derivative (manufactured by Daiki Kagaku Co.); and compound such as naphthalene bisulfon. Examples thereof are summarized in the following chemical formulas.
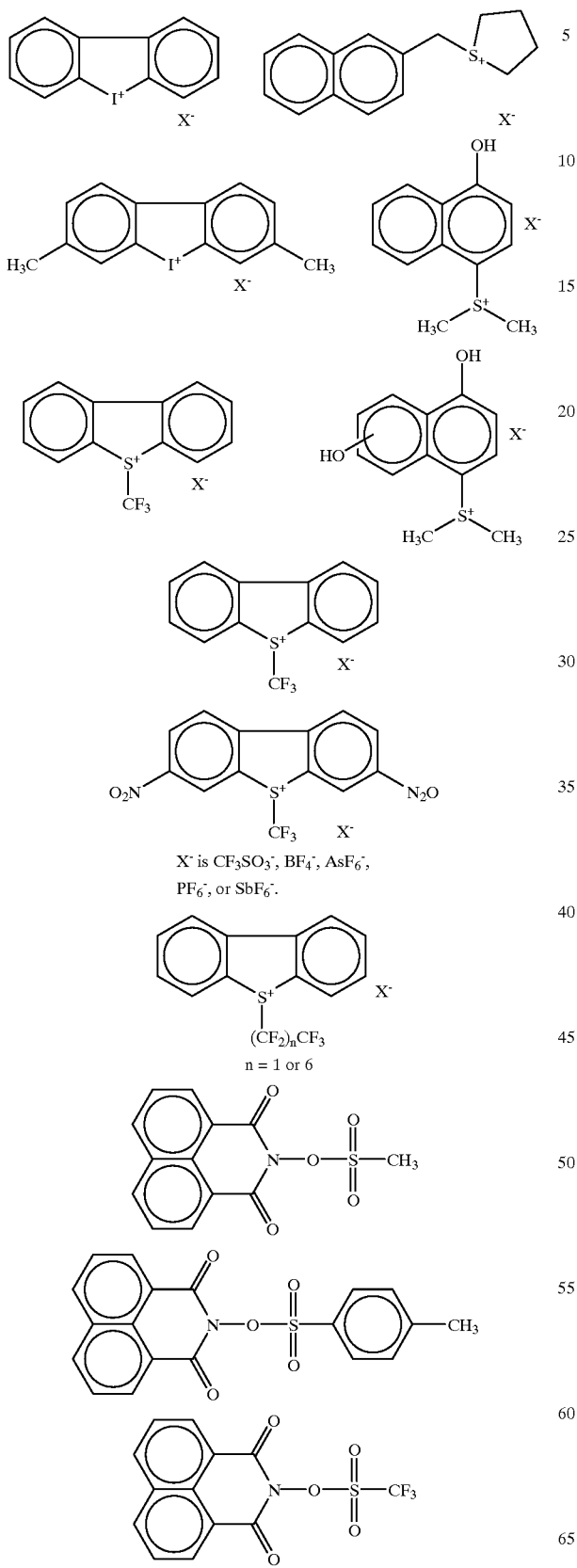
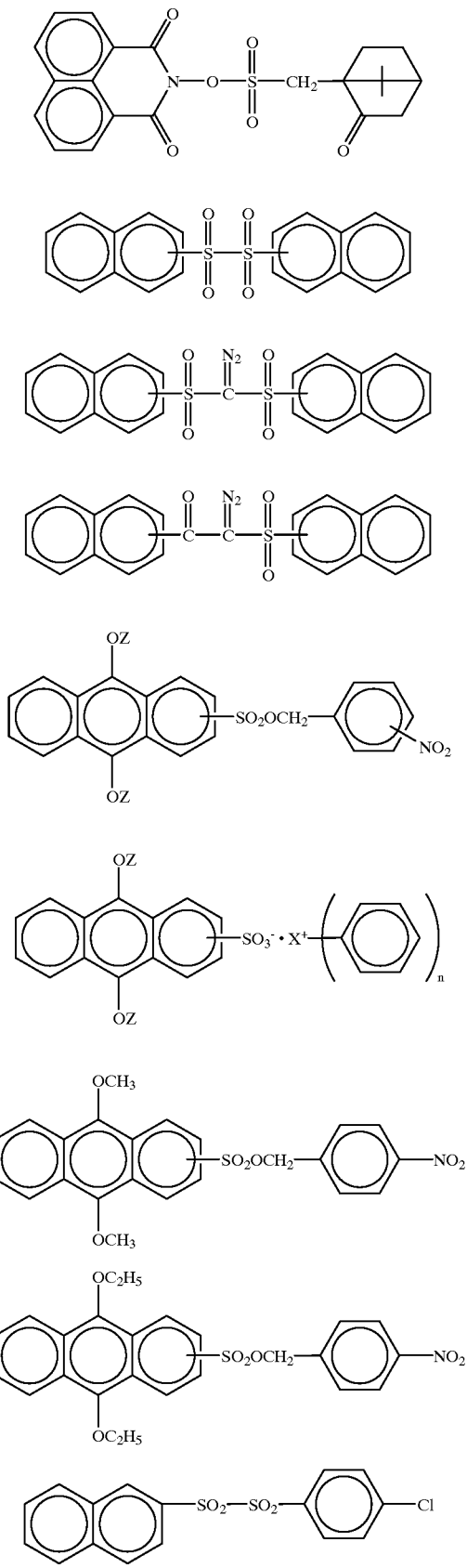

wherein Z is an alkyl group.

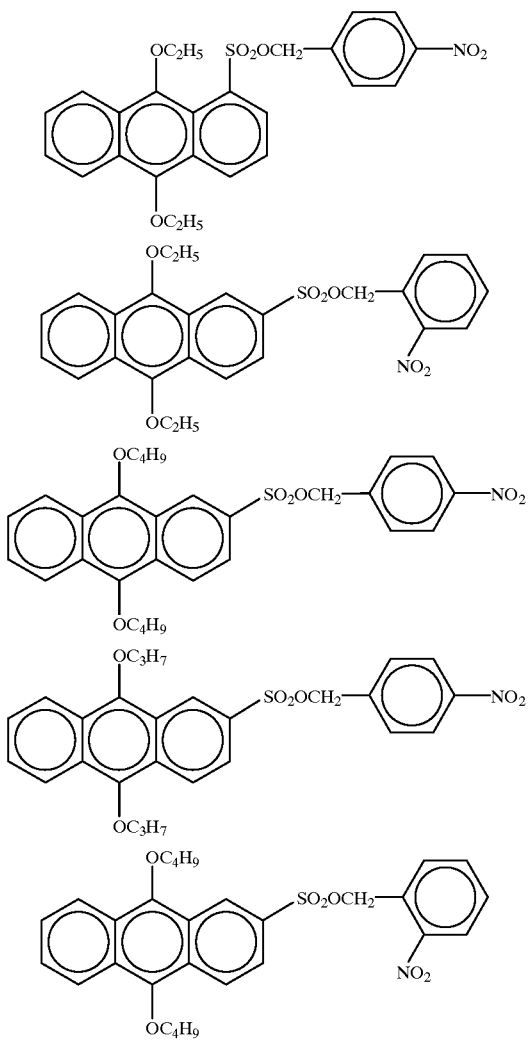

When these photo-acid generators are blended, an amount of the photo-acid generator to be added is preferably 0.1% by weight or more and less than 20% by weight based on the alkali-soluble resin. The reason is as follows. That is, if the amount of the above photo-acid generator to be added is less than 0.1% by weight, the sensitivity is likely to be deteriorated. On the other hand, if the amount is not less than 20% by weight, the coating property is drastically lowered.

The photo-acid generator generates an acid by irradiation of an actinic radiation, and the repeating segments represented by the above general formulas (1) to (4) are decomposed by the catalytic reaction. Accordingly, in the first photosensitive composition, blending of a compound having a solubility-inhibiting component (solubility inhibitor) is not essential. However, in order to sufficiently differentiate the dissolution rate of the light-exposed portion from that of the non-exposure portion of the resist film, it is desired to blend, as the solubility inhibitor, a compound having a substituent which is decomposed by an acid to generate an alkali-soluble group. Among the compounds described in U.S. Pat. Nos. 4,491,628, 4,603,101 and JP-A-63-27829, any compound wherein the aromatic ring is the above condensed polycyclic aromatic ring can be used as the solubility inhibitor.

Alternatively, there can be used, as the solubility inhibitor, a compound obtained by substituting a part or all of hydroxy terminal ends of a condensed polycyclic aromatic ring compound into which carboxylic acid or a phenolic hydroxyl group is introduced with a protective group which is capable of decomposing with an acid. In this case, examples of the protective group which is capable of decomposing with an acid are tert-butyl ester, tert-butyl carbonate, tetrahydropyranyl group, acetal group and trimethylsilyl group. Specific examples of such a compound are polyhydroxy compound of naphthalene or anthracene, and tert-butyl carbonate of its novolak type condensed compound; tert-butyl carbonate of naphtholphthalein; tert-butyl carbonate of quinazalin or quinizaline; polyhydroxy compound of naphthalene or anthracene, and tert-butyloxycarbonylmethylated compound of its novolak type condensed compound; and tert-butyloxycarbonylmethylated compound of naphtholphthalein.

These compounds having an acid decomposable group may be blended alone or in combination with the above alkali-soluble resin.

An amount of such a compound to be added to the alkali-soluble resin is preferably from 3 to 50% by weight, more preferably from 10 to 30% by weight. This reason is as follows. That is, if the amount of the above solubility inhibitor to be added is less than 3% by weight, it becomes difficult to obtain sufficient resolution. On the other hand, if the amount exceeds 50% by weight, the coating property or the dissolution rate at the occasion of development is likely to be drastically lowered.

Examples of the substituent which can be decomposed by an acid are esters such as t-butyl ester, isopropyl ester, ethyl ester, methyl ester and benzyl ester; ethers such as tetrahydropyranyl ether; alcoxycarbonates such as t-butoxycarbonate, methoxycarbonate and ethoxycarbonate; silyl ethers such as trimethylsilyl ether, triethylsilyl ether and triphenylsilyl ether; esters such as isopropyl ester, tetrahydropyranyl ester, tetrahydrofuranyl ester, methoxyethoxymethyl ester, 2-trimethylsilylethoxylmethyl ester, 3-oxocyclohexyl ester, isobornyl ester, trimethylsilyl ester, triethylsilyl ester, isopropyldimethylsilyl ester, di-t-butylmethylsilyl ester, oxazole, 3-alkyl 1,3-oxazoline, 4-alkyl-5-oxo-1,3 oxazoline and 5-alkyl-4-oxo-1,3-dioxolane; ethers such as t-butoxycarbonyl ether, t-butoxymethyl ether, 4-pentenyloxymethyl ether, tetrahydropyranyl ether, tetrahydrothiopyranyl ether, 3-bromotetrahydropyranyl ether, 1-methoxycyclohexyl ether, 4-methoxytetrahydropyranyl ether, 4-methoxytetrahydrothiopyranyl ether, 1,4-dioxan-2-yl ether, tetrahydrofuranyl ether, tetrahydrothiofuranyl ether, 2,3,3a,4,5,6,7,7a-octahydro-7,8,8-trimethyl-4,7-methanobenzofuran-2-yl ether, t-butyl ether, trimethylsilyl ether, triethylsilyl ether, triisopropylsilyl ether, dimethylisopropylsilyl ether, diethylisopropylsilyl ether, dimethylcexylsilyl ether and t-butyldimethylsilyl ether; acetals such as methylene acetal, ethylidene acetal and 2,2,2-trichloroethylidene acetal; ketals such as 1-t-butylethylidene ketal, isopropylidene ketal (acetonide), cyclopentylidene ketal, cyclohexylidene ketal and cycloheptylidene ketal; cyclic orthoesters such as methoxymethylene acetal, ethoxymethylene acetal, dimethoxymethylene orthoester, 1-methoxyethylidene orthoester, 1-ethoxyethylidene orthoester, 1,2-dimethoxyethylidene orthoester, 1-N,N-dimethylaminoethylidene orthoester and 2-oxacyclopentylidene orthoester; silylketene acetals such as trimethylsilyl ketene acetal, triethylsilyl ketene acetal and t-butyldimethylsilyl ketene acetal; silyl ethers such as di-t-butyl silyl ether, 1,3,1',1',3',3'-tetraisopropyldisiloxanylidene ether and tetra-t- butoxydisiloxane-1,3-diylidene ether; non-cyclic acetals and ketals, such as dimethyl acetal, dimethyl ketal, bis-2,2,2,-trichloroethyl acetal, bis-2,2,2,-trichloroethyl ketal, diacetyl actal and diacetyl ketal; cyclic acetals and ketals, such as 1,3-dioxane, 5-methylene-1,3-dioxane, 5,5-dibromo-1,3-dioxane, 1,3-dioxolane, 4-bromomethyl-1,3-dioxolane, 4,3'-butenyl-1,3-dioxolane and 4,5-dimethoxymethyl-1,3-dioxolane; and cyanohydrins such as O-trimethylsilylcyanohydrin, O-1-ethoxyethylcyanohydrin and O-tetrahydropyranylcyanohydrin.

The solubility inhibitors have the above group are summarized in the following chemical formulas.

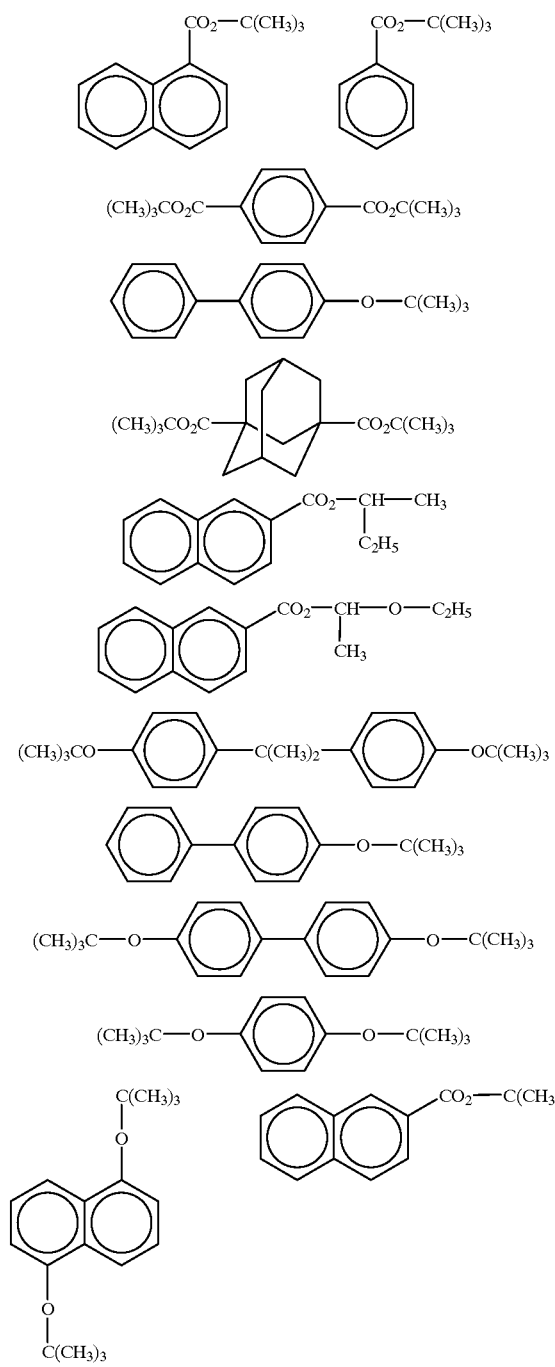

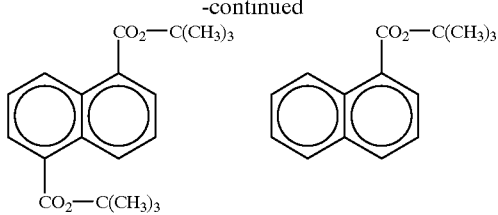

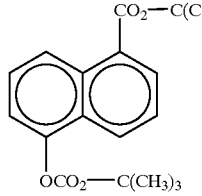

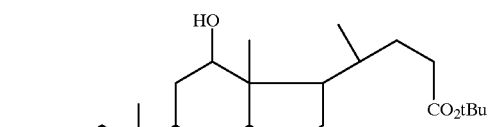

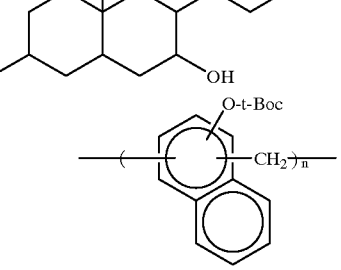

wherein tBoc is —(C=O)O—C(CH$_3$)$_3$, and n is an integer.

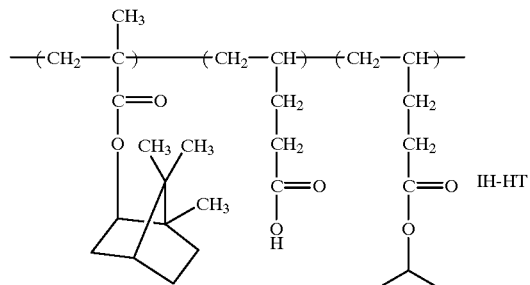

IH-HT (average molecular weight: 1000)

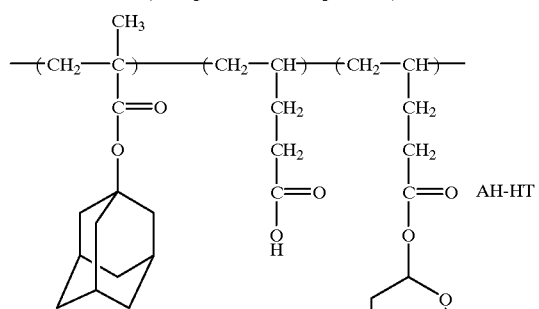

AH-HT (average molecular weight: 7000)

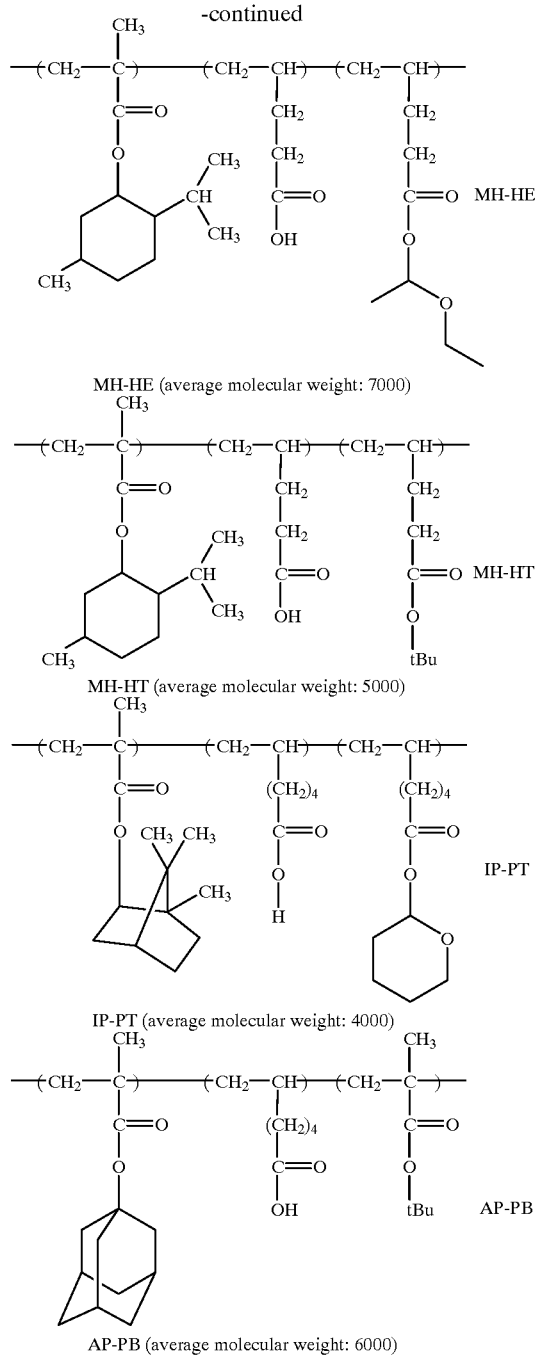
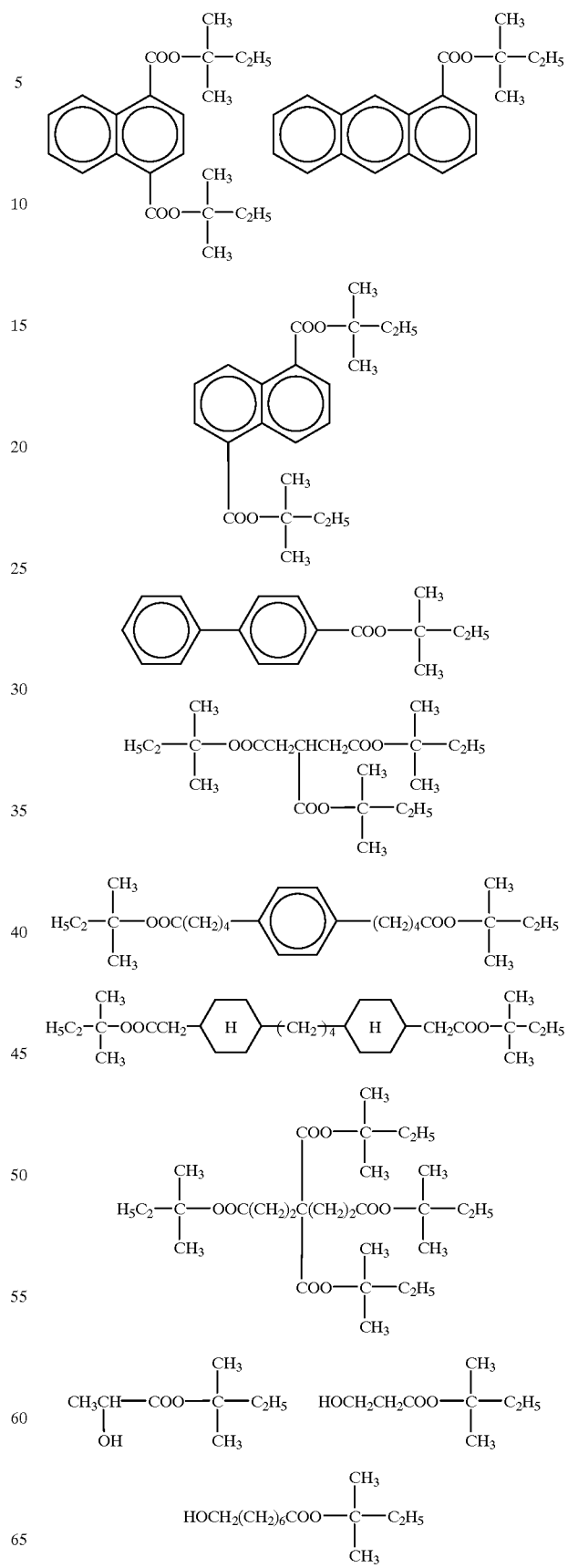
wherein tBoc is —(C=O)O—C(CH$_3$)$_3$.
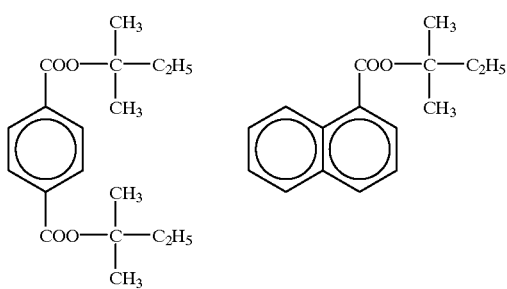

-continued

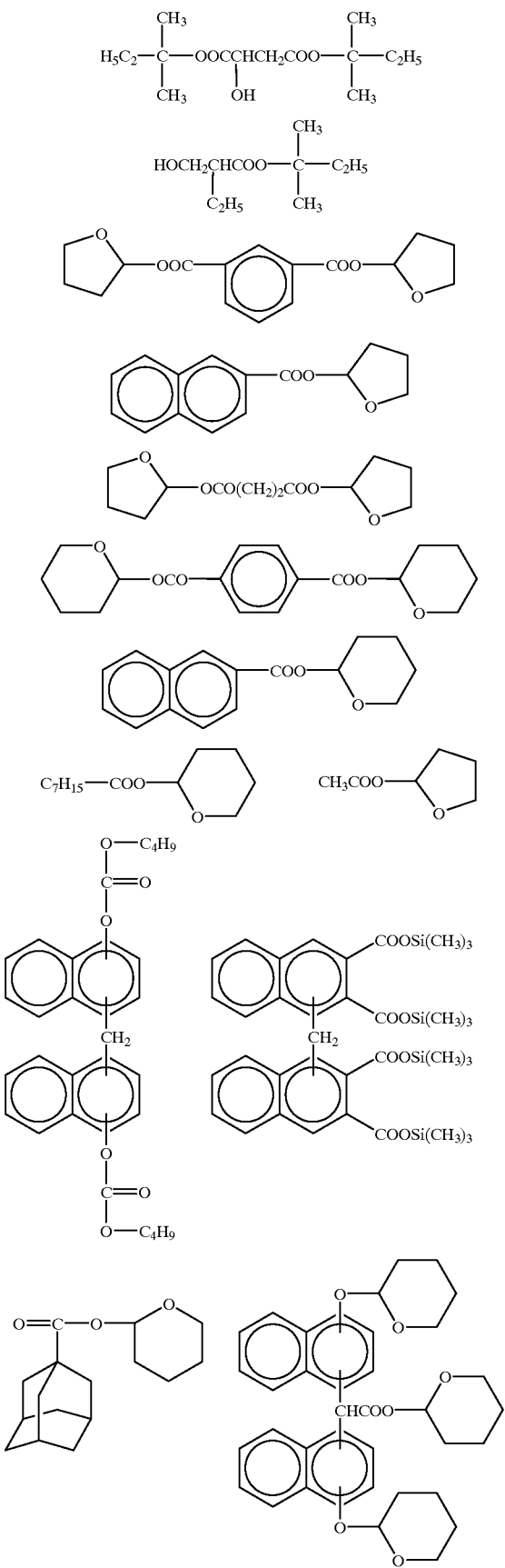

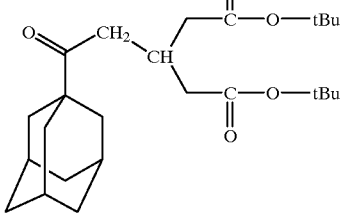

In case of blending the above solubility inhibitor, the polymer in the first photosensitive composition can be a copolymer composed of a repeating segment represented by any one of the general formulas (1) to (4) and a vinyl compound having an alkali-soluble group which imparts an alkali-solubility, such as methacrylic acid.

Alternatively, in the first invention, the same effect can be obtained by not only blending the above solubility inhibitor but also introducing a solubility-inhibiting group into an alkali-soluble resin. That is, in addition to the repeating segment represented by any one of the above general formulas (1) to (4), a segment having the solubility-inhibiting group may be contained in the copolymer. In this case, a proportion of the solubility-inhibiting group in the copolymer is preferably from 10 to 50 mole %. If the proportion is less than 10 mole %, since the solubility-inhibiting function cannot be sufficiently exerted, it becomes difficult to dissolve the non-exposure portion to perform resolution of a pattern. On the other hand, if the proportion exceeds 50 mole %, the photosensitive composition becomes too hydrophobic and it becomes difficult to form a pattern because the adhesion to the substrate is drastically lowered.

As the photosensitive composition of the first invention, a composition prepared by blending a photo-acid generator and, if necessary, a solubility inhibitor in the following polymer is most preferable. As the polymer, a copolymer prepared by copolymerizing an acrylic or vinyl compound having a t-butyl ester, a trimethylsilyl ester or a tetrahydropyranyl ester (e.g. t-butyl methacrylate, t-butyl-3-naphthyl-2-propenoate, trimethylsilyl methacrylate or tetrahydropyranyl methacrylate) on the side chain with a repeating segment represented by any one of the above general formulas (1) to (4) is most preferable.

Since a polymer having alicyclic compound is excellent in transparency, it is more preferable to add conjugation length shift type solubility inhibitor having moderate to low molecular weight.

When polymer containing ester of tertiary alicyclic alcohol is used, it is effective to add solubility inhibitor containing aromatic compound having a conjugation length of 4 to 12 at an amount of 1 to 5%. Naphthalene derivative is more preferably as aromatic compound having a conjugation length of 4 to 12, in view of compound stability and cost.

Examples of solubility-inhibitor including aromatic compound having a conjugation length of 4 to 12 are naphthol novolak protected with tetrahydropyranyl group, t-butyl group or t-butoxy group; and naphthylimide protected with tetrahydropyranyl group, t-butyl group or t-butoxy group.

The ester of tertriary alicylic alcohol can form a pattern without adding other component such as solubility inhibitor. Dry etch resistance and solubility to the developer are further improved by adding solubility inhibitor containing aromatic compound having a conjugation length of 4 to 12 at an amount of 5% or more. However if the amount of the solubility inhibitor is more than 30%, the transparency of the photosensitive composition and the shape of resultant resist pattern are deteriorated. Accordingly, the amount of the solubility inhibitor is more preferably 5 to 30%.

Specifically, when the polymer is copolymer prepared by coporimerized γ-((1-methyl)cyclopentyl)methacrylate with methacrylic acid, dry etch resistance and solubility to the developer can be improved through adding naphthol novolak protected with 15 to 25% of tetrahydropyranyl group as a solubility inhibitor.

Furthermore, in the first photosensitive composition, other components may be blended, if necessary. Specifically, there can be appropriately blended other polymers such as epoxy resin, polymethyl methacrylate, polymethyl acrylate, propylene oxide, ethylene oxide copolymer and polystyrene; basic compounds such as amine compounds and pyridine derivatives for improvement of the environmental stability; surfactants for modification of a coating property; and dyes for anti-reflection.

The photosensitive composition of this invention is prepared as a varnish, for example, by dissolving the above polymer and a compound which is capable of generating an acid by irradiation of an actinic radiation and, if necessary, a compound whose solubility varies with an action of an acid in a solvent. Examples of an organic solvent are ketone series solvents such as acetone, cyclohexanone, methyl ethyl ketone and methyl isobutyl ketone; cellosolve series solvents such as methylcellosolve, methylcellosolve acetate, ethylcellosolve acetate and butylcellosolve acetate; and ester series solvents such as ethyl acetate, butyl acetate, isoamyl acetate, γ-butyl lactone and methyl 3-methoxypropionate. According to the kind of the polymer, there can be used a mixed solvent prepared by adding dimethyl sulfoxide, dimethylformaldehyde or N-methylpyrrolidinone to the above solvent to improve the solubility. Furthermore, propionic acid derivatives such as methyl methylpropionate; lactates such as ethyl lactate; and PGMEA (propylene glycol monomethyl ether acetate) can be preferably used because of their low toxicity. In this invention, these solvents can be used alone or in combination thereof, and may contain an aliphatic alcohol such as toluene, xylene and isopropyl alcohol.

The second photosensitive composition of this invention will be explained in detail below.

To the second photosensitive composition, a polymer represented by the following general formula (6) is blended.

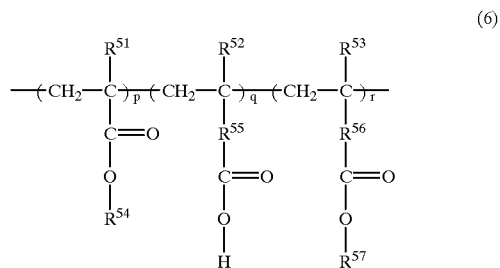

(6)

wherein $R^{51}$, $R^{52}$ and $R^{53}$ may be the same or different and are individually a hydrogen atom, a halogen atom, a cyano group or a univalent organic group; $R^{54}$ is a univalent alicyclic organic group; $R^{55}$ and $R^{56}$ may be the same or different and are individually a divalent group containing at least one of C, N, S or O; and $R^{57}$ is a univalent organic group which is capable of generating an alkali-soluble group as it is decomposed by a catalytic reaction of an acid; and p, q and r are individually a natural number which satisfies $p \geq 0$, $q > 0$ and $r \geq 0$ (provided p and r are not 0, simultaneously).

In the polymer represented by the above general formula (6), examples of $R^{51}$, $R^{52}$ and $R^{53}$ are hydrogen atom, halogen atom, cyano group, or univalent organic group such as methyl group and ethyl group.

The univalent alicyclic organic group $R^{54}$ has an action of imparting the dry etch resistance, and examples thereof are cyclic cyclo compound or cyclic bicyclo compound represented by the general formula $C_nH_{2n}$ (n is an integer of not less than 3) and condensed ring thereof. Specific examples thereof are cyclobutane ring, cyclopentane ring, cyclohexane ring, cycloheptane ring, those wherein crosslinking hydrocarbon is introduced, spiro ring (e.g. spiroheptane, spirooctane, etc.), terpene ring (e.g. norbonyl ring, adamantyl ring, bornene ring, menthyl ring, menthane ring, etc.), steroid (e.g. thujane, sabinane, thujone, carane, carene, pinane, norpinane, bornane, fencane, tricyclene, cholesteric ring, etc.), bile acid, digitaloid ring, camphor ring, isocamphor ring, sesquiterpene ring, santon ring, diterpene ring, triterpene ring and steroid saponins.

As shown in the above general formula (6), in the polymer to be used in the second invention, an acidic substituted group for imparting an alkali-solubility is connected to a polymer skeleton via specific divalent organic groups $R^{55}$ and $R^{56}$. In such way, an influence of a bulky alicyclic organic group can be avoided by separating a polar group for imparting the alkali-solubility from a polymer backbone chain. However, when the number of atoms between the polymer backbone chain and polar group increases, swelling of the polymer and reducing of a glass transition temperature ($T_g$) are likely to arise. In order to prevent this, the number of atoms of the substituent to be introduced as $R^{55}$ and $R^{56}$ is preferably not more than 6. When the divalent $R^{55}$ and $R^{56}$ are cyclic, this rule does not apply to the case. $R^{55}$ and $R^{56}$ may be any divalent group containing at least one of C, N, S or O and are not specifically limited. In view of the stability and dry etch resistance, groups containing carbon (e.g. methylene group and ethylene group) are preferable.

Specific examples of such a polymer structural unit are organic compound having respectively a double bond and a carboxyl group at the molecular terminal end, such as 4-pentenoic acid and 6-pentenoic acid; and organic compound having a carboxyl group at the other terminal end of a cyclic compound having a double bond, such as bicyclopentadienecarboxylic acid.

The polymer represented by the above general formula (6) may contains the other constituent unit having an active methylene group and the other acidic substituent such as fluoroalkyl alcohol.

In the second invention, a part of the acidic substituent of the above polymer may be capped by the substituent $R^{57}$ which is decomposed and eliminated by an acid catalytic reaction to generate an alkali-soluble group. Examples of the substituent $R^{57}$ which is decomposed and eliminated by the acid catalytic reaction are esters such as t-butyl ester, isopropyl ester, ethyl ester and methyl ester; ethers such as tetrahydropyranyl ether, ethoxyethyl ether and tetrahydrofuranyl ether; acetals; alcoxycarbonates such as t-butoxycarbonate, methoxycarbonate and ethoxycarbonate; and silyl ethers such as trimethylsilyl ether and triethylsilyl ether.

Particularly, as the substituent $R^{57}$ which is decomposed and eliminated by the acid catalytic reaction, a compound having a tertiary ester structure as a general structure. For example, there can be used tertiary alicyclic compounds such as 2-methyl-2-andamantyl and 1-methylcyclohexanol.

When the alicyclic compound is introduced as $R^{57}$, since this substitutent has an action of imparting the dry etch resistance, p may be 0 in the above general formula (6). When a photosensitive composition containing such a polymer is used, the substituent $R^{57}$ is eliminated by the acid catalytic reaction to exhibit the alkali-solubility at the light-exposed portion of the resist thin film, while the alicyclic skeleton is remained at the non-exposure portion and, therefore, a resist pattern having excellent dry etch resistance can be formed.

In the second photosensitive composition, the polymer represented by the above general formula (6) can be easily obtained by copolymerizing the above acrylic acid derivative of the alicyclic compound and a carboxylic acid derivative for imparting the alkali-solubility and, if necessary, a compound prepared by protecting an alkali-soluble group of an alkali-soluble compound by using an acid decomposable group. In this case, a naphthalene derivative for improving the dry etch resistance may be copolymerized. However, in view of the transparency to short-wavelength light of the resist, it is preferable to copolymerize with a compound having no molecular skeleton wherein light absorption at the short-wavelength area is large (e.g. benzene ring). Specifically, it is desired that the absorption to light with a wavelength of 193 nm of the polymer is not more than 2 per 1 μm.

A copolymerization ratio q of a structural unit containing carboxylic acid is preferably within the range from 5 to 40%, more preferably from 20 to 40%, in the copolymer. The reason is as follows. That is, if the copolymerization ratio of this structural unit is less than 5%, the alkali-solubility of the polymer is likely to becomes insufficient. On the other hand, if the copolymerization ratio exceeds 40%, the sensitivity in case of forming the resist pattern tends to be lowered.

In order to obtain sufficient dry etch resistance, a copolymerization ratio of a structural unit containing an alicyclic organic group is preferably not less than 20% in the copolymer. That is, when p is not 0 in the above general formula (5), it is desired that (p/(p+q+r)) is not less than 0.2. On the other hand, when p is 0, it is desired that $R^{57}$ is a univalent alicyclic organic group as described above and (r/(q+r)) is not less than 0.2.

In the second photosensitive composition, an average molecular weight of the above polymer is preferably set within the range from 1000 to 100000. The reason is as follows. That is, if the average molecular weight of the polymer is less than 1000, it is disadvantageous to form a resist film having sufficient mechanical strength. On the other hand, if the average molecular weight of the polymer compound exceeds 100,000, it becomes difficult to form a resist pattern having good resolution.

As a compound which is capable of generating an acid by irradiation of an actinic radiation (hereinafter referred to as a "photo-acid generator") to be blended in the photosensitive composition of the second invention, for example, there can be used the same compounds as exemplified in the explanation of the first photosensitive composition, such as onium salt compound (e.g. sulfonyl and iodonium) and sulfonyl ester.

In the photosensitive composition of the second invention, a preferable amount of the photo-acid generator to be blended is preferably from 0.1 to 30 parts by weight, more preferably from 0.3 to 15 parts by weight, based on the total of the photosensitive composition. If the amount of the photo-acid generator is less than 0.1 parts by weight, it is likely to become difficult to form a resist pattern in high sensitivity. On the other hand, when the amount exceeds 30 parts by weight, the mechanical strength of the resulting resist film is likely to be lowered. According to the kind of the photo-acid generator, the light transmission of the photosensitive composition film at 193 nm is likely to be deteriorated.

Furthermore, to the photosensitive composition of the second invention, a compound having a group which is decomposed by a catalytic action of an acid to exhibit an alkali-solubility may be separately added as the solubility inhibitor, in addition to the above components. An inhibiting group which is liable to be decomposed by an acid may be, for example, a group which is capable of capping an acidic group of the above polymer. Specifically, as the solubility inhibitor, the same compound as exemplified in the explanation of the first photosensitive composition can be used.

As the solubility inhibitor, two or more kinds may be used in combination so as to maintain the dissolution rate and characteristics as the resist.

In the photosensitive composition of the second invention, when the solubility inhibitor is blended, it is desired that its amount is selected so that the total amount of the solubility-inhibiting group in the composition is preferably within the range from 5 to 95%, more preferably from 10 to 60%, based on the total acrylic acid derivative unit. The reason is as follows. That is, if the proportion of the solubility-inhibiting group is less than 5%, a contrast between the light exposure portion and non-exposure portion can not be adjusted. On the other hand, when the proportion exceeds 95%, the adhesion between the resist film and substrate is likely to be deteriorated.

The photosensitive composition of the second invention is prepared by dissolving the above copolymer compound containing at least a group for imparting the dry etch resistance and a group having the alkali-solubility, and a photo-acid generator and, if necessary, a solubility inhibitor in an organic solvent, an filtering this solution. As the organic solvent, the same solvents as exemplified in the explanation of the photosensitive composition of the first invention.

The third photosensitive composition of this invention will be explained in detail below.

To the third photosensitive composition, a polymer containing at least one of a repeating segment represented by the following general formula (7) and a repeating segment represented by the following general formula (8) is blended.

(7)

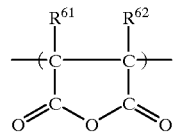

wherein $R^{61}$ and $R^{62}$ may be the same or different and are individually a halogen atom, a hydrogen atom, an alkyl group, an aromatic group or a univalent substituent, provided at least one of $R^{61}$ and $R^{62}$ is a halogen atom.

(8)

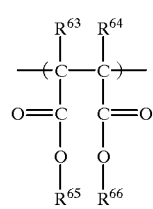

wherein $R^{63}$ and $R^{64}$ may be the same or different and are individually a halogen atom, a hydrogen atom, an alkyl group, an aromatic group or a univalent substituent, provided at least one of $R^{63}$ and $R^{64}$ is a halogen atom; and $R^{65}$ and $R^{66}$ are individually a hydrogen atom, an alkyl group, an aromatic group or a univalent substituent.

It is also possible to use a polymer having a repeating segment represented by the following general formula (9):

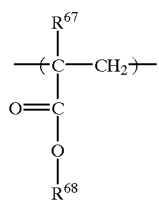

(9)

wherein $R^{67}$ is a halogen atom; and $R^{68}$ is a hydrogen atom, an alkyl group, an aromatic group or a univalent substituent.

The polymer to be blended into the photosensitive composition of the third invention contains at least one of repeating segments represented by the above general formulas (7) to (9), and these repeating segments can be said to be acrylic acid, acid anhydride and an ester derivative thereof, wherein a halogen atom is introduced as a substituent at the α-position. Since the halogen atom is introduced at the α-position, the polymer as a main component of the photosensitive composition of the third invention has a backbone chain-cutting function, thereby making it possible to realize high sensitivity to irradiation of an actinic radiation.

In the above general formulas (7) to (9), the halogen atom which can be introduced as $R^{61}$, $R^{62}$, $R^{63}$, $R^{64}$ and $R^{67}$ is not specifically limited, but chlorine atom is particularly preferable in view of the sensitivity and compound stability. Examples of the alkyl group to be introduced as $R^{61}$, $R^{62}$, $R^{63}$ and $R^{64}$ are methyl group an ethyl group. Examples of the aromatic group are phenyl group and naphthyl group. The univalent substituent may be, for example, an alkylsilyl group. The alkyl group, aromatic group and univalent substituent, which are exemplified herein, can be introduced as $R^{65}$ and $R^{66}$ in the general formula (8), and $R^{68}$ in the general formula (9).

More specific examples of the above halogen-containing acrylic acid, acid anhydride and ester derivative thereof are α-chloroacrylic acid, dichloromaleic acid, dichloromaleic anhydride and monochloromaleic acid. Examples of the ester of these compounds are alkyl groups such as methyl, ethyl, propyl, n-butyl and t-butyl; and aromatic compounds such as phenyl and naphthyl.

When a group which is liable to be decomposed by the acid catalytic reaction is introduced into the above repeating segment, a chemical amplification reaction can enhance a dissolution rate of the light-exposed portion of the resist film. Specifically, a group which is liable to be eliminated by the acid catalyst to generate carboxylic acid may be introduced into at least one of $R^{65}$ and $R^{66}$ in the above general formula (8) or $R^{68}$ in the above general formula (9). Examples of the group which is liable to be decomposed by the acid catalytic reaction are secondary or tertiary esters such as t-butyl ester, isopropyl ester, ethyl ester and methyl ester; ethers such as tetrahydropyranyl ether, ethoxyethyl ether and t-butoxyethyl ether; acetals; alcoxycarbonates such as t-butoxycarbonate, methoxycarbonate and ethoxycarbonate; and silicon-containing compounds such as trimethylsilyl, triethylsilyl and triphenylsilyl.

When a cyclic compound such as aromatic ring and alicyclic compound is introduced into the above repeating segment, the dry etch resistance can be imparted to the polymer. In order to obtain such an effect, the cyclic compound may be introduced into at least one of $R^{65}$ and $R^{66}$ in the general formula (8) or $R^{68}$ in the general formula (9). As the cyclic compound, aromatic compounds such as phenyl, naphthyl, anthranyl and pyridyl and a derivative thereof may be introduced into at least one of $R^{65}$ and $R^{66}$ or $R^{68}$. In view of coping with the deep ultraviolet area of ArF excimer laser, those having small absorption of the area of 193 nm are preferable as the alicyclic compound to be introduced.

Examples of the alicyclic compound are cyclic compound represented by the general formula $C_nH_{2n}$ (n is an integer of not less than 3), polycyclic compound and a structure prepared by connecting them. Specific examples thereof are compounds having cyclobutane, cyclopentane, cyclohexane and cycloheptane as a skeleton, those wherein a substituent is introduced into the above compounds, those wherein crosslinking hydrocarbon is introduced into the above compounds, spiro compound (e.g. spiroheptane and spirooctane), norbornyl, adamantyl, bornene, menthyl, menthane, cyclic terpenoid compound, steroid skeleton (e.g. thujane, sabinane, thujone, carane, carene, pinane, norpinane, bornane, fencane, tricyclene and cholesteric derivative), bile acid, digitaloid, camphor, iso-camphor, sesquiterpene, santon, diterpene, triterpene derivative and steroid saponins. Examples of the ester are adamantyl, dicyclopentyl ester, cyclohexyl ester, cycloheptyl ester, norbornyl ester, bornyl ester, camphornyl ester, menthyl ester, adamanthyl ester and a derivative thereof.

In case of synthesizing the above esters, an ester may be introduced into a carboxyl group of a monomer, followed by polymerization reaction. Particularly, in case of the acid anhydride, an ester structure can also be introduced by the reaction with an alcohol after a polymer is polymerized.

In the third invention, the polymer containing the repeating segment represented by any one of the above general formulas (7) to (9) may be a copolymer prepared by copolymerizing the compound with the other constituent unit.

The compound which can be copolymerized may be any compound containing a polymerizable group and is not specifically limited, and examples thereof are derivative such as acrylic acid and methacrylic acid; compound having a double bond in the cyclic structure, e.g. norbornene and a derivative thereof; and aromatic compound, e.g. styrene and hydroxystyrene.

When using an ester or ether wherein a group which is liable to be decomposed by the acid catalytic reaction is introduced into a polar group among these copolymerization components, a chemical amplification action can be imparted to the polymer. Examples of such a structural unit are those represented by the following general formula (10):

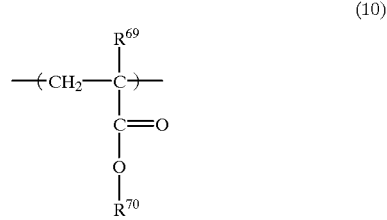

(10)

wherein $R^{69}$ is a hydrogen atom, an alkyl group, an aromatic group or a univalent substituent; and $R^{70}$ is a univalent substituent which is liable to be eliminated by an acid.

Examples of the alkyl group to be introduced as $R^{69}$ are methyl and ethyl. Examples of the aromatic group are phenyl and naphthyl. The univalent substituent is, for example, an alkylsilyl group. On the other hand, as the univalent substituent which is liable to be eliminated by an acid to be introduced as $R^{70}$, the same groups as those described above, e.g. t-butyl, tetrahydropyran, ethoxyethyl and alkylsilyl can be introduced.

That is, in the polymer to be blended in the third photosensitive composition of this invention, the univalent substituent which is liable to be eliminated by an acid can be introduced into at least one of a side chain of a monomer having halogen at the α-position (e.g. acrylic acid derivative) and the other monomer to be copolymerized with this monomer.

The total amount of the univalent group which is liable to be eliminated by an acid is preferably not less than 15% in the polymer. When the total amount of such a univalent group is less than 15%, it becomes difficult to sufficiently enhance the dissolution rate of the light-exposed portion.

In order to ensure the dry etch resistance by the copolymerization component, a structure containing an ester structure as shown with respect to a halogenated compound constituent unit is desired. Examples of such a constituent unit are those represented by the following general formula (11):

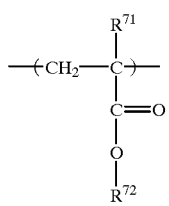

(11)

wherein $R^{71}$ is a hydrogen atom, an alkyl group, an aromatic group or a univalent substituent; and $R^{72}$ is a univalent organic group containing an aromatic ring, or a cyclic aliphatic substituent.

The alkyl group, aromatic group and univalent substituent, which can be introduced as $R^{71}$, may be the same as those described in case of $R^{69}$. As $R^{72}$, alicyclic compounds are preferable by the above reason.

That is, in the polymer to be blended in the third photosensitive composition of this invention, a cyclic substituent for imparting the dry etch resistance can be introduced into at least one of a side chain of a monomer having halogen at the α-position (e.g. acrylic acid derivative) and the other monomer to be copolymerized with this monomer.

The total amount of the univalent organic group containing an aromatic ring or cyclic aliphatic substituent is preferably from 10 to 90% in the polymer. When the total amount is less than 10%, it becomes difficult to obtain sufficient dry etch resistance. On the other hand, when the total amount exceeds 90%, the adhesion between the resist film and the substrate is likely to be lowered.

In the polymer to be blended in the third photosensitive composition of this invention, a proportion of the repeating segments represented by the above general formulas (7) to (9) is decided by the combination with the copolymerization component, but is preferably not less than 10%. When the proportion is less than 10%, it is likely to become difficult to obtain sufficient sensitivity.

In the third photosensitive composition, an average molecular weight of the above polymer is preferably set within the range from 1000 to 100000. The reason is as follows. That is, if the average molecular weight of the polymer is less than 1000, it is disadvantageous to form a resist film having sufficient mechanical strength. On the other hand, if the average molecular weight of the polymer exceeds 100,000, it becomes difficult to form a resist pattern having good resolution.

An amount of the polymer containing at least one of repeating segments represented by the above general formulas (7) to (9) to be blended into the photosensitive composition can be appropriately decided by the film thickness and solvent, but is normally from about 5 to 30% by weight.

As a compound which is capable of generating an acid by irradiation of an actinic radiation (hereinafter referred to as a "photo-acid generator") to be blended in the photosensitive composition of the third invention, for example, there can be used the same compounds as exemplified in the explanation of the first photosensitive composition, such as onium salt compound (e.g. sulfonyl and iodonium) and sulfonyl ester.

In the photosensitive composition of the third invention, a preferable amount of the photo-acid generator to be blended is preferably from 0.1 to 30% by weight, more preferably from 0.3 to 15% by weight, based on the total of the photosensitive composition. If the amount of the photo-acid generator is less than 0.1% by weight, it is likely to become difficult to form a resist pattern in high sensitivity. On the other hand, when the amount exceeds 30% by weight, the coating property at the occasion of forming resist film is likely to be lowered. According to the kind of the photo-acid generator, the light transmission of the photosensitive composition film at 193 nm is likely to be lowered.

Furthermore, to the photosensitive composition of the third invention, a compound having a group which is decomposed by a catalytic action of an acid to exhibit an alkali-solubility may be separately added as the solubility inhibitor, in addition to the above components. An inhibiting group which is liable to be decomposed by an acid may be, for example, a group which is capable of capping an acidic group of the above polymer. Specifically, as the solubility inhibitor, the same compound as exemplified in the explanation of the first photosensitive composition can be used.

As the solubility inhibitor, two or more kinds may be used in combination so as to maintain the dissolution rate and characteristics as the resist.

In the photosensitive composition of the third invention, when the solubility inhibitor is blended, it is desired that its amount is selected so that the total amount of the solubility-inhibiting group in the composition is preferably within the range from 5 to 90%, more preferably from 20 to 50%, based on the total polymer unit. The reason is as follows. That is, if the proportion of the solubility-inhibiting group is less than 5%, a contrast between the light exposure portion and non-exposure portion can not be adjusted. On the other hand, when the proportion exceeds 90%, the adhesion between the resist film and substrate is likely to be deteriorated.

In order to reduce an influence of deactivation caused by adsorption of a basic contamination in the environment as one of a drawback of a chemically amplified resist to be exerted on the resist characteristics, a trace amount of the basic compound may be added. As the basic compound, a compound which does not causes deterioration of the intrinsic resist sensitivity can be used, and examples thereof are pyridine derivatives such as t-butyl pyridine, benzyl pyridine and pyridinium salt; and aniline derivatives as aromatic aniline, such as N-methylaniline, N-ethylaniline, N,N'-dimethylaniline, diphenylaniline, N-methyldiphenylamine and indene. An amount of such a basic substance to be blended is preferably from 0.1 to 50 mole %, more preferably from 1 to 15 mole %, based on the photo-acid generator. When the amount is less than 1 mole %, it becomes difficult to sufficiently obtain the effect of the addition of the basic substance. On the other hand, when the amount exceeds 15 mole %, deterioration of the intrinsic sensitivity of the resist is likely to become severe.

The photosensitive composition of the third invention is prepared by dissolving the above polymer containing at least one of repeating segments represented by the above general formulas (7) to (9), and a photo-acid generator and, if necessary, a solubility inhibitor in an organic solvent, an filtering this solution.

As the organic solvent, the same solvents as exemplified in the explanation of the first photosensitive composition can be used.

In the followings, the method of forming a pattern using the photosensitive composition of this invention will be explained. First of all, the varnish obtained by dissolving a resist in the aforementioned organic solvent is coated on the surface of a predetermined substrate by means of a spin coating method or a dipping method. Then, the coated layer is dried at a temperature of 200° C. or less, or preferably at a temperature of 70 to 120° C. thereby forming a resist film. The substrate to be used in this case may be, for example, a silicon wafer; a silicon wafer provided thereon with various kinds of insulating films, electrodes or interconnecting wirings; a blank mask; a compound semiconductor wafer of Groups III–V elements such as GaAs and AlGaAs; a mask deposited thereon with chromium or chromium oxide; an Al-deposited substrate; an IBPSG-coating substrate; a PSG-coating substrate; a SOG-coating substrate; a carbon film-spattered substrate, etc.

Then, the resist film is irradiated through a predetermined mask pattern by an actinic radiation, or directly scanned by an actinic radiation, thereby performing the light exposure of the resist film. The actinic radiation to be used in this exposure may be any of ultraviolet rays; the i-, h-, or g-lines of a mercury lamp; a xenon lamp beam; a deep ultraviolet rays such as KrF or ArF excimer laser; X-rays; electron beams; γ-ray; neutron; and an ion beam. The effect of the photosensitive composition of this invention is exerted most efficiently to the light exposure using ArF excimer laser.

The resist film thus pattern-exposed is then subjected to a heat treatment (baking) generally at a temperature within the range from about 50 to 180° C., preferably from about 60 to 120° C., by means of heating over a heated plate or oven, or by means of infra-red irradiation. According to such a heat treatment, in the light exposure portion of the resist film, an acid generated by the light exposure functions as a catalyst and is allowed to react with a compound having a substituent which is decomposed by the acid. In this case, if the temperature of the heat treatment is less than 50° C., it becomes difficult to sufficiently cause the reaction between the acid generated by the photo-acid generator and the compound having a substituent which is decomposed by an acid. On the other hand, if the temperature exceeds 180° C., the excess decomposition or curing are likely to arise over both the light exposure portion and non-exposure portion of the resist film.

Thus, regarding the compound a substituent which is decomposed by an acid, the substituent is decomposed to exhibit the alkali-solubility. Sometimes, the same effect as that obtained by the baking after the light exposure can be obtained by standing at room temperature for a sufficient long time.

Subsequently, the resist film thus baked is then subjected to a developing treatment by making use of a dipping method, a spraying method or a puddle method, thereby selectively dissolving and removing the light exposure portion of the resist film to obtain a desired pattern. The alkaline solution can be preferably used in this case as the developer. Examples of such an alkaline solution are inorganic alkaline solutions such as aqueous solutions of sodium hydroxide, sodium carbonate, sodium silicate and sodium metasilicate; organic alkaline solutions such as aqueous solutions of tetramethylammonium hydroxide and trimethylhydroxy-ethylammonium hydroxide; and those obtained by adding alcohols and a surfactant to them. These alkaline solution are used in general at the concentration of 15% by weight or less in view of sufficiently differentiate the dissolution rate of the light exposure portion from that of the non-exposure portion. The developed substrate and resist film (resist pattern) are subjected to a rinsing treatment using water optionally, and then dried.

The resist pattern formed by using the photosensitive composition of this invention is excellent as follows. For example, the first photosensitive composition is remarkably superior in alkali-solubility so that the resist pattern using this photosensitive composition is free from the crack, surface roughness and collapse of the pattern.

The second photosensitive composition contains, as a main component, a polymer containing a constituent unit obtained by connecting an acidic substituent from a polymer backbone via at least one atom and a constitutuent unit having an alicyclic organic group on the side chain, as described above. Accordingly, the resist pattern formed by using such a photosensitive composition could avoid all drawbacks of a conventional composition containing copolymer comprising a bulky alicyclic compound an acidic group. That is, the resist pattern formed by using the second photosensitive composition is superior in adhesion with the substrate particularly, so that frilling is not caused at the occasion of development by an alkaline solution. Besides, a predetermined area is uniformly dissolved at the occasion of development, and the resolution of the resulting pattern is also good.

The third photosensitive composition contains, as a main component, a copolymer containing maleic anhydride, maleic acid, acrylic acid each having a halogen atom introduced at the α-position, or an ester compound thereof as a constituent unit. Accordingly, when the resist film obtained by applying such a photosensitive composition is irradiated by an actinic radiation, a backbone chain of the polymer at the light exposure portion is cut and the molecular weight is reduced. On the other hand, the polarity of the light exposure portion changes by catalytic action of an acid to exhibit a solubility to an alkaline developer, thereby generating a contrast of the dissolution rate. That is, the third photosensitive composition has a function of cutting a backbone chain of the polymer, in addition to the solubilization of the light exposure portion due to the action of a conventional acid catalyst, so that a large change in contrast can be easily obtained.

Thus, even if any of the first to third photosensitive compositions are used, a pattern having good resolution can be formed with good reproducibility. Accordingly, a very fine resist pattern (about 0.15 $\mu$m of line width) can be precisely transferred onto the surface of a substrate exposed by a predetermined etching method, by using this pattern as an etch mask. For example, when a resist pattern is formed as described above on a silicon wafer as a substrate, a fine pattern can be precisely formed by treating the substrate in a reactive ion etching apparatus of plane parallel plate type using $CF_4$ gas. On the other hand, when a transparent substrate whose surface is coated with a chromium layer is used as a substrate and a resist pattern is formed as described above thereon, the chromium layer can be selectively etched in high precision by using an aqueous solution of ammonium cerium nitrate as an etching solution, thereby forming a light-shielding film.

The step of a very fine working of electronic parts of this invention will be further explained with reference to the drawing depicting one embodiment where a silicon wafer is used as a substrate.

FIGS. 1A to 1E illustrate sectional views schematically showing the manufacturing process of electronic parts using a positive type resist for alkaline development.

First, as shown in FIG. 1A, exposure light 14 of predetermined pattern is irradiated onto a resist film 13 formed on the surface of a silicon wafer 11. As a result of this light exposure, an acid is generated at the light exposure portions of the resist film 13.

Then, the light-exposed resist film 13 is heated on a hot plate at a temperature of 50 to 180°C. for about 30 to 300 seconds or heated in an oven for about 5 to 60 minutes. As a result, an acid-decomposable compound is decomposed by the acid generated at the light exposure portion 16 of the resist film and the light exposure portion 16 exhibits the alkali-solubility as shown in FIG. 1B. Thereafter, the light exposure portion 16 is selectively dissolved with an alkaline solution, thereby forming a desired resist pattern 17 on the resist film 13 as shown in FIG. 1C.

Then, the resulting resist pattern 17 is used as an etch mask in the etching process of the silicon wafer 11 using $CF_4$ gas. As a result, the resist pattern 17 is transferred in high precision on the silicon wafer 11 as shown in FIG. 1D.

Finally, a resist-releasing solution such as Hakuri-10, Positive Photoresist Stripper R-10 is used to remove the resist pattern 17 on the surface of the substrate, thereby obtaining a silicon wafer 18 having a desired pattern formed thereon as shown in FIG. 1E.

Any additional steps other than explained above may be performed. For example, a step of forming a flattering layer as an underlayer for the resist film, a pretreatment step for improving the adhesion between the resist film and the underlayer, a rinsing step for removing a developer with water after the development of the resist film, and a step of re-irradiating ultraviolet rays before the dry etching may be conventionally performed.

This invention will be further explained with reference to Examples and Comparative Examples as follows.

EXAMPLE I

In this Example, a photosensitive composition was prepared by blending a polymer having a repeating segment represented by the general formula (1) or (4), and its characteristics were examined.

First, a monomer for polymerization of a polymer to be blended in the photosensitive composition of this Example was synthesized as follows.

(Monomer (I-1))

44 g of 1-methylbutanol and 50.5 g of triethylamine were dissolved in 100 g of methylene chloride to obtain a solution. Then, 52 g of methacryloyl chloride was added dropwise in the solution with maintaining the temperature of the solution at −20° C. so that no heat is generated, thereby obtaining a mixed solution. The temperature of the resulting mixed solution was slowly raised and, after stirring at 20° C. for 2 hours, a triethylamine hydrochloride salt was removed by filtration. Finally, the solution was recrystallized to obtain 5 g of γ-((1-methyl)cyclobutyl)methacrylate.

(Monomer (I-2))

The same procedure as described in the synthesis of the above monomer (I-1) was repeated except that 1-methylbutanol was replaced by 50 g of 1-methylpentanol, thereby obtaining 53 g of γ-((1-methyl)cyclopentyl)methacrylate.

(Monomer (I-3))

The same procedure as described in the synthesis of the above monomer (I-1) was repeated except that 1-methylbutanol was replaced by 57 g of 1-methylhexanol, thereby obtaining 68 g of γ-((1-methyl)cyclohexyl)methacrylate.

(Monomer (I-4))

The same procedure as described in the synthesis of the above monomer (I-1) was repeated except that 1-methylbutanol was replaced by 63 g of 1-methylheptanol, thereby obtaining 74 g of γ-((1-methyl)cycloheptyl)methacrylate.

(Monomer (I-5))

The same procedure as described in the synthesis of the above monomer (I-1) was repeated except that 1-methylbutanol was replaced by 69 g of 1-methyloctanol, thereby obtaining 80 g of γ-((1-methyl)cyclooctyl)methacrylate.

(Monomer (I-6))

17 g of (1S,2S,3R,5S)-(+)-Pinandiol and 10 g of triethylamine were dissolved in 20 g of methylene chloride to obtain a solution. Then, 10 g of methacryloyl chloride was added dropwise in the solution with maintaining the temperature of the solution at −20° C. so that no heat is generated, thereby obtaining a mixed solution. The temperature of the resulting mixed solution was slowly raised and, after stirring at 20° C. for 2 hours, a triethlamine hydrochloride salt was removed by filtration. Finally, the solution was recrystallized to obtain 20 g of a monomer represented by the following chemical formula:

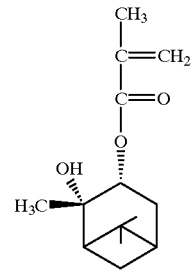

(Monomer (I-7))

17 g of 2-methylisoborneol and 10 g of triethylamine were dissolved in 20 g of methylene chloride to obtain a solution. Then, 10 g of methacryloyl chloride was added dropwise in the solution with maintaining the temperature of the solution at −20° C. so that no heat is generated, thereby obtaining a mixed solution. The temperature of the resulting mixed solution was slowly raised and, after stirring at 20° C. for 2 hours, a triethylamine hydrochloride salt was removed by filtration. Finally, the solution was recrystallized to obtain 21 g of γ-((2-methyl)isobornyl)methacrylate.

(Monomer (I-8))

Acetic anhydride and p-menthan-3,8-diol were mixed with stirring in acetone and refluxed. Then, the mixture was extracted with ether to obtain p-menthal-3-acetoxy,8-ol.

This product was dissolved in 20 g of methylene chloride, together with 10 g of triethylamine, thereby obtaining a solution. Then, 10 g of methacryloyl chloride was added dropwise in the solution with maintaining the temperature of the solution at −20° C. so that no heat is generated, thereby obtaining a mixed solution. The temperature of the resulting mixed solution was slowly raised and, after stirring at 20° C. for 2 hours, a triethylamine hydrochloride salt was removed by filtration, followed by recrystallization. Finally, the solution was hydrolyzed with a strong alkali to obtain 20 g of γ-(p-menthan-3-ol)methacrylate.

(Monomer (I-9))

Menthandiol, chloride acrylate and butyl lithium were mixed in tetrahydrofuran (THF) to obtain a THF solution, which was stirred at room temperature for 8 hours.

The THF solution after stirring was allowed to react with an aqueous saturated sodium hydrogencarbonate solution, and ether was added. The reaction solution was separated into two layers and the aqueous layer was extracted with ether. Then, organic layers were combined and washed with an aqueous saturated sodium hydrogencarbonate solution. The resultant was dried with an aqueous saturated sodium chloride solution and then with anhydrous sodium sulfate.

After concentration, the resulting oily product was separated by a silica gel column to obtain γ-(p-menthan-3-ol)acrylate.

(Monomer (I-10))

50 g of 1-methylpentanol and 50.5 g of triethylamine were dissolved in 100 g of methylene chloride to obtain a solution. Then, 45 g of methacryloyl chloride was added dropwise in the solution with maintaining the temperature of the solution at −20° C. so that no heat is generated, thereby obtaining a mixed solution. The temperature of the resulting mixed solution was slowly raised and, after stirring at 20° C. for 2 hours, a triethylamine hydrochloride salt was removed by filtration. Finally, the solution was recrystallized to obtain 51 g of γ-((1-methyl)cyclopentyl)acrylate.

(Monomer (I-11))

The same procedure as described in the synthesis of the above monomer (I-10) was repeated except that 1-methypentanol was replaced by 57 g of 1-methylhexanol, thereby obtaining 58 g of γ-((1-methyl)cyclohexyl) acrylate.

(Monomer (I-12))

13 g of 2-methylnorbornen-2-ol and 10 g of triethylamine were dissolved in 20 g of methylene chloride to obtain a solution. Then, 10 g of methacryloyl chloride was added dropwise in the solution with maintaining the temperature of the solution at −20° C. so that no heat is generated, thereby obtaining a mixed solution. The temperature of the resulting mixed solution was slowly raised and the mixed solution was stirred at 20° C. for 2 hours. Then, a triethylamine hydrochloride salt was removed by filtration, followed by recrystallization to obtain 17 g of γ-((2-methyl)norbornyl) methacrylate.

(Monomer (I-13))

9.3 g of methacryloyl chloride and 15 g of 2-hydroxy-3-pinanone were dissolved in 50 ml of THF to obtain a THF solution. Then, 9.0 g of triethylamine was added with maintaining the temperature of the THF solution at 0° C., thereby preparing a mixed solution (reaction solution). The reaction solution was stirred at 1 hour and then stirred at room temperature for 3 hours to obtain an ester compound formed by a solvent extraction. The purification was performed by column chromatography. Using a silica gel as a carrier, the purified ester compound was developed with toluene to obtain a monomer represented by the following chemical formula:

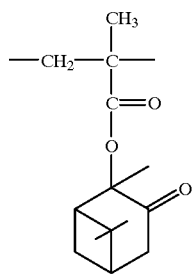

Figure 2:
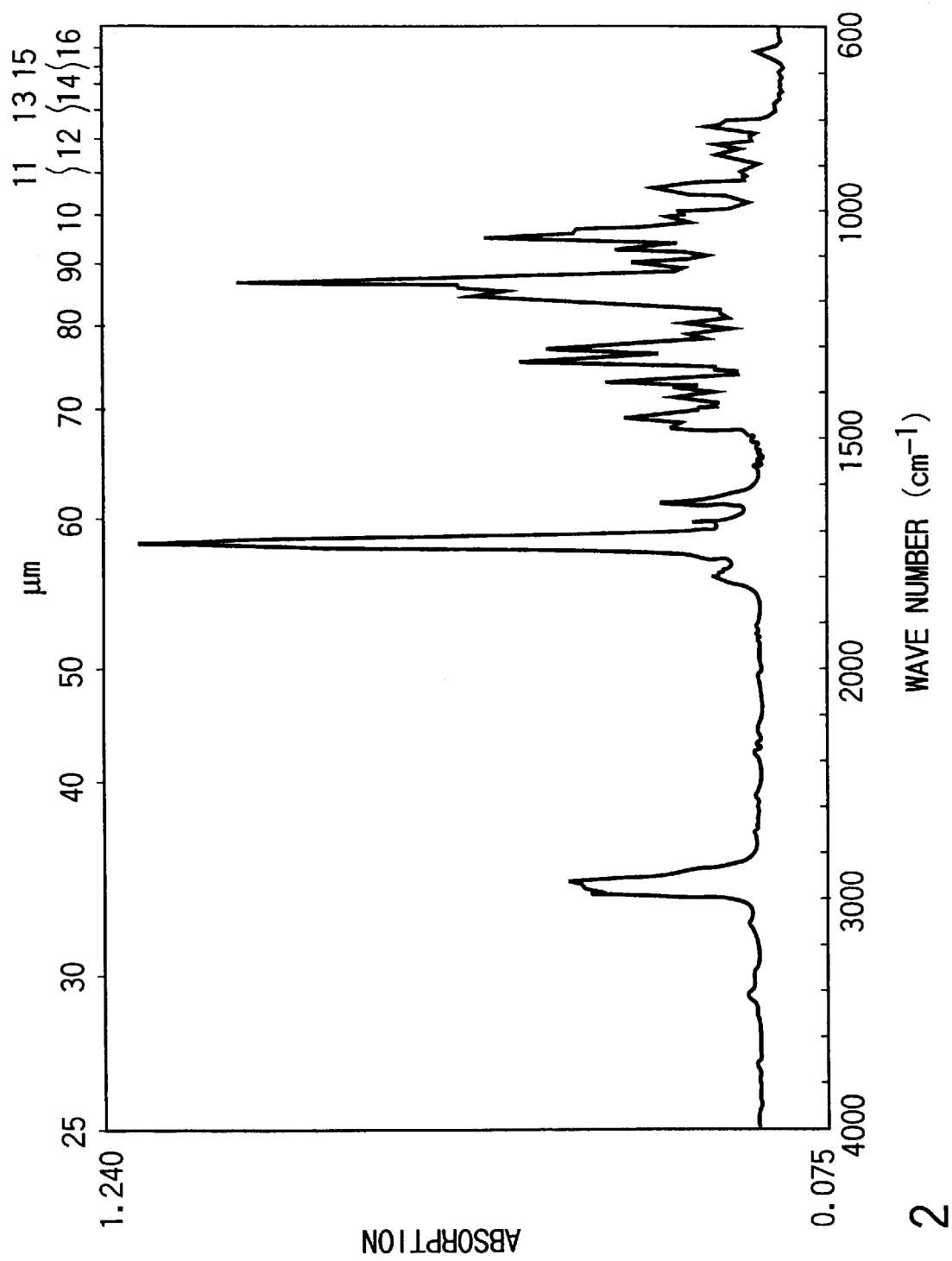
FIG. 2 illustrates an infrared spectrum of one embodiment of a polymer contained in the photosensitive composition of this invention.

An infrared spectrum of the resulting compound is shown in FIG. 2. The absorption of C—H appears at 2900 to 3000 cm$^{-1}$, and the absorptions of C=O and C—O—C appear at 1720 cm$^{-1}$ and 1150 cm$^{-1}$, respectively.

(Monomer (I-14))

The same procedure as described in the synthesis of the above monomer (I-13) was repeated except that methacryloyl chloride was replaced by acryloyl chloride, thereby obtaining a monomer represented by the following general formula:

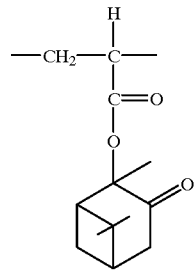

(Monomer(I-15))

Adamantane-1-carboxylic acid and potassium permanganate were reacted by oxidation using sodium hydroxide as a catalyst to obtain adamantan-1-ol, 4-carboxylic acid.

This product was dissolved in 20 g of methylene chloride together with 10 g of triethylamine, thereby obtaining a solution. Then, 10 g of acryloyl chloride was added dropwise in the solution with maintaining the temperature of the solution at −20° C. so that no heat is generated, thereby obtaining a mixed solution. The temperature of the resulting mixed solution was slowly raised and, after stirring for 2 hours, a triethylamine chloride salt was removed by filtration, followed by recrystallization. Finally, the solution was hydrolyzed with a strong alkali to obtain adamantan-4-carboxylic acid, 1-acrylate.

(Monomer(I-16))

20 g of p-menthane-3,8-diol was dissolved in 20 g of methylene chloride together with 10 g of triethylamine, thereby obtaining a solution. Then, 10 g of acryloyl chloride was added dropwise in the solution with maintaining the temperature of the solution at −20° C. so that no heat is generated, thereby obtaining a mixed solution. The temperature of the resulting mixed solution was slowly raised and, after stirring for 2 hours, a triethylamine chloride salt was removed by filtration, followed by recrystallization. Finally, the solution was hydrolyzed with a strong alkali to obtain 20 g of 8-hydroxy -3-menthylacrylate.

(Monomer(I-17))

1-methylcyclohexane-4-carboxylic acid and potassium permanganate were reacted by oxidation using sodium hydroxide as a catalyst to obtain 1-methylcyclohexane,1-ol, 4-carboxylic acid.

20 g of this product was dissolved in 20 g of methylene chloride together with 10 g of triethylamine, thereby obtaining a solution. Then, 10 g of acryloyl chloride was added dropwise in the solution with maintaining the temperature of the solution at −20° C. so that no heat is generated, thereby obtaining a mixed solution. The temperature of the resulting mixed solution was slowly raised and, after stirring for 2 hours, a triethylamine chloride salt was removed by filtration, followed by recrystallization. Finally, the solution was hydrolyzed with a strong alkali to obtain 1-methylcyclohexane, 4-carboxylic acid, 1-acrylate.

Using the monomers (I-1) to (I-17) obtained as described above, a polymer was synthesized as follows.

(Polymer (PI-1))

8.5 g of γ-((1-methyl)cyclopentyl) methacrylate and 0.82 g of azobisisobutyronitrile (AIBN) were dissolved in 30 g of tetrahydrofuran (THF) to obtain a THF solution. This THF solution was freeze-deaerated three times under an argon atmosphere at a liquid nitrogen temperature. After the THF solution was allowed to react at 60° C. for 30 hours, 2 ml of methanol was added to the reaction solution and 20 g of THF was further added. The reaction solution was added in 250 g of hexane drop by drop with stirring to perform reprecipitation, followed by filtration with a glass filter. Finally, the solid content was vacuum-dried at 60° C. for 3 days to obtain a polymer having a repeating segment represented by the following chemical formula. An yield was 6.85 g and a weight-average molecular weight of the resulting polymer was 15000 in terms of polystyrene.

(Polymer (PI-2))

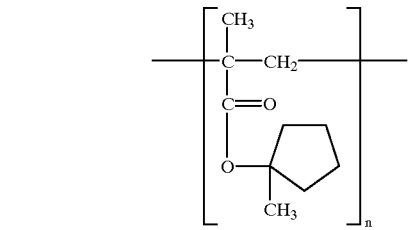

(wherein n is an integer)

9.2 g of γ-((1-methyl)cyclohexyl) methacrylate and 0.82 g of AIBN were dissolved in 20 g of THF, and the resulting THF solution was freeze-deaerated three times under an argon atmosphere at a liquid nitrogen temperature. After the THF solution was allowed to react at 60° C. for 30 hours, 2 ml of methanol was added to the reaction solution and 20 g of THF was further added. The reaction solution was added in 250 g of hexane drop by drop with stirring to perform reprecipitation, followed by filtration with a glass filter. Finally, the solid content was vacuum-dried at 60° C. for 3 days to obtain a polymer having a repeating segment represented by the following chemical formula. An yield was 7.6 g and a weight-average molecular weight of the resulting polymer was 15000 in terms of polystyrene.

(Polymer (PI-3))

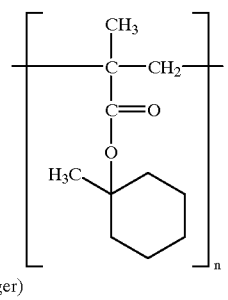

(wherein n is an integer)

10.1 g of γ-((1-methyl)cyclopentyl) methacrylate, 3.3 g of methacrylic acid and 1.64 g of AIBN were dissolved in 30 g of THF, and the resulting THF solution was freeze-deaerated three times under an argon atmosphere at a liquid nitrogen temperature. After the THF solution was allowed to react at 60° C. for 30 hours, 2 ml of methanol was added to the reaction solution and 30 g of THF was further added. The reaction solution was added in 500 g of hexane drop by drop with stirring to perform reprecipitation, followed by filtration with a glass filter. Finally, the solid content was vacuum-dried at 60° C. for 3 days to obtain a copolymer having a repeating segment represented by the following chemical formula. An yield was 10.65 g and a weight-average molecular weight of the resulting polymer was 15000 in terms of polystyrene.

(Polymer (PI-4))

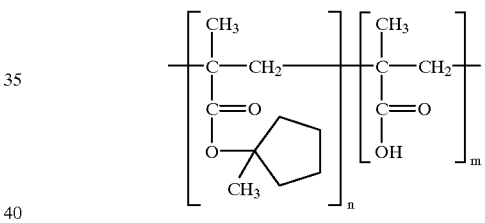

(wherein m and n are individually an integer)

The same procedure as described in the synthesis of the above polymer (PI-3) was repeated except that γ-((1-methyl)cyclopentyl)methacrylate was replaced by 11.0 g of γ-((1-methyl)cyclohexyl)methacrylate, thereby obtaining a copolymer having a repeating segment represented by the following chemical formula. An yield was 11.3 g and a weight-average molecular weight of the resulting polymer was 15000 in terms of polystyrene.

(Polymer (PI-5))

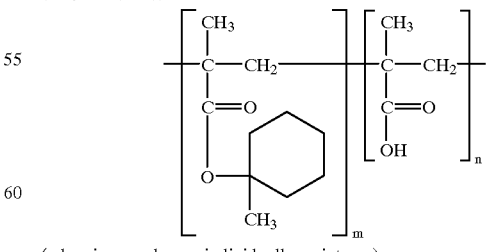

(wherein m and n are individually an integer)

The same procedure as described in the synthesis of the above copolymer (PI-3) was repeated except that γ-((1-methyl)cyclopentyl)methacrylate was replaced by 11.9 g of γ-((1-methyl)cycloheptyl)methacrylate, thereby obtaining a copolymer having a repeating segment represented by the following chemical formula. An yield was 12.1 g and a weight-average molecular weight of the resulting polymer was 15000 in terms of polystyrene.

(Polymer (PI-6))

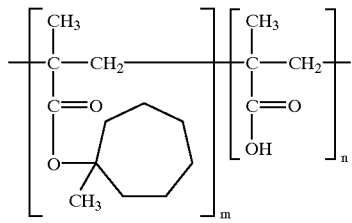

(wherein m and n are individually and integer)

The same procedure as described in the synthesis of the above copolymer (PI-3) was repeated except that γ-((1-methyl)cyclopentyl)methacrylate was replaced by 12.8 g of γ-((1-methyl)cyclooctyl)methacrylate, thereby obtaining a copolymer having a repeating segment represented by the following chemical formula.

An yield was 12.9 g and a weight-average molecular weight of the resulting polymer was 15000 in terms of polystyrene.

(Polymer (PI-7))

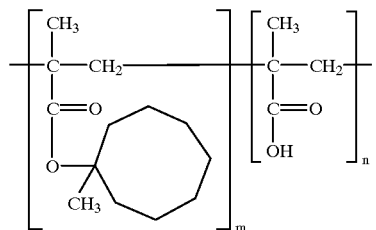

(wherein m and n are individually an integer)

The same procedure as described in the synthesis of the above copolymer (PI-3) was repeated except that γ-((1-methyl)cyclopentyl)methacrylate was replaced by 13.4 g of γ-((2-methyl)isobornyl)methacrylate, thereby obtaining a copolymer having a repeating segment represented by the following chemical formula. An yield was 13.9 g and a weight-average molecular weight of the resulting polymer was 15000 in terms of polystyrene.

(Polymer (PI-8))

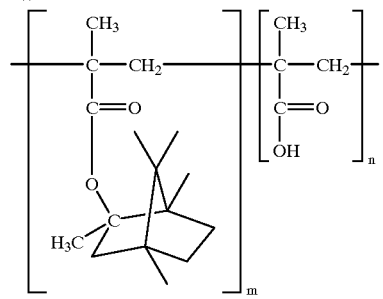

(wherein m and n are individually an integer)

The same procedure as described in the synthesis of the above copolymer (PI-3) was repeated except that γ-((1-methyl)cyclopentyl)methacrylate was replaced by 13.6 g of the above monomer (I-8), thereby obtaining a copolymer having a repeating segment represented by the following chemical formula. An yield was 14.3 g and a weight-average molecular weight of the resulting polymer was 15000 in terms of polystyrene.

(Polymer (PI-9))

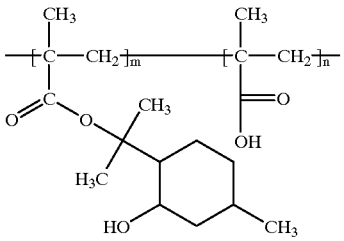

(wherein m and n are individually an integer)

The same procedure as described in the synthesis of the above copolymer (PI-3) was repeated except that γ-((1-methyl)cyclopentyl)methacrylate was replaced by 9.2 g of γ-((1-methyl)cyclopentyl)acrylate, thereby obtaining a copolymer having a repeating segment represented by the following chemical formula. An yield was 10.05 g and a weight-average molecular weight of the resulting polymer was 15000 in terms of polystyrene.

(Polymer (PI-10))

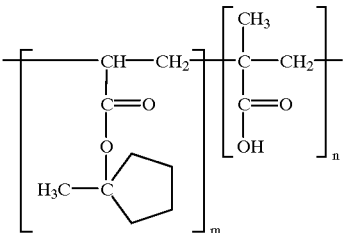

(wherein m and n are individually an integer)

The same procedure as described in the synthesis of the above copolymer (PI-3) was repeated except that γ-((1-methyl)cyclopentyl)methacrylate was replaced by 10.1 g of γ-((1-methyl)cyclohexyl)acrylate, thereby obtaining a copolymer having a repeating segment represented by the following chemical formula. An yield was 10.4 g and a weight-average molecular weight of the resulting polymer was 15000 in terms of polystyrene.

(Polymer (PI-11))

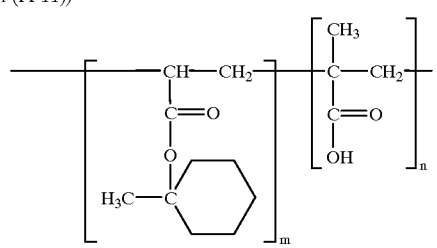

(wherein m and n are individually an integer)

The same procedure as described in the synthesis of the above copolymer (PI-3) was repeated except that γ-((1-methyl)cyclopentyl)methacrylate was replaced by 12.6 g of γ-((2-methyl)norbornyl)acrylate, thereby obtaining a copolymer having a repeating segment represented by the following chemical formula. An yield was 13.2 g and a weight-average molecular weight of the resulting polymer was 15000 in terms of polystyrene.

(Polymer (PI-12))

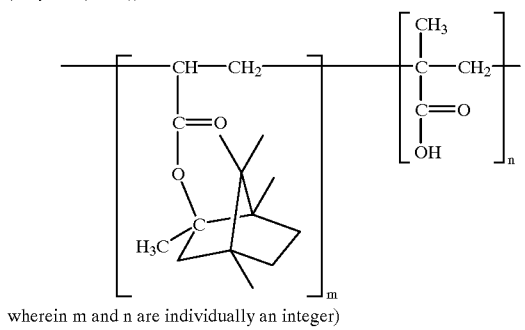

wherein m and n are individually an integer)

0.020 mol of γ-(p-menthan-3-ol)methacrylate, 0.025 mol of vinylnaphthalene, 0.034 mol of tetrahydropyranyl methacrylate and 0.021 mol of methacrylic acid were dissolved in 20 g of THF, and 0.0125 mol of AIBN as a polymerization initiator was added to the resulting solution. The THF solution (reaction solution) thus obtained was freeze-deaerated three times under an argon atmosphere at a liquid nitrogen temperature. After the THF solution was allowed to react at 60° C. for 30 hours, 2 ml of methanol was added to the reaction solution. The reaction solution was added in 250 g of hexane drop by drop with stirring to perform reprecipitation, followed by filtration with a glass filter. Finally, the solid content was vacuum-dried at 60° C. for 3 days to obtain a copolymer having a repeating segment represented by the following chemical formula. A weight-average molecular weight of the resulting polymer was 15000 in terms of polystyrene.

(Polymer (PI-13))

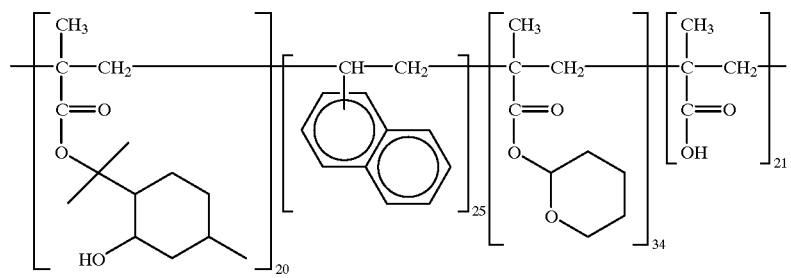

The same procedure as described in the synthesis of the above polymer (PI-12) was repeated except that vinylnaphthalene was replaced by 0.25 mol of naphthyl methacrylate, thereby obtaining a copolymer having a repeating segment represented by the following chemical formula. A weight-average molecular weight of the resulting polymer was 15000 in terms of polystyrene.

(Polymer (PI-14))

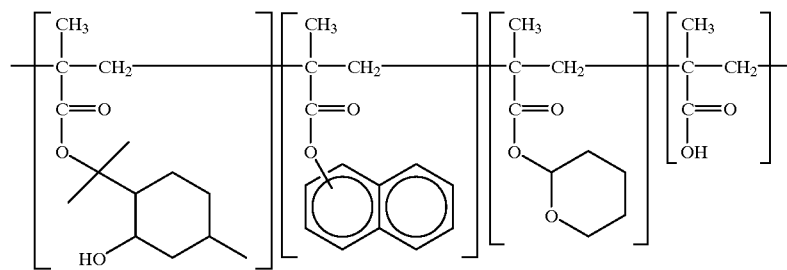

The same procedure as described in the synthesis of the above polymer (PI-12) was repeated except that vinylnaphthalene was replaced by 0.25 mol of vinylnaphthol, thereby obtaining a copolymer having a repeating segment represented by the following chemical formula. A weight-average molecular weight of the resulting polymer was 15000 in terms of polystyrene.

(Polymer (PI-15))

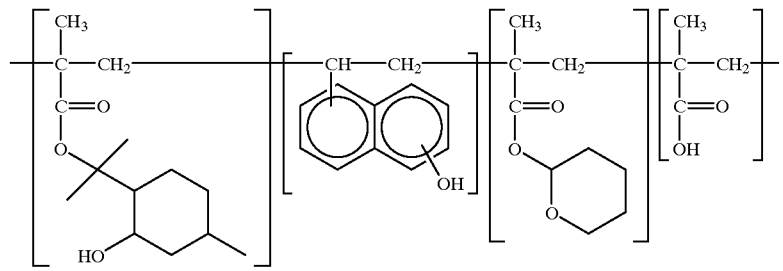

0.055 mol of γ-(p-menthan-3-ol)methacrylate, 0.025 ol of vinylnaphthol acetate and 0.020 mol of methacrylic acid were dissolved in 20 g of THF, and 0.0125 mol of AIBN as a polymerization initiator was added to the resulting solution. The THF solution (reaction solution) thus obtained was first freeze-deaerated three times under an argon atmosphere at a liquid nitrogen temperature. After the THF solution was allowed to react at 60° C. for 30 hours, 2 ml of methanol was added to the reaction solution and 20 g of THF was further added. The reaction solution was added in 250 g of hexane drop by drop with stirring to perform reprecipitation. The resulting solid content was dissolved in a solution prepared by mixing an aqueous 1N sodium hydroxide solution with THF in a ratio of 1:1, and the solution was allowed to react at 60° C., thereby decomposing the acetate. The solution was again precipitated in 500 g of hexane, followed by filtration with a glass filter. Finally, the solid content was vacuum-dried at 60° C. for 3 days to obtain a copolymer having a repeating segment represented by the following chemical formula. A weight-average molecular weight of the resulting polymer was 15000 in terms of polystyrene.

(Polymer (PI-16))

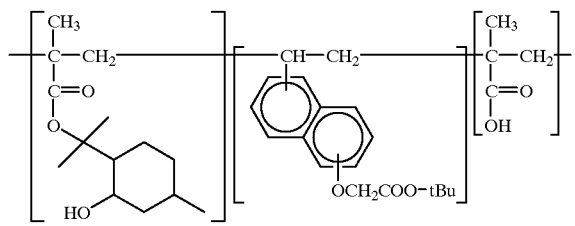

0.075 mol of γ-(p-menthan-3-ol)methacrylate and 0.025 mol of t-butylvinylnaphthol were dissolved in 20 g of THF, and 0.0125 mol of AIBN as a polymerization initiator was added to the resulting solution. The THF solution (reaction solution) thus obtained was first freeze-deaerated three times under an argon atmosphere at a liquid nitrogen temperature. After the THF solution was allowed to react at 60° C. for 30 hours, 2 ml of methanol was added to the reaction solution and 20 g of THF was further added. The reaction solution was added in 250 g of hexane drop by drop with stirring to perform reprecipitation, followed by filtration with a glass filter. Finally, the solid content was vacuum-dried at 60° C. for 3 days to obtain a copolymer having a repeating segment represented by the following chemical formula. A weight-average molecular weight of the resulting polymer was 15000 in terms of polystyrene.

(Polymer (PI-17))

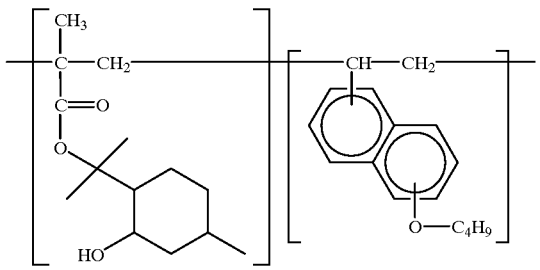

0.020 mol of γ-(p-menthan-3-ol)acrylate, 0.025 mol of vinylnaphthalene, 0.034 mol of tetrahydropyranyl methacrylate and 0.021 mol of methacrylic acid were dissolved in 20 g of THF, and 0.0125 mol of AIBN as a polymerization initiator was added to the resulting solution. The THF solution (reaction solution) thus obtained was first freeze-deaerated three times under an argon atmosphere at a liquid nitrogen temperature. After the THF solution was allowed to react at 60° C. for 30 hours, 2 ml of methanol was added to the reaction solution and 20 g of THF was further added. The reaction solution was added in 250 g of hexane drop by drop with stirring to perform reprecipitation, followed by filtration with a glass filter. Finally, the solid content was vacuum-dried at 60° C. for 3 days to obtain a copolymer having a repeating segment represented by the following chemical formula. A weight-average molecular weight of the resulting polymer was 15000 in terms of polystyrene.

(Polymer (PI-18))

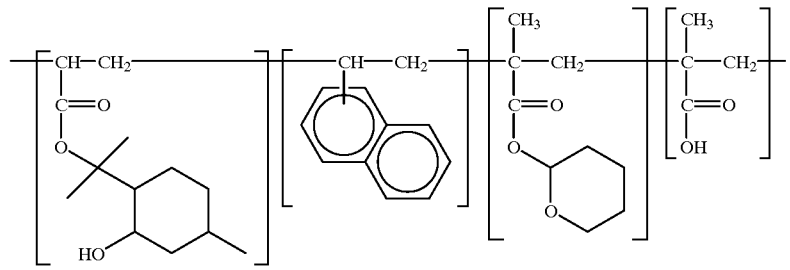

The same procedure as described in the synthesis of the above polymer (PI-17) was repeated except that vinylnaphthalene was replaced by 0.025 mol of naphthyl methacrylate, thereby obtaining a copolymer having a repeating segment represented by the following chemical formula. A weight-average molecular weight of the resulting copolymer was 15000.

(Polymer (PI-19))

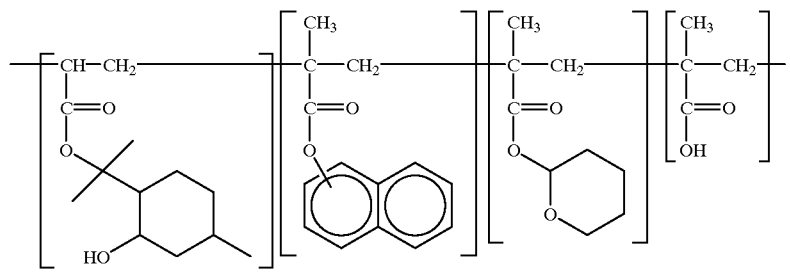

The same procedure as described in the synthesis of the above polymer (PI-17) was repeated except that vinylnaphthalene was replaced by 0.025 mol of vinylnaphthol, thereby obtaining a copolymer having a repeating segment represented by the following chemical formula. A weight-average molecular weight of the resulting copolymer was 15000.

(Polymer (PI-20))

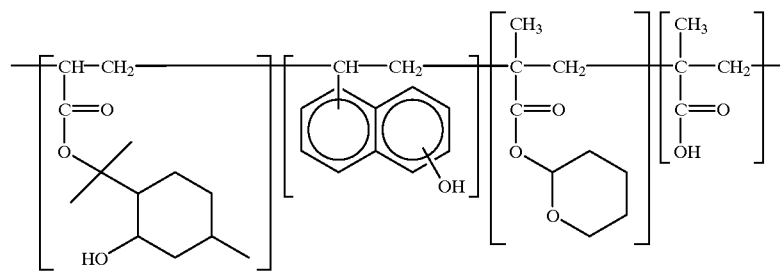

0.055 mol of γ-(p-menthan-3-ol)acrylate, 0.025 mol of vinylnaphthol acetate and 0.020 mol of methacrylic acid were dissolved in 20 g of THF, and 0.0125 mol of AIBN as a polymerization initiator was added to the resulting solution. The THF solution (reaction solution) thus obtained was first freeze-deaerated three times under an argon atmosphere at a liquid nitrogen temperature. After the THF solution was allowed to react at 60° C. for 30 hours, 2 ml of methanol was added to the reaction solution and 20 g of THF was further added. The reaction solution was added in 250 g of hexane drop by drop with stirring to perform rereprecipitation. The resulting solid content was dissolved in a solution prepared by mixing an aqueous 1N sodium hydroxide solution with THF in a ratio of 1:1, and the solution was allowed to react at 60° C., thereby decomposing the acetate. The solution was again precipitated in 500 g of hexane, followed by filtration with a glass filter. Finally, the solid content was vacuum-dried at 60° C. for 3 days to obtain a copolymer having a repeating segment represented by the following chemical formula. A weight-average molecular weight of the resulting polymer was 15000 in terms of polystyrene.

(Polymer (PI-21))

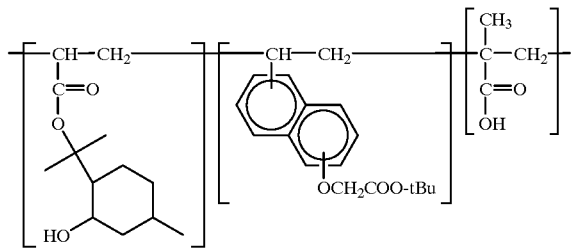

0.075 mol of γ-(p-menthan-3-ol) acrylate and 0.025 mol of t-butylvinylnaphthol were dissolved in 20 g of THF, and 0.0125 mol of AIBN as a polymerization initiator was added to the resulting solution. The THF solution (reaction solution) thus obtained was first freeze-deaerated three times under an argon atmosphere at a liquid nitrogen temperature. After the THF solution was allowed to react at 60° C. for 30 hours, 2 ml of methanol was added to the reaction solution and 20 g of THF was further added. The reaction solution was added in 250 g of hexane drop by drop with stirring to perform reprecipitation, followed by filtration with a glass filter. Finally, the solid content was vacuum-dried at 60° C. for 3 days to obtain a copolymer having a repeating segment represented by the following chemical formula. A weight-average molecular weight of the resulting polymer was 15000 in terms of polystyrene.

(Polymer (PI-22))

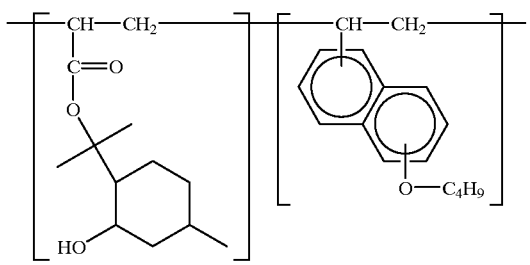

0.020 mol of γ-(p-menthan-3-ol)methacrylate, 0.025 mol of vinylnaphthalene, 0.034 mol of tetrahydropyranyl acrylate and 0.021 mol of methacrylic acid were dissolved in 20 g of THF, and 0.0125 mol of AIBN as a polymerization initiator was added to the resulting solution. The THF solution (reaction solution) thus obtained was first freeze-deaerated three times under an argon atmosphere at a liquid nitrogen temperature. After the THF solution was allowed to react at 60° C. for 30 hours, 2 ml of methanol was added to the reaction solution and 20 g of THF was further added. The reaction solution was added in 250 g of hexane drop by drop with stirring to perform reprecipitation, followed by filtration with a glass filter. Finally, the solid content was vacuum-dried at 60° C. for 3 days to obtain a copolymer having a repeating segment represented by the following chemical formula. A weight-average molecular weight of the resulting polymer was 15000 in terms of polystyrene.

(Polymer (PI-23))

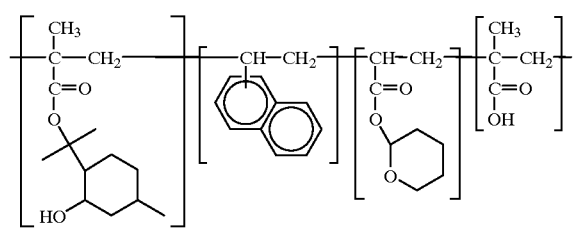

The same procedure as described in the synthesis of the above polymer (PI-22) was repeated except that vinylnaphthalene was replaced by 0.025 mol of naphthyl methacrylate, thereby obtaining a copolymer having a repeating segment represented by the following chemical formula. A weight-average molecular weight of the resulting polymer was 15000 in terms of polystyrene.

(Polymer (PI-24))

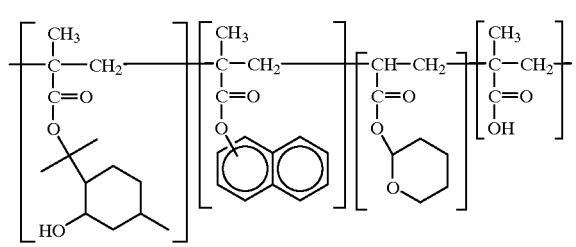

The same procedure as described in the synthesis of the above polymer (PI-22) was repeated except that vinylnaphthalene was replaced by 0.025 mol of vinylnaphthol, thereby obtaining a copolymer having a repeating segment represented by the following chemical formula. A weight-average molecular weight of the resulting polymer was 15000 in terms of polystyrene.

(Polymer (PI-25))

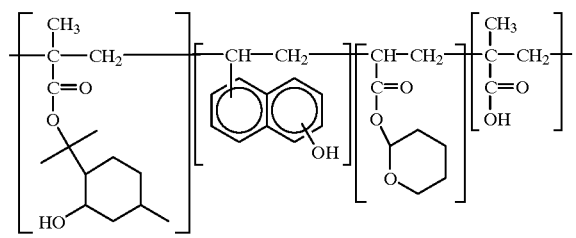

0.020 mol of γ-(p-menthan-3-ol)acrylate, 0.025 mol of vinylnaphthalene, 0.034 mol of tetrahydropyranyl acrylate and 0.021 mol of methacrylic acid were dissolved in 20 g of THF, and 0.0125 mol of AIBN as a polymerization initiator was added to the resulting solution. The THF solution (reaction solution) thus obtained was first freeze-deaerated three times under an argon atmosphere at a liquid nitrogen temperature. After the THF solution was allowed to react at 60° C. for 30 hours, 2 ml of methanol was added to the reaction solution and 20 g of THF was further added. The reaction solution was added in 250 g of hexane drop by drop with stirring to perform reprecipitation, followed by filtration with a glass filter. Finally, the solid content was vacuum-dried at 60° C. for 3 days to obtain a copolymer having a repeating segment represented by the following chemical formula. A weight-average molecular weight of the resulting polymer was 15000 in terms of polystyrene.

(Polymer (PI-26))

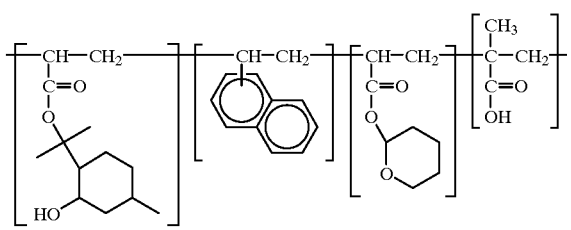

The same procedure as described in the synthesis of the above polymer (PI-25) was repeated except that vinylnaphthalene was replaced by 0.025 mol of naphthyl acrylate, thereby obtaining a copolymer having a repeating segment represented by the following chemical formula. A weight-average molecular weight of the resulting polymer was 15000 in terms of polystyrene.

(Polymer (PI-27))

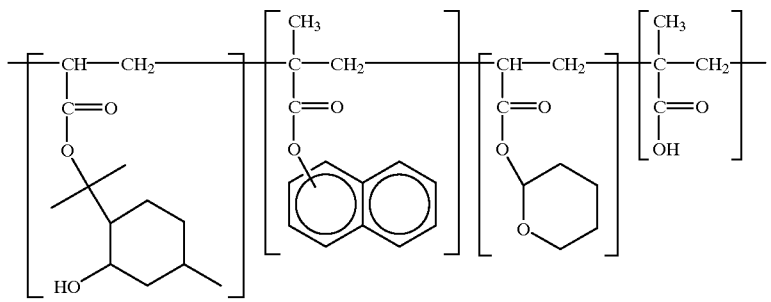

The same procedure as described in the synthesis of the above polymer (PI-25) was repeated except that vinylnaphthalene was replaced by 0.025 mol of naphthyl acrylate and tetrahydropyranyl acrylate was replaced by 0.034 mol of tetrahydropyranyl methacrylate, thereby obtaining a copolymer having a repeating segment represented by the following chemical formula. A weight-average molecular weight of the resulting polymer was 15000 in terms of polystyrene.

(Polymer (PI-28))

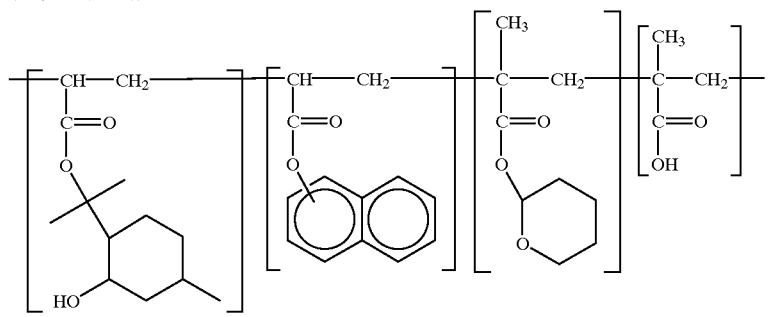

The same procedure as described in the synthesis of the above polymer (PI-25) was repeated except that vinylnaphthalene was replaced by 0.025 mol of naphthyl acrylate, thereby obtaining a copolymer having a repeating segment represented by the following chemical formula. A weight-average molecular weight of the resulting polymer was 15000 in terms of polystyrene.

(Polymer (PI-29))

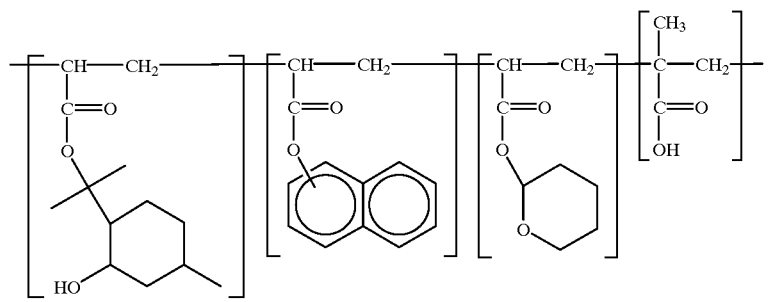

The same procedure as described in the synthesis of the above polymer (PI-25) was repeated except that vinylnaphthalene was replaced by 0.025 mol of vinylnaphthol, thereby obtaining a copolymer having a repeating segment represented by the following chemical formula. A weight-average molecular weight of the resulting polymer was 15000 in terms of polystyrene.

(Polymer (PI-30))

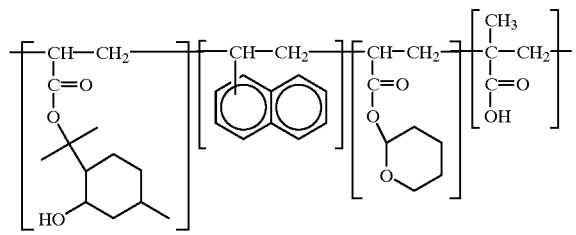

0.020 mol of γ-((2-methyl)isobornyl) methacrylate, 0.025 mol of vinylnaphthalene, 0.034 mol of tetrahydropyranyl methacrylate and 0.021 mol of methacrylic acid were dissolved in 20 g of THF, and 0.0125 mol of AIBN as a polymerization initiator was added to the resulting solution. The THF solution (reaction solution) thus obtained was first freeze-deaerated three times under a nitrogen atmosphere at a liquid nitrogen temperature. After the THF solution was allowed to react at 60° C. for 30 hours, 2 ml of methanol was added to the reaction solution and 20 g of THF was further added. The reaction solution was added in 250 g of hexane drop by drop with stirring to perform reprecipitation, followed by filtration with a glass filter. Finally, the solid content was vacuum-dried at 60° C. for 3 days to obtain a copolymer having a repeating segment represented by the following chemical formula. A weight-average molecular weight of the resulting polymer was 15000 in terms of polystyrene.

(Polymer (PI-31))

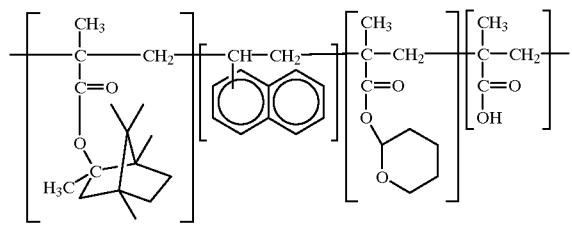

The same procedure as described in the synthesis of the above polymer (PI-30) was repeated except that γ-((2-methyl)isobornyl)methacrylate was replaced by 0.020 mol of γ-((2-methyl)isobornyl)acrylate, thereby obtaining a copolymer having a repeating segment represented by the following chemical formula. A weight-average molecular weight of the resulting polymer was 15000 in terms of polystyrene.

(Polymer (PI-32))

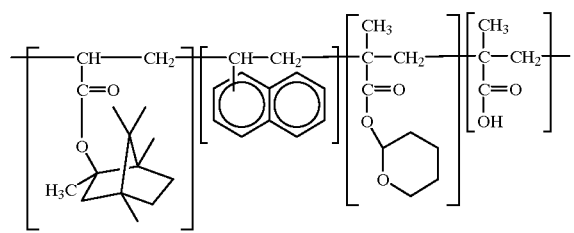

0.020 mol of γ-((1-methyl)cyclohexyl) methacrylate, 0.025 mol of vinylnaphthalene, 0.034 mol of tetrahydropyranyl methacrylate and 0.021 mol of methacrylic acid were dissolved in 20 g of THF, and 0.0125 mol of AIBN as a polymerization initiator was added to the resulting solution. The THF solution (reaction solution) thus obtained was first freeze-deaerated three times under a nitrogen atmosphere at a liquid nitrogen temperature. After the THF solution was allowed to react at 60° C. for 30 hours, 2 ml of methanol was added to the reaction solution and 20 g of THF was further added. The reaction solution was added in 250 g of hexane drop by drop with stirring to perform reprecipitation, followed by filtration with a glass filter. Finally, the solid content was vacuum-dried at 60° C. for 3 days to obtain a copolymer having a repeating segment represented by the following chemical formula. A weight-average molecular weight of the resulting polymer was 15000 in terms of polystyrene.

(Polymer (PI-33))

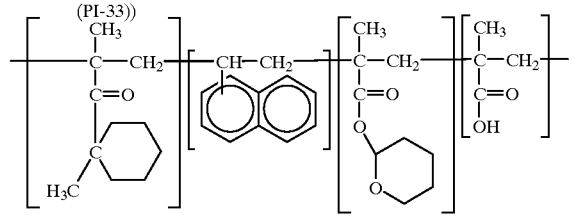

The same procedure as described in the synthesis of the above polymer (PI-32) was repeated except that γ-((1-methyl)cyclohexyl)methacrylate was replaced by γ-((1- methyl)cyclohexyl)acrylate, thereby obtaining a copolymer having a repeating segment represented by the following chemical formula. A weight-average molecular weight of the resulting polymer was 15000 in terms of polystyrene.

(Polymer (PI-34))

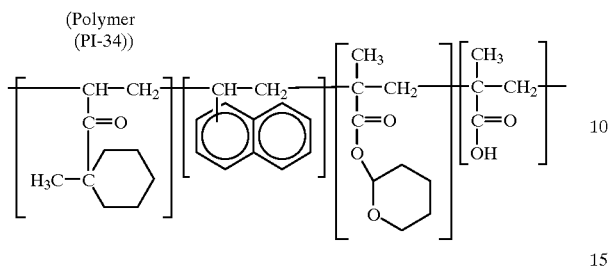

The same procedure as described in the synthesis of the above polymer (PI-32) was repeated except that γ-((1-methyl)cyclohexyl)methacrylate was replaced by the above monomer (I-6), thereby obtaining a copolymer having a repeating segment represented by the following chemical formula. A weight-average molecular weight of the resulting polymer was 15000 in terms of polystyrene.

(Polymer (PI-35))

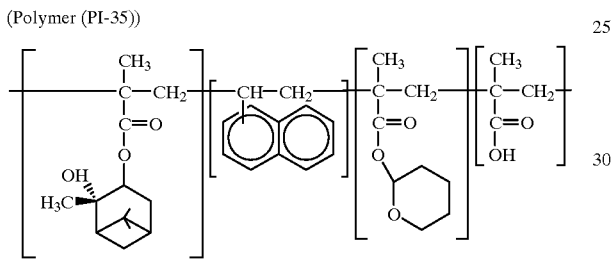

7.9 g of γ-((1-methyl)cyclopentyl)acrylate and 0.82 g of AIBN were dissolved in 30 g of THF. The resulting THF solution was freeze-deaerated three times under a nitrogen atmosphere at a liquid nitrogen temperature. After the THF solution was allowed to react at 60° C. for 30 hours, 2 ml of methanol was added to the reaction solution and 30 g of THF was further added. The reaction solution was added in 500 g of hexane drop by drop with stirring to perform reprecipitation, followed by filtration with a glass filter. Finally, the solid content was vacuum-dried at 60° C. for 3 days to obtain a polymer having a repeating segment represented by the following chemical formula. An yield of the resulting polymer was 10.65 g and a weight-average molecular was 15000 in terms of polystyrene.

(Polymer (PI-36))

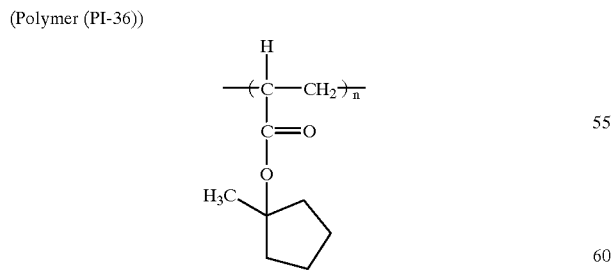

(wherein n is an integer).

3 g of the monomer (I-13) and 0.1 g of AIBN as a polymerization initiator were dissolved in 12 g of THF, and the resulting solution (reaction solution) was degassed and then allowed to react at 60° C. for 5 hours. Then, the reaction solution was slowly added dropwise in 100 ml of hexane and the precipitated polymer was fractionated by filtration to obtain a copolymer represented by the following chemical formula:

(Synthesis of polymer (PI-37))

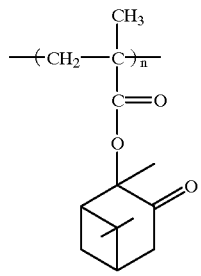

The monomer (I-13) and methacrylic acid were mixed in a predetermined proportion and then dissolved in THF. AIBN as a polymerization initiator was added to the resulting solution, which was allowed to react at 60° C. for 5 hours to obtain a copolymer represented by the following chemical formula:

(Synthesis of polymer (PI-38))

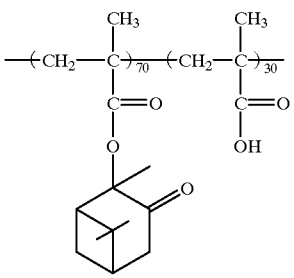

The monomer (I-13), methacrylic acid and menthyl methacrylate were mixed in a predetermined proportion and then dissolved in THF. AIBN as a polymerization initiator was added to the resulting solution, which was allowed to react at 60° C. for 25 hours to obtain a copolymer represented by the following chemical formula:

(Synthesis of polymer (PI-39))

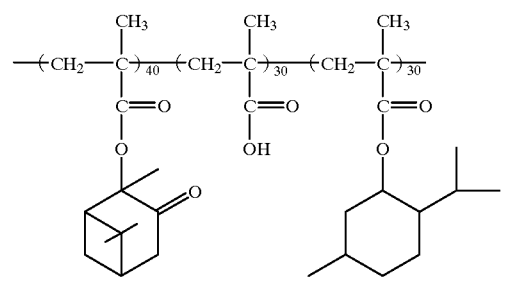

The monomer (I-14) and methacrylic acid were mixed in a predetermined proportion and then dissolved in THF. AIBN as a polymerization initiator was added to the resulting solution, which was allowed to react at 60° C. for 25 hours to obtain a copolymer represented by the following chemical formula:

(Polymer (PI-40))

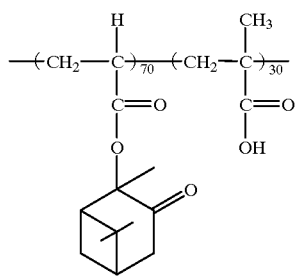

0.060 mol of the monomer (I-15), 0.040 mol of t-butyl methacrylate and 0.0125 mol of AIBN were dissolved in 30 g of THF. The resulting THF solution was freeze-deaerated three times under a nitrogen atmosphere at a liquid nitrogen temperature. After the THF solution was allowed to react at 60° C. for 30 hours, 2 ml of methanol was added to the reaction solution and 30 g of THF was further added. The reaction solution was added in 500 g of hexane drop by drop with stirring to perform reprecipitation, followed by filtration with a glass filter. Finally, the solid content was vacuum-dried at 60° C. for 3 days to obtain a copolymer having a repeating unit represented by the following chemical formula. An yield of the resulting polymer was 7.3 g and a weight-average molecular was 13000 in terms of polystyrene.

(Polymer (PI-41))

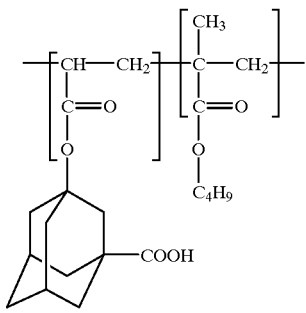

0.064 mol of the monomer (I-16), 0.036 mol of tetrahydropyranyl methacrylate and 0.0125 mol of AIBN were dissolved in 30 g of THF. The resulting THF solution was freeze-deaerated three times under a nitrogen atmosphere at a liquid nitrogen temperature. After the THF solution was allowed to react at 60° C. for 30 hours, 2 ml of methanol was added to the reaction solution and 30 g of THF was further added. The reaction solution was added in 500 g of hexane drop by drop with stirring to perform reprecipitation, followed by filtration with a glass filter. Finally, the solid content was vacuum-dried at 60° C. for 3 days to obtain a copolymer having a repeating unit represented by the following chemical formula. An yield of the resulting polymer was 7.3 g and a weight-average molecular was 13000 in terms of polystyrene.

(Polymer (PI-42))

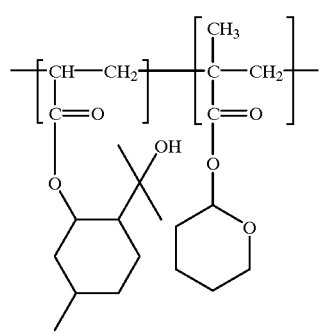

0.055 mol of the monomer (I-17), 0.045 mol of t-butyl methacrylate and 0.0125 mol of AIBN were dissolved in 30 g of THF. The resulting THF solution was freeze-deaerated three times under a nitrogen atmosphere at a liquid nitrogen temperature. After the THF solution was allowed to react at 60° C. for 30 hours, 2 ml of methanol was added to the reaction solution and 30 g of THF was further added. The reaction solution was added in 500 g of hexane drop by drop with stirring to perform reprecipitation, followed by filtration with a glass filter. Finally, the solid content was vacuum-dried at 60° C. for 3 days to obtain a copolymer having a repeating unit represented by the following chemical formula. An yield of the resulting polymer was 7.0 g and a weight-average molecular was 14000 in terms of polystyrene.

(Polymer (PI-43))

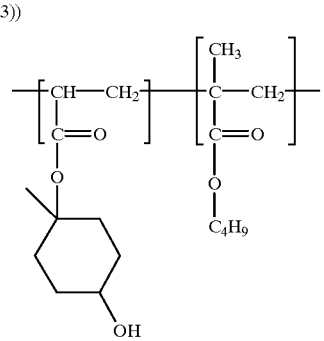

1.0 g of vinylnaphthalene, 2.4 g of lithocholic acid, 1.0 g of methacrylic acid anhydride and 0.6388 g of AIBN were disolved in 30 g of THF. The resulting THF solution was allowed to react at 60° C. for 40 hours. Then, 10 g of THF containing 1 g of water was added to the THF solution, and further allowed to react for 8 hours. After insoluble material was separated by filteration, reaction solution was added in water drop by drop with stirring to perform precipitation. Resultant precipitate was vacuum-dried to obtain a copolymer represented by the following chemical formula. A weight-average molecular was 50000 in terms of polystyrene.

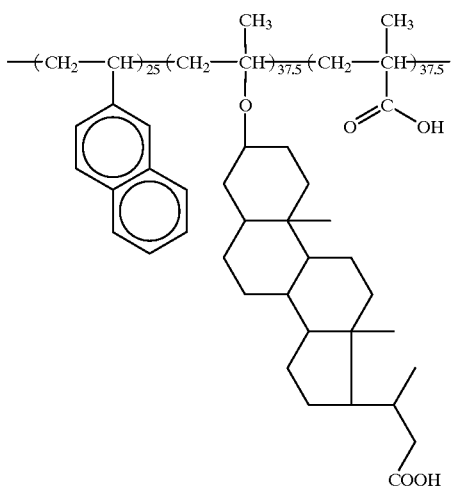

This copolymer was dissolved in THF, and resultant THF solution was allowed to react with dihydro-2H-pyran in the presence hydrochloric acid catalyst to obtain a copolymer in which 35% of carboxylic group are pyranylated.
(Comparative Polymer (CI-1))

The same procedure as described in the synthesis of the above polymer (PI-3) was repeated except that γ-((1-methyl)cyclopentyl)methacrylate was replaced by 10.1 g of cyclohexyl methacrylate, thereby obtaining a copolymer. An yield was 10.85 g, and an weight-average molecular weight was 15000 in terms of polystyrene. The resulting polymer is the same as described in the above polymer (PI-4) except that it is not a tertiary alcohol ester.
(Comparative Polymer (CI-2))

Isobornyl methacrylate, t-Bu methacrylate and methacrylic acid were mixed in a predetermined proportion and then dissolved in THF. AIBN as a polymerization initiator was added to the resulting solution, which was allowed to react at 60° C. for 30 hours to obtain a copolymer represented by the following chemical formula:

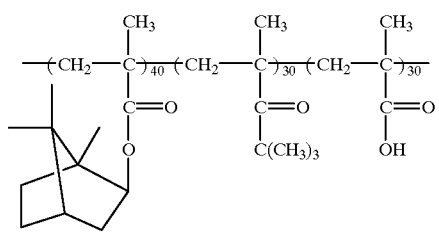

Among the polymers obtained as described above, the following photo-acid generator was blended in the polymers (PI-1) to (PI-11) and Comparative polymer (CI-1) and a light exposure test was performed.
Abbreviations of photo-acid generators used herein are summarized below.
 TSP·OTf: triphenylsulfonium trifluoromethanesulfonic acid
 DPI·OTf: diphenyliodonium trifluoromethanesulfonic acid
 DNI·OTf: dinaphthyliodonium trifluoromethanesulfonic acid
 S-TFDT·OTf: S-(trifluoromethyl)dibenzothiophenium trifluoromethanesulfonic acid
 Se-TFDT·OTf: Se-(trifluoromethyl)dibenzothiophenium trifluoromethanesulfonic acid
 I-DBT·OTf: I-dibenzothiophenium trifluoromethanesulfonic acid

EXAMPLE I-1

The following six kinds of photo-acid generators (0.05 g each) were added to 1.0 g of the polymer (PI-1), respectively, and the mixtures were dissolved in 4.2 g of cyclohexanone to obtain photosensitive solutions.

Each of the resulting solutions was spin-coated on the surface of a silicon wafer at 3000 rpm over 30 seconds by making using of spin coating method. Then, baking before light exposure was performed on a hot plate at 110° C. for 100 seconds to form a resist film having a film thickness of 0.5 μm. Subsequently, a predetermined area of this resist film was irradiated by means of ArF excimer laser (wavelength: 193 nm), thereby performing patterning of line and space. The resist film thus light-exposed was subjected to post exposure bake (PEB) at 100° C. for 180 seconds. Subsequently, the baked resist film was developed in an aqueous solution of 0.14N tetramethylammonium hydroxide at 25° C. for 60 seconds, thereby selectively dissolving and removing of the light exposure portion of the resist film to form a positive pattern.

A sensitivity of ArF excimer laser and a resolution of the resulting pattern are summarized in the following Table 1, together with photo-acid generators blended.

TABLE 1

| Photo-acid generator | Sensitivity (mJ/cm$^2$) | Resolution (line & space μm) |
| --- | --- | --- |
| TPS.OTf | 32 | 0.25 |
| DPI.OTf | 26 | 0.25 |
| DNI.OTf | 26 | 0.35 |
| S-TFDT.OTf | 46 | 0.35 |
| Se-TFDT.OTf | 72 | 0.25 |
| I-DBT.OTf | 32 | 0.30 |

As seen from the results of Table 1, the photosensitive composition of this invention is capable of forming a line and space having a line width of 0.35 μm regardless of the kind of the photo-acid generator. Particularly, when DPI·OTf is blended as the photo-acid generator, a fine pattern having a line width of 0.25 μm can be formed at a dosage of 26 mJ/cm$^2$.

EXAMPLE I-2

The following six kinds of photo-acid generators (0.05 g each) were added to 1.0 g of the polymer (PI-2), respectively, and the mixtures were dissolved in 4.2 g of cyclohexanone to obtain photosensitive solutions.

Using each of the resulting solutions, the same procedure as described in Example (I-1) was repeated, thereby forming a pattern. As a result, the light exposure portion of the resist film was dissolved and removed to form a positive pattern. A sensitivity of ArF excimer laser and a resolution of the resulting pattern are summarized in the following Table 2, together with photo-acid generators blended.

TABLE 2

| Photo-acid generator | Sensitivity (mJ/cm$^2$) | Resolution (line & space $\mu$m) |
| --- | --- | --- |
| TPS.OTf | 28 | 0.25 |
| DPI.OTf | 24 | 0.25 |
| DNI.OTf | 23 | 0.35 |
| S-TFDT.OTf | 38 | 0.35 |
| Se-TFDT.OTf | 60 | 0.25 |
| I-DBT.OTf | 31 | 0.30 |

As seen from the results of Table 2, the photosensitive composition of this invention is capable of forming a line and space having a line width of 0.35 $\mu$m regardless of the kind of the photo-acid generator. Particularly, when DPI·OTf is blended as the photo-acid generator, a fine pattern having a line width of 0.25 $\mu$m can be formed at a dosage of 24 mJ/cm$^2$.

EXAMPLE I-3

The following six kinds of photo-acid generators (0.015 g each) were added to 1.0 g of the polymer (PI-3), respectively, and the mixtures were dissolved in 4.2 g of cyclohexanone to obtain photosensitive solutions.

Using each of the resulting solutions, the same procedure as described in the above Example (I-1) was repeated except that a developer was replaced by an aqueous solution of 0.028N tetramethylammonium hydroxide, thereby forming a pattern. As a result, the light exposure portion of the resist film was dissolved and removed to form a positive pattern. A sensitivity of ArF excimer laser and a resolution of the resulting pattern are summarized in the following Table 3, together with photo-acid generators blended.

TABLE 3

| Photo-acid generator | Sensitivity (mJ/cm$^2$) | Resolution (line & space $\mu$m) |
| --- | --- | --- |
| TPS.OTf | 26 | 0.35 |
| DPI.OTf | 24 | 0.35 |
| DNI.OTf | 23 | 0.35 |
| S-TFDT.OTf | 36 | 0.40 |
| Se-TFDT.OTf | 58 | 0.30 |
| I-DBT.OTf | 30 | 0.40 |

As seen from the results of Table 3, the photosensitive composition of this invention is capable of forming a line and space having a line width of 0.40 $\mu$m regardless of the kind of the photo-acid generator. Particularly, when DNI·OTf is blended as the photo-acid generator, a fine pattern having a line width of 0.35 $\mu$m can be formed at a dosage of 23 mJ/cm$^2$.

EXAMPLE I-4

The following six kinds of photo-acid generators (0.015 g each) were added to 1.0 g of the polymer (PI-4), respectively, and the mixtures were dissolved in 4.2 g of cyclohexanone to obtain photosensitive solutions.

Using each of the resulting solutions, the same procedure as described in the above Example (I-3) was repeated, thereby forming a pattern. As a result, the light exposure portion of the resist film was dissolved and removed to form a positive pattern. A sensitivity of ArF excimer laser and a resolution of the resulting pattern are summarized in the following Table 4, together with photo-acid generators blended.

TABLE 4

| Photo-acid generator | Sensitivity (mJ/cm$^2$) | Resolution (line & space $\mu$m) |
| --- | --- | --- |
| TPS.OTf | 30 | 0.25 |
| DPI.OTf | 26 | 0.25 |
| DNI.OTf | 26 | 0.35 |
| S-TFDT.OTf | 42 | 0.35 |
| Se-TFDT.OTf | 70 | 0.25 |
| I-DBT.OTf | 32 | 0.30 |

As seen from the results of Table 4, the photosensitive composition of this invention is capable of forming a line and space having a line width of 0.35 $\mu$m regardless of the kind of the photo-acid generator. Particularly, when DPI·OTf is blended as the photo-acid generator, a fine pattern having a line width of 0.25 $\mu$m can be formed at a dosage of 26 mJ/cm$^2$.

EXAMPLE I-5

0.015 g of TPS·OTf as the photo-acid generator was added to 1.0 g of the polymers (PI-5) to (PI-11), respectively, and the mixtures were dissolved in 4.2 g of cyclohexanone to obtain photosensitive solutions.

Using each of the resulting solutions, the same procedure as described in the above Example (I-3) was repeated, thereby forming a pattern. As a result, the light exposure portion of the resist film was dissolved and removed to form a positive pattern. A sensitivity of ArF excimer laser and a resolution of the resulting pattern are summarized in the following Table 5, together with resins used.

TABLE 5

| Resin | Sensitivity (mJ/cm$^2$) | Resolution (line & space $\mu$m) |
| --- | --- | --- |
| PI-5 | 30 | 0.25 |
| PI-6 | 26 | 0.25 |
| PI-7 | 24 | 0.30 |
| PI-8 | 30 | 0.25 |
| PI-9 | 24 | 0.225 |
| PI-10 | 22 | 0.20 |
| PI-11 | 24 | 0.30 |

As seen from the results of Table 5, the photosensitive composition of this invention is capable of forming a line and space having a line width of 0.30 $\mu$m. Particularly, when the polymer (PI-10) is used, a fine pattern having a line width of 0.20 $\mu$m can be formed at a dosage of 22 mJ/cm$^2$.

EXAMPLE I-6

0.015 g of TPS·OTf as the photo-acid generator and 0.2 g of a compound represented by the following general formula as a solubility inhibitor were added to 0.8 g of the polymers (PI-5) to (PI-11), respectively, and the mixtures were dissolved in 4.2 g of ethyl lactate to obtain photosensitive solutions.

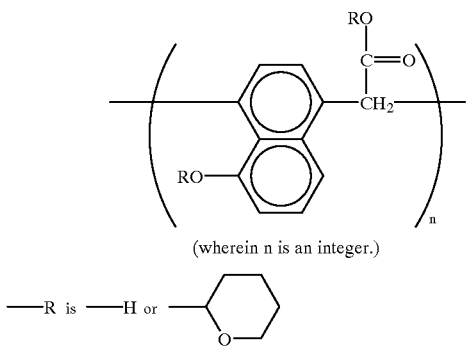

(wherein n is an integer.)

—R is —H or —⟨cyclic structure with O⟩

Using each of the resulting solutions, the same procedure as described in the above Example (I-3) was repeated, thereby forming a pattern. As a result, the light exposure portion of the resist film was dissolved and removed to form a positive pattern. A sensitivity of ArF excimer laser and a resolution of the resulting pattern are summarized in the following Table 6, together with resins used.

TABLE 6

| Resin | Sensitivity (mJ/cm$^2$) | Resolution (line & space μm) |
|---|---|---|
| PI-5 | 34 | 0.25 |
| PI-6 | 28 | 0.225 |
| PI-7 | 26 | 0.30 |
| PI-8 | 32 | 0.25 |
| PI-9 | 26 | 0.20 |
| PI-10 | 24 | 0.20 |
| PI-11 | 25 | 0.30 |

As seen from the results of Table 6, the photosensitive composition of this invention is capable of forming a line and space having a line width of 0.30 μm. Particularly, when the polymer (PI-10) is used, a fine pattern having a line width of 0.20 μm can be formed at a dosage of 24 mJ/cm$^2$.

EXAMPLE I-7

0.015 g of TPS·OTf as the photo-acid generator was added to 1.0 g of the polymers (PI-12) to (PI-34), respectively, and the mixtures were dissolved in 4.2 g of propylene glycol monomethyl ether acetate to obtain photosensitive solutions.

Using each of the resulting solutions, the same procedure as described in the above Example (I-3) was repeated, thereby forming a pattern. As a result, the light exposure portion of the resist film was dissolved and removed to form a positive pattern. A sensitivity of ArF excimer laser and a resolution of the resulting pattern are summarized in the following Table 7, together with resins used.

TABLE 7

| Resin | Sensitivity (mJ/cm$^2$) | Resolution (line & space μm) |
|---|---|---|
| PI-12 | 20 | 0.20 |
| PI-13 | 22 | 0.20 |
| PI-14 | 18 | 0.20 |
| PI-15 | 14 | 0.18 |
| PI-16 | 20 | 0.20 |
| PI-17 | 20 | 0.19 |
| PI-18 | 16 | 0.22 |

TABLE 7-continued

| Resin | Sensitivity (mJ/cm$^2$) | Resolution (line & space μm) |
|---|---|---|
| PI-19 | 15 | 0.20 |
| PI-20 | 19 | 0.20 |
| PI-21 | 15 | 0.20 |
| PI-22 | 19 | 0.20 |
| PI-23 | 24 | 0.19 |
| PI-24 | 22 | 0.19 |
| PI-25 | 25 | 0.20 |
| PI-26 | 28 | 0.18 |
| PI-27 | 25 | 0.19 |
| PI-28 | 20 | 0.20 |
| PI-29 | 19 | 0.22 |
| PI-30 | 23 | 0.20 |
| PI-31 | 23 | 0.19 |
| PI-32 | 18 | 0.22 |
| PI-33 | 17 | 0.21 |
| PI-34 | 19 | 0.22 |

As seen from the results of Table 7, the photosensitive composition of this invention is capable of forming a line and space having a line width of 0.22 μm. Particularly, when the polymer (PI-15) is used, a fine pattern having a line width of 0.18 μm can be formed at a dosage of 14 mJ/cm$^2$.

EXAMPLE I-8

0.015 g of TPS·OTf as the photo-acid generator was added to 1.5 g of the polymers (PI-40) to (PI-42), respectively, and the mixtures were dissolved in propylene glycol monomethyl ether acetate. Resultant solution was diluted to obtain 10 g of photosensitive solution.

Each of the resulting solutions was spin-coated on the surface of a 8-inch silicon wafer at 3000 rpm. Then, backing before light exposure was performed at 120° C. for 90 seconds to form a resist film. Subsequently, a predetermined area of this resist film was irradiated by means of ArF exposure apparatus (NA=0.55), thereby forming a pattern of line and space.

The resist film comprising polymer (PI-14) was subjected post exposure bake at 110° C. for 90 seconds. The treatment of post exposure bake for other resist films was performed at 140° C. for 60 seconds.

Subsequently, the baked resist films were developed in an aqueous solution of tetramethylammonium hydroxide, thereby selectively dissolving and removing the light exposure portion of the resist film to form a positive pattern.

A sensitivity of ArF excimer laser and a resolution of the resulting pattern are summarized in the following Table 8, together with resins.

TABLE 8

| Resin | Sensitivity (mJ/cm$^2$) | Resolution (line & space μm) |
|---|---|---|
| PI-40 | 14 | 0.20 |
| PI-41 | 11 | 0.18 |
| PI-42 | 13 | 0.20 |

As seen from the results of Table 8, the photosensitive composition of this invention is capable of forming a line and space having a line width of 0.20 μm or less. Particularly, when the polymer (PI-41) is used, a fine pattern having a line width of 0.18 μm can be formed at a dosage of 11 mJ/cm$^2$.

Comparative Example I-1

0.015 g of triphenylsulfonium trifluoromethanesulfonic acid as the photo-acid generator was added to 0.1 g of the comparative polymer (CI-1) and the mixture was dissolved in 4.2 g of cyclohexanone to obtain a solution of a photosensitive composition of Comparative Example. The solution thus prepared is the same as that used in the above Example (I-4) except that the resin is not a tertiary alcohol ester.

Using the resulting solution, the same procedure as described in the above Example (I-3) was repeated, thereby making a trial of forming a pattern. As a result, resolution could not be performed.

Furthermore, the same sample was spin-coated on the surface of a silicon wafer at 3000 rpm over 30 seconds using spin coating method. Then, the coated layer was subjected to a heat treatment on a hot plate at 120° C. for 90 seconds to form a resist film. After this resist film was irradiated by means of a mercury lamp to generate an acid from the photo-acid generator, the resist film was whittled by using a razor. This sample was heated at a increasing temperature rate of 5° C./min. by thermogravimetry (TG). As a result, the weight decreased from about 180° C. It was confirmed by this test that, since an ester of an alcohol other than the tertiary alcohol is not easily decomposed by an action of the acid, the ester does not act as a solubility-inhibiting group.

(Evaluation of dry etch resistance)

A copolymer was obtained by copolymerizing t-butyl with methacrylic acid in a molar ratio of 1:1. Using this copolymer as a reference, a photosensitive composition was prepared and then a comparison of the dry etch resistance between the resulting photosensitive composition and the photosensitive composition of this invention was made. Using the above polymers (PI-1) to (PI-11), the same procedure as described above was repeated, thereby forming a resist film on a silicon wafer. The resulting resist film was subjected to a reactive ion etching (RIE) by means of $CF_4$ under the conditions (30 sccm, 0.01 torr, 150 W/20W). The resulting etching rate is summarized in the following Table 9.

TABLE 9

| Resin | Etching rate (nm/min.) |
|---|---|
| Reference | 147 |
| PI-1 | 88 |
| PI-2 | 84 |
| PI-3 | 93 |
| PI-4 | 94 |
| PI-5 | 99 |
| PI-6 | 106 |
| PI-7 | 58 |
| PI-8 | 56 |
| PI-9 | 52 |
| PI-10 | 54 |

As seen from Table 9, the photosensitive composition wherein a polymer containing no alicyclic compound is blended, as the reference, is poor in dry etch resistance. To the contrary, all photosensitive compositions of this invention have high dry etch resistance because a polymer containing an alicyclic compound is blended.

EXAMPLE I-9

Predetermined components were blended in the polymers (PI-36) to (PI-39) and comparative polymer (CI-2) according to the formulation shown in the following Table 10 and then the blend was dissolved in methyl methoxypropionate to prepare a solution of a photosensitive composition.

TABLE 10

| Polymer (wt. %) | Photo-acid generator (wt. %) | Solubility inhibitor (wt. %) |
|---|---|---|
| PI-36 (98) | TPS-OTf (2) | — |
| PI-37 (98) | TPS-OTf (2) | — |
| PI-38 (98) | TPS-OTf (2) | — |
| PI-39 (98) | TPS-OTf (2) | — |
| PI-38 (88) | TPS-OTf (2) | t-BuCo (10) |
| CI-2 (98) | TPS-OTf (2) | — |

The photo-acid generators and solubility inhibitors shown in the above Table 10 are shown below, together with their abbreviations.

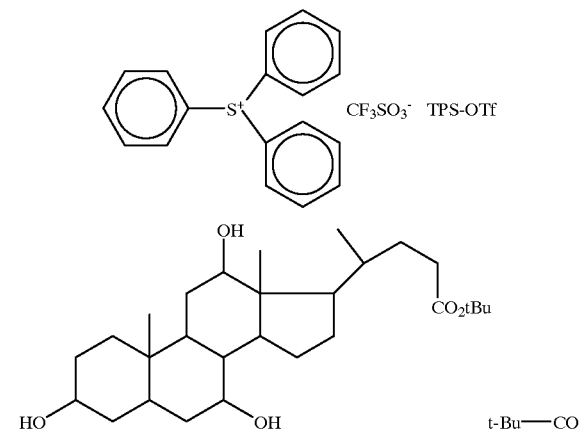

Then, each of these photosensitive compositions was spin-coated on the surface of a silicon wafer to form a resist film having a film thickness of 0.5 μm. A predetermined area of the resulting resist film was exposed to light by using a stepper (NA: 0.54) with ArF excimer laser in wavelength of 193 nm as a light source, thereby performing a pattern exposure. Subsequently, the exposed resist film was subjected to a baking treatment under the conditions shown in the following Table 11. The baked resist film was subjected to a developing treatment by using an aqueous solution of tetrahydroammonium hydroxide (TMAH). Consequently, the light-exposed portion of the resist film was selectively dissolved and removed to form a positive pattern. A sensitivity and a resolution of the resist are shown in the following Table 11.

TABLE 11

| Polymer | PEB conditions | Sensitivity (mJ/cm²) | Resolution (μm) |
|---|---|---|---|
| PI-36 | 120° C., 3 min. | 50 | 0.20 |
| PI-37 | 120° C., 2 min. | 25 | 0.18 |
| PI-38 | 120° C., 2 min. | 25 | 0.17 |
| PI-39 | 120° C., 2 min. | 30 | 0.16 |
| PI-38 | 120° C., 2 min. | 22 | 0.16 |
| CI-2 | 140° C., 2 min. | 50 | 0.20 |

As seen from Table 11, in the resists containing the polymers (PI-36) to (PI-39), phenomena such as frilling and swelling due to poor adhesion and heterogeneous dissolution were not found at the occasion of development with high sensitivity and, therefore, a resist pattern having good resolution could be formed. On the other hand, in the resist containing the comparative polymer (CI-2), the frilling was caused by poor adhesion of the resist film and the substrate and, therefore, a fine pattern could not be formed. The homogeneity of dissolution of the resist film is inferior, and the frilling and crack arose at a part of the resist film.

Furthermore, with respect to these resists, an etching rate by $CF_4$ plasma was measured. As a result, assuming that the etching rate of a resist containing a novolak resin as a base polymer is 1.0, the etching rate of a resist containing the comparative polymer (CI-2) is 1.3 whereas the etching rate of each of resists containing the polymers (PI-36) to (PI-39) was 1.1 to 1.3. It was confirmed by these results that all photosensitive compositions of this invention have high etch resistance.

EXAMPLE II

In this Example, a photosensitive composition was prepared by using a polymer represented by the general formula (6) and its characteristics were examined. (Synthesis of high molecular compound)

An equimolar amount of 3,4-dihydro-2H-pyran and 4-pentenoic acid were dissolved in tetrahydrofuran (THF) and the solution was allowed to react in the presence of a trace amount of a basic catalyst, thereby synthesizing tetrahydropyranyl 4-pentenoate (THP-PA). THP-PA, isobornyl acrylate and 4-pentenoic acid were dissolved in THF in a molar ratio of 40:30:30 and 2 parts by weight of AIBN as a polymerization initiator was added. The mixed solution was heated at 70° C. for 30 hours to obtain a high molecular copolymer (IH-IT).

The same procedure as described above was repeated except that 4-pentenoic acid was replaced by 6-heptenoic acid, thereby synthesizing tetrahydropyranyl 6-hetenoate (THP-HA). THP-HA, isobornyl acrylate and 6-heptenoic acid were dissolved in THF in a molar ratio of 40:30:30 and 2 parts by weight of AIBN as a polymerization initiator was added. The mixed solution was heated at 70° C. for 30 hours to obtain a high molecular copolymer (IP-PT).

A high molecular copolymer was obtained by introducing a t-Bu group or an ethoxyethyl group as a solubility inhibitor and using a compound containing norbornyl, adamantyl or menthyl as an alicyclic compound.

Chemical formulas of the high molecular copolymers thus obtained as described above are shown below, together with an average molecular weight thereof.

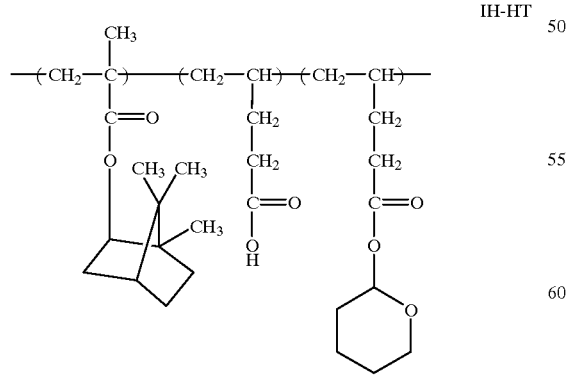

IH-HT (average molecular weight: 1000)

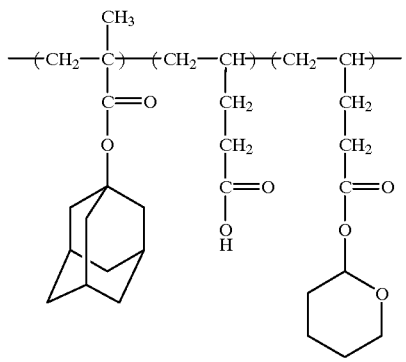

AH-HT (average molecular weight: 7000)

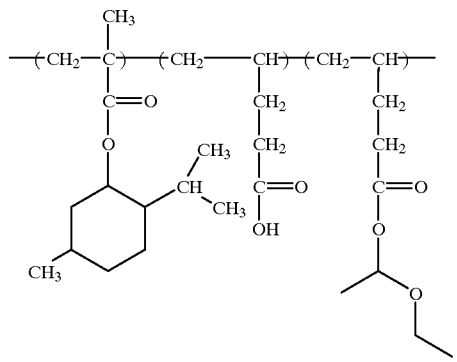

MH-HE (average molecular weight: 7000)

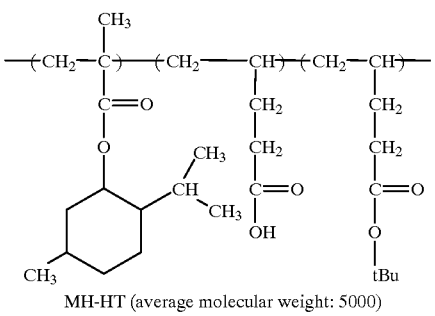

MH-HT (average molecular weight: 5000)

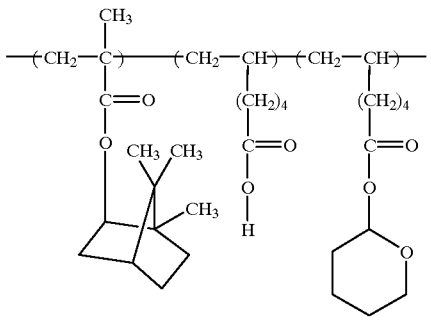

IP-PT (average molecular weight: 4000)

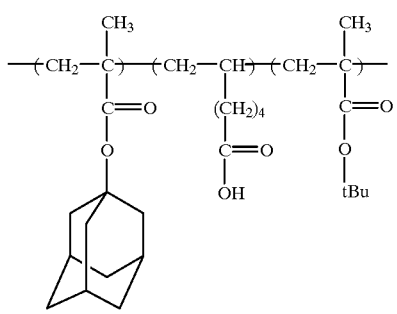

AP-PB (average molecular weight: 6000)

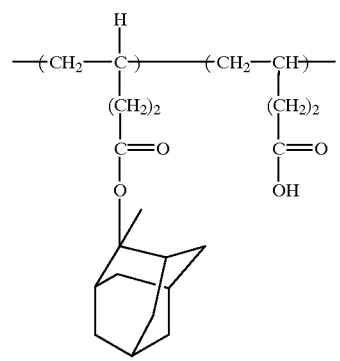

MA-PA (average molecular weight: 80000)

Furthermore, a copolymer represented by the general formula (6) wherein $R^{55}$ and $R^{56}$ are individually an organic group having 1 carbon atom, and a high copolymer wherein $R^{57}$ is an alicyclic organic group were synthesized as follows.

(Synthesis of Copolymer Represented by the General Formula (6) Wherein $R^{55}$ and $R^{56}$ are Individually an Organic Group Having 1 Carbon Atom)

The same procedure was repeated except that 4-pentenoic acid was replaced by vinyl acetate, thereby synthesizing tetrahydropyranyl vinyl acetate (THP-VA). THP-VA, isobornyl acrylate and vinyl acetate were dissolved in THF in a molar ratio of 40:30:30 and 2 parts by weight of AIBN as a polymerization initiator was added. The mixed solution was heated at 70° C. for 30 hours to obtain a high molecular copolymer (IP-VT) represented by the following chemical formula:

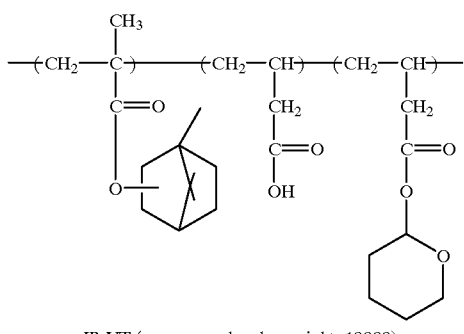

IP-VT (average molecular weight: 10000)

(Synthesis of High Molecular Copolymer Wherein $R^{57}$ is an Alicycic Organic Group)

4-pentanoic acid was allowed to react with thionyl chloride to synthesize chloride 4-pentanoate, which was allowed to react with 2-methyl-2-adamantanol in the presence of triethylamine to obtain (2-methyl-2-adamantyl)4-pentanoate (MAD-PA). 4-pentenoic acid and MAD-PA were dissolved in THF in a molar ratio of 30:70 and 2 parts by weight of AIBN as a polymerization initiator was added. The mixed solution was heated at 70° C. for 30 hours to obtain a high molecular copolymer (MA-PA) represented by the following chemical formula:

(Synthesis of Comparative Polymer)

The same procedure as described above was repeated to synthesize copolymers containing methacrylic acid as an acidic group and t-Bu methacrylate as a solubility-inhibiting group. Chemical formulas of the resulting copolymers are shown below.

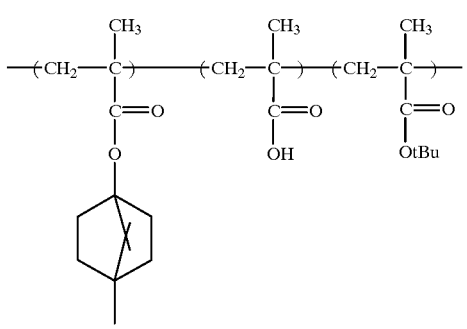

IM-MB (average molecular weight: 7000)

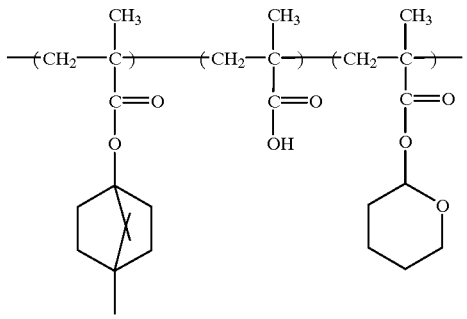

IM-MT (average molecular weight: 6000)

(Preparation of Resist and Formation of Resist Pattern)

The copolymers synthesized as described above, a solubility inhibitor and a photo-acid generator were dissolved in cyclohexanone according to the formulation shown in the following Table 12 to prepare varnishes of photosensitive compositions of Examples (II-1) to (II-12). As the photo-acid generator, NAT-105 or NDS-105 (manufactured by Midori Kagaku Co.) was used. On the other hand, NAT-105 as the photo-acid generator was blended with the comparative polymers (IM-MB, IM-MT) to prepare varnishes of photosensitive compositions of Comparative Examples (II-1) and (II-2).

TABLE 12

| | Polymer (wt. %) | Solubility inhibitor (wt. %) | Acid generator (wt. %) |
|---|---|---|---|
| Example | | | |
| II-1 | IH-HT(98) | — | NAT-105(2) |
| II-2 | AH-HT(98) | — | NAT-105(2) |
| II-3 | MH-HE(98) | — | NAT-105(2) |
| II-4 | MH-HT(98) | — | NAT-105(2) |
| II-5 | IP-PT(98) | — | NDS-105(2) |
| II-6 | AP-PB(98) | — | NDS-105(2) |
| II-7 | IH-HT(88) | tBoc BN(10) | NAT-105(2) |
| II-8 | MH-HE(88) | tBoc NN(10) | NDS-105(2) |
| II-9 | MH-HE(88) | tBu CO(10) | NDS-105(2) |
| II-10 | IH-HT(88) | tBu CO(10) | NDS-105(2) |
| II-11 | IP-VT(98) | — | NDS-105(2) |
| II-12 | MA-PA(98) | — | NDS-105(2) |
| Comparative Example | | | |
| II-1 | IM-MB(98) | — | NAT-105(2) |
| II-2 | IM-MT(98) | — | NAT-105(2) |

In Table 12, tBocBN, tBocNN and tBuCN are compounds represented by the following chemical formulas.

tBocBN:

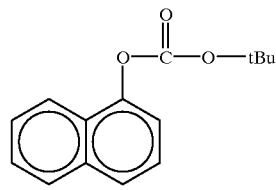

tBocNN:

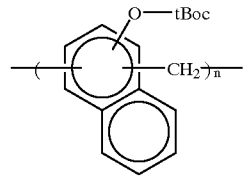

tBuCN:

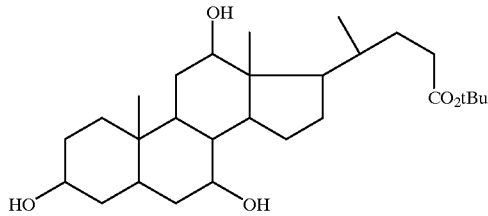

Then, each of these photosensitive compositions was spin-coated on the surface of a silicon wafer to form a resist film having a film thickness of 0.6 μm. A predetermined area of the resulting resist film was exposed to light by using a stepper (NA: 0.54) with ArF excimer laser in wavelength of 193 nm as a light source, thereby performing a pattern exposure. Subsequently, the exposed resist film was subjected to a baking treatment at 100° C. for 2 minutes and the baked resist film was subjected to a developing treatment by using a predetermined developer. As the developer, an aqueous solution of tetrahydroammonium hydroxide (TMAH) or a mixed solution of TMAH and isopropyl alcohol was used. As a result, the light exposure portion of the resist film was selectively dissolved and removed to form a positive pattern. The presence or absence of frilling of the resulting resist pattern from the substrate, and the uniformity of dissolution were examined. The results are shown in the following Table 13, together with a sensitivity.

TABLE 13

| | Sensitivity (mJ/cm$^2$) | Frilling at the occasion of development | Resolution (μm) |
|---|---|---|---|
| Example | | | |
| II-1 | 150 | ◯ | 0.20 |
| II-2 | 135 | ◯ | 0.20 |
| II-3 | 135 | ◯ | 0.20 |
| II-4 | 150 | ◯ | 0.20 |
| II-5 | 150 | ◯ | 0.20 |
| II-6 | 210 | Δ | 0.18 |
| II-7 | 120 | ◯ | 0.18 |
| II-8 | 90 | ⊚ | 0.20 |
| II-9 | 85 | ⊚ | 0.20 |
| II-10 | 90 | | 0.19 |
| II-11 | 200 | Δ | 0.20 |
| II-12 | 250 | Δ | 0.20 |
| Comparative Example | | | |
| I-1 | 150 | X | Frilling of fine pattern is recognized |
| I-2 | 200 | X | Frilling of fine pattern is recognized |

As seen from Table 13, in the resists of this invention (Examples II-1 to II-12), poor adhesion as well as frilling and swelling due to heterogeneous dissolution were not found at the occasion of development with high sensitivity and, therefore, a resist pattern having good resolution could be formed. Specifically, in Examples (II-8) and (II-9), the appearance of the resulting pattern was good and no problem was recognized. In Examples (II-1) to (II-5), (II-7) and (II-10), the frilling was recognized at a part of the ultrafine pattern. In Examples (II-6), (II-11) and (II-12), slight crack was recognized.

On the other hand, in the resists of Comparative Examples (II-1) and (II-2), the frilling of the pattern was caused by poor adhesion of the resist and, therefore, a fine pattern could not be formed. Since the uniformity of dissolution of the resist film is inferior, the frilling and crack arose at a part of the resist film.

As seen from the above description, the second photosensitive composition has transparency to short-wavelength light and high dry etch resistance. Accordingly, by using such a photosensitive composition, the frilling at the occasion of development by an alkaline solution and heterogeneous dissolution are inhibited and, therefore, a good resist pattern can be formed.

EXAMPLE III

In this Example, a photosensitive composition was prepared by using a polymer having a repeating segment represented by any one of the general formulas (7) to (9) and its characteristics were examined.

First, polymers (PP-1) to (PP-12) used in this Example were synthesized, respectively, as follows.

Synthesis Example III-1

First, α-chloroacrylic acid was allowed to react with isoborneol in the presence of a hydrochloric acid catalyst to obtain an ester. This ester, tetrahydropyranyl methacrylate and methacrylic acid were mixed in a predetermined proportion and then dissolved in THP to prepare a THF solution. AIBN as a polymerization initiator was added to the resulting THP solution, and the mixed solution was allowed to react at 60° C. for 3 hours to obtain a high molecular copolymer represented by the following chemical formula (PP-1):

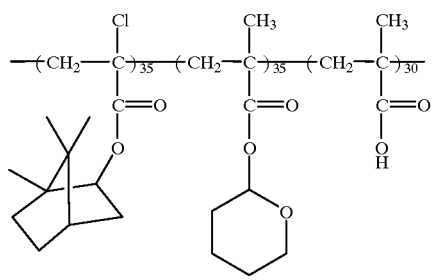

(PP-1)

(Synthesis Example III-2)

First, α-chloroacrylic acid was allowed to react with dihydropyran in the presence of a hydrochloric acid catalyst to obtain an acetal. This acetal, menthyl methacrylate and methacrylic acid were mixed in a predetermined proportion and then dissolved in THP to prepare a THF solution. AIBN as a polymerization initiator was added to the resulting THP solution, and the mixed solution was allowed to react at 60° C. for 30 hours to obtain a high molecular copolymer represented by the following chemical formula (PP-2):

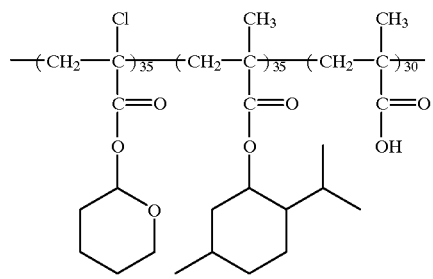

(PP-2)

(Synthesis Example III-3)

First, monochloromaleic anhydride was dissolved in THF and an equimolar amount of menthol was added, and the solution was refluxed for 3 hours. The product was separated and purified by a silica gel column to obtain monomenthylchloromaleate.

This monomenthylchloromaleate was blended with tetrahydropyranyl methacrylate in a predetermined proportion, and the blend was polymerized by using AIBN as a polymerization initiator to obtain a high molecular copolymer represented by the following chemical formula (PP-3).

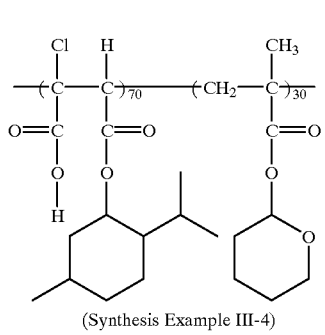

(PP-3)

(Synthesis Example III-4)

Monochloromaleic anhydride, adamantyl methacrylate and t-Bu methacrylate were blended in a predetermined proportion, and the blend was polymerized in the presence of AIBN to obtain a high molecular copolymer represented by the following chemical formula (PP-4).

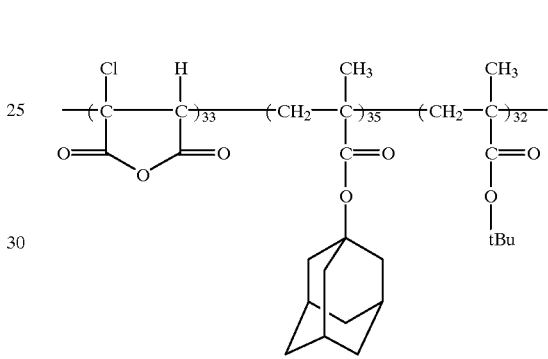

(PP-4)

(Synthesis Example III-5)

First, dichloromaleic anhydride was dissolved in THF and an equimolar amount of menthol was added, and the solution was refluxed for 3 hours. The product was separated and purified by a silica gel column to obtain monomenthyldichloromaleate.

This monomenthyldichloromaleate to was blended with tetrahydropyranyl methacrylate in a predetermined proportion, and the blend was polymerized by using AIBN as a polymerization initiator to obtain a high molecular copolymer represented by the following chemical formula (PP-5).

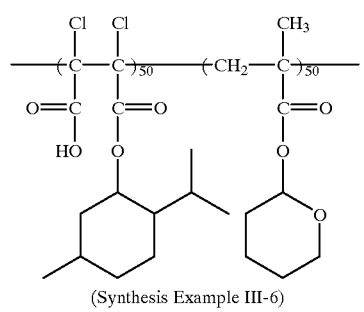

(PP-5)

(Synthesis Example III-6)

First, dihydropyran was allowed to react with dichloromaleic acid in THF to obtain monotetrahydropyranyl dichloromaleate.

This monotetrahydropyranyl dichloromaleate was blended with isobornyl methacrylate in a predetermined proportion, and the blend was polymerized in the presence of AIBN to obtain a high molecular copolymer represented by the following chemical formula (PP-6).

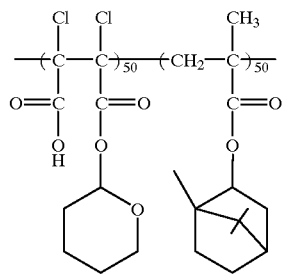
(PP-6)

Dichloromaleic anhydride, isobornyl methacrylate and tetrahydropyranyl methacrylate were blended in a predetermined proportion, and the blend was polymerized in the presence of AIBN to obtain a high molecular copolymer represented by the following chemical formula (PP-7).

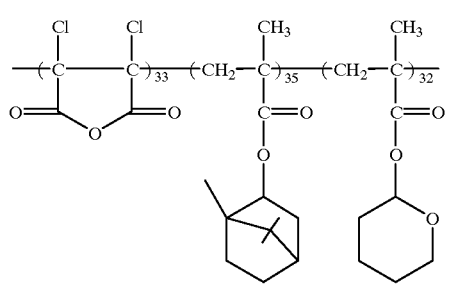
(PP-7)

(Synthesis Example III-8)

First, dichloromaleic anhyride was copolymerized with tetrahydropyranyl methacrylate in a proportion of 1:1 to obtain a copolymer, thereby preparing a THF solution. To this THF solution, menthol was added in a proportion of 80 mole % based on dichloromaleic anhydride, followed by stirring for 24 hours to obtain a high molecular copolymer represented by the following chemical formula (PP-8).

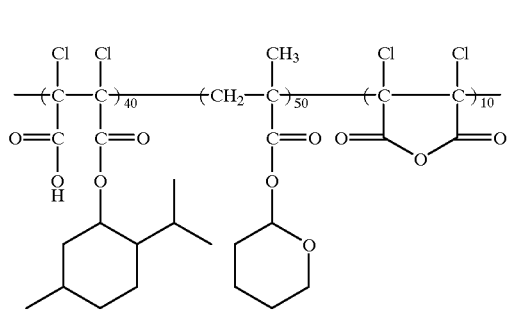
(PP-8)

(Comparative Example III-1)

Tetrahydropyranyl methacrylate, menthyl methacrylate and methacrylic acid were blended in a predetermined proportion, and the blend was polymerized in the presence of AIBN to obtain a high molecular copolymer represented by the following chemical formula (PP-11).

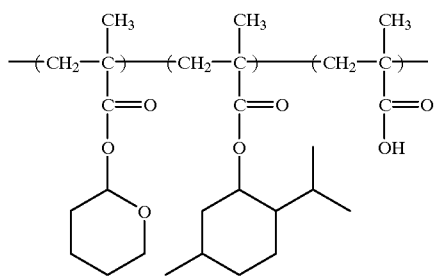
(PP-11)

(Comparative Example III-2)

Maleic anhydride, isobornyl methacrylate and tetrahydropyranyl methacrylate were blended in a predetermined proportion, and the blend was polymerized in the presence of AIBN to obtain a high molecular copolymer represented by the following chemical formula (PP-12).

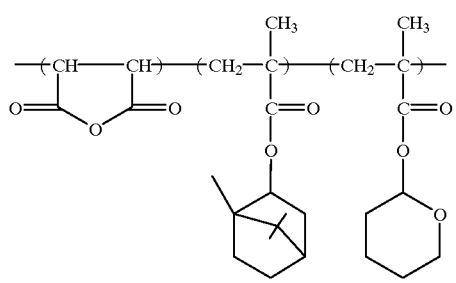
(PP-12)

(Preparation of resist and formation of resist pattern)

A photo-acid generator and a solubility inhibitor were blended with the high molecular copolymer synthesized as described above according to the formulation shown in the following Table 14 and the blend was dissolved in cyclohexanone to prepare resists of Examples (III-1) to (III-12) and Comparative Examples (II-1) and (II-2).

TABLE 14

|  | Polymer (wt. %) | Photo-acid generator (wt. %) | Others |
|---|---|---|---|
| Example |  |  |  |
| III-1 | PP-1(99) | TPS-OTf(1) | — |
| III-2 | PP-2(99) | TPS-OTf(1) | — |
| III-3 | PP-3(99) | TPS-OTf(1) | — |
| III-4 | PP-4(99) | TPS-OTf(1) | — |
| III-5 | PP-5(99) | TPS-OTf(1) | — |
| III-6 | PP-6(99) | TPS-OTf(1) | — |
| III-7 | PP-7(99) | TPS-OTf(1) | — |
| III-8 | PP-1(99) | BDI-OTf(1) | — |
| III-9 | PP-1(99) | NI-OTf(1) | — |
| III-10 | PP-3(88) | TPS-OTf(2) | tBoc-NN(10) |
| III-11 | PP-7(88) | TPS-OTf(2) | tBu-CO(10) |
| III-12 | PP-8(88) | TPS-OTf(2) | tBu-CO(10) |
| Comparative Example |  |  |  |
| III-1 | PP-11(99) | TPS-OTf(1) | — |
| III-2 | PP-12(99) | TPS-OTf(1) | — |

In Table 14, the photo-acid generators and solubility inhibitors shown in the above Table 14 are shown below, together with their abbreviations.

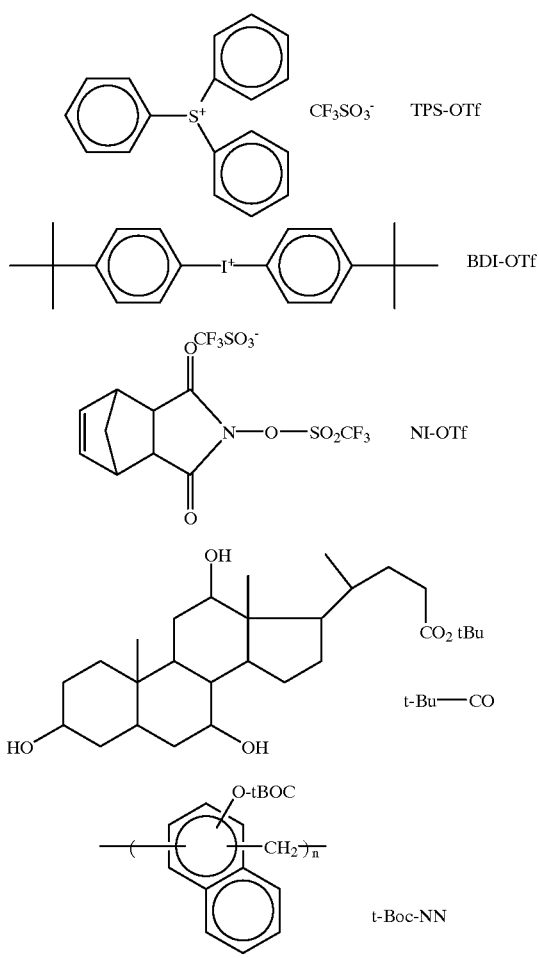

Then, each of these photosensitive compositions was spin-coated on the surface of a silicon wafer to form a resist film having a film thickness of 0.6 μm. A predetermined area of the resulting resist film was exposed to light by using an electron beam drawing apparatus (acceleration voltage: 50 keV) or a stepper (NA: 0.54) with ArF excimer laser in wavelength of 193 nm as a light source, thereby performing a pattern exposure.

Subsequently, the exposed resist film was subjected to a baking treatment at 120° C. for 2 minutes and the baked resist film was subjected to a developing treatment by using an aqueous solution of tetrahydroammonium hydroxide (TMAH). As a result, the light exposure portion of the resist film was selectively dissolved and removed to form a positive pattern. With respect to the photosensitive composition of Comparative Example 2, a pattern was formed by using two kinds of exposure lights, e.g. ArF excimer laser and electron beam.

The evaluation results of a sensitivity and a resolution of each resist are shown in the following Table 15, together with a dry etch resistance. The dry etch resistance was indicated by a relative value, assuming that Comparative Example (III-1) is 1.0.

For comparison of the dry etch resistance, EBR-9 as a conventional poly(α-chloroacrylate) was described as Comparative Example (III-3) in Table 15.

TABLE 15

| | PEB conditions | Light exposure | Sensitivity | Resolution (μm) | Dry etching resistance |
|---|---|---|---|---|---|
| Example | | | | | |
| III-1 | 100° C. × 90 s | ArF stepper | 73 mJ/cm$^2$ | 0.19 | 1.0 |
| III-2 | 90° C. × 90 s | ArF stepper | 64 mJ/cm$^2$ | 0.18 | 1.1 |
| III-3 | 100° C. × 90 s | EB | 4 μC/cm$^2$ | 0.12 | 1.1 |
| III-4 | 140° C. × 120 s | ArF stepper | 100 mJ/cm$^2$ | 0.19 | 1.0 |
| III-5 | 100° C. × 90 s | ArF stepper | 43 mJ/cm$^2$ | 0.20 | 1.0 |
| III-6 | 90° C. × 90 s | ArF stepper | 53 mJ/cm$^2$ | 0.21 | 1.0 |
| III-7 | 100° C. × 90 s | EB | 5 μC/cm$^2$ | 0.12 | 1.0 |
| III-8 | 100° C. × 90 s | ArF stepper | 60 mJ/cm$^2$ | 0.17 | 1.0 |
| III-9 | 100° C. × 90 s | ArF stepper | 54 mJ/cm$^2$ | 0.18 | 1.0 |
| III-10 | 100° C. × 90 s | EB | 3 μC/cm$^2$ | 0.15 | 0.9 |
| III-11 | 100° C. × 90 s | ArF stepper | 40 mJ/cm$^2$ | 0.20 | 0.8 |
| III-12 | 100° C. × 90 s | ArF stepper | 50 mJ/cm$^2$ | 0.20 | 0.8 |
| Comparative Example | | | | | |
| III-1 | 100° C. × 90s | ArF stepper | 200 mJ/cm$^2$ | 0.22 | 1.0 |
| III-2-1 | 100° C. × 90s | EB | 10 μC/cm$^2$ | 0.15 | 1.1 |
| III-2-2 | 100° C. × 90s | ArF stepper | 180 mJ/cm$^2$ | 0.20 | 1.1 |
| III-3 | | | | | 1.3 |

As shown in Table 15, all resists of this invention (Examples II-1 to II-12) are superior in sensitivity and resolution, and are also superior in etch resistance to a conventional α-chloroacrylate polymer.

The photosensitive composition of this Example has high sensitivity and high resolution to irradiation of an actinic radiation. By using such a photosensitive composition, a resist pattern having sufficient dry etch resistance can be formed by the alkaline development.

EXAMPLE IV 0.025 mol of vinylnaphthalene, 0.045 mol of 2-methacryloyladamanthyl hexahydrophthalic acid, 0.030 mol of 2-methacryloyladamanthyl t-butoxycalbonyl and 0.0125 mol of AIBN were dissolved in 30 g of THF. The resulting THF solution was freeze-deaerated three times under argon atmosphere at a liquid nitrogen temperature. After the THF solution was allowed to react at 60° C. for 30 hours under argon atmosphere, 2 ml of methanol was added to the reaction solution and 30 g of THF was further added. The reaction solution was added in 500 g of hexane drop by drop with stirring to perform reprecipitation, followed by filtration with a glass filter. Finally, the solid content was vaccum-dried at 60° C. for 3 days to obtain a copolymer (PI-44) having a repeating unit represented by the following chemical formula. A weight-average molecular of the resulting polymer was 11000 in terms of polystyrene.

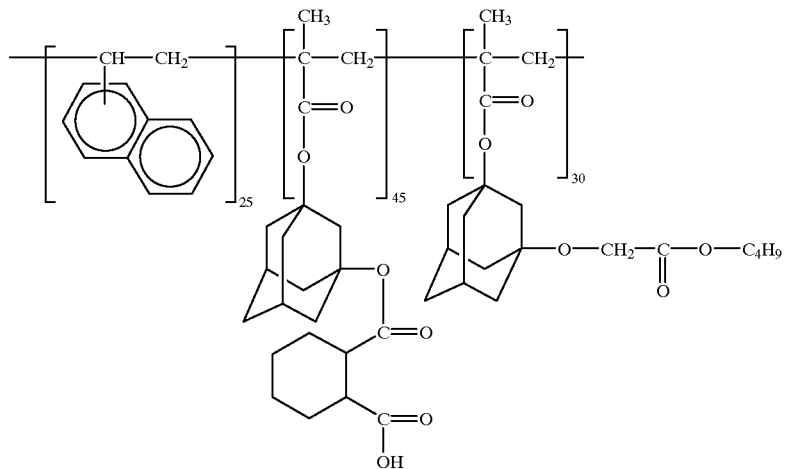

Following the same procedure as in Example I-8, a sensitivity of ArF excimer laser and a resolution of the pattern were examined on PI-44 as well as PI-43 prepared in Example I. The results are shown in Table 16 below.

TABLE 16

| Resin | Sensitivity (mJ/cm$^2$) | Resolution (line & space μm) |
|---|---|---|
| PI-43 | 20 | 0.20 |
| PI-44 | 24 | 0.225 |

As explained above, according to this invention, there is provided a photosensitive composition which is capable of forming a resist pattern having excellent transparency to ultra-short wavelength light such as ArF excimer laser, high sensitivity, high resolution and excellent dry etch resistance. Such a photosensitive composition is effective as a resist for use in a fine working in the manufacturing process of electronic parts, thus providing a great value in industrial viewpoint.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A photosensitive composition comprising a polymer having a repeating segment represented by the following general formula (1A) and a compound which is capable of generating an acid by irradiation of an actinic radiation;

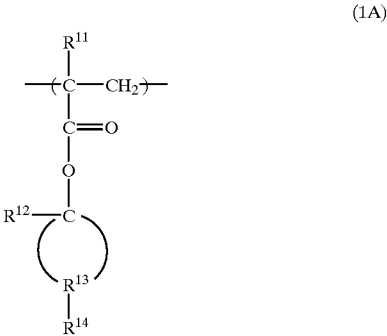

(1A)

wherein $R^{11}$ is a hydrogen atom, an aliphatic hydrocarbon group, an alkoxy group, a halogen atom or a cyano group; $R^{12}$ is an aliphatic hydrocarbon group or a cyclic olefin; $R^{13}$ is either one of (a) a straight chain aliphatic group having 2 to 12 carbon atoms, a cyclic group selected from the group consisting of a cyclobutane ring, a cyclopentane ring, a cyclohexane ring, a cycloheptane ring, a cyclooctane ring, a cyclobutane ring having a crosslinking hydrocarbon group, a cyclopentane ring having a crosslinking hydrocarbon group, a cyclohexane ring having a crosslinking hydrocarbon group, a cycloheptane ring having a crosslinking hydrocarbon group, a cyclooctane ring having a crosslinking hydrocarbon group, a spiro ring, a terpene ring, a steroid bile acid, a digitaloid ring, a camphor ring, an iso-camphor ring, a sesquiterpene ring, a santon ring, a diterpene ring, a triterpene ring and steroid saponins and (b) a hydrocarbon group represented by $-(CH_2)_m-$ (m is an integer of 3 to 9); and $R^{14}$ is a hydrophilic group.

2. A photosensitive composition comprising a polymer having a repeating segment represented by the following general formula (1B) and a compound which is capable of generating an acid by irradiation of an actinic radiation;
wherein said composition has an aromatic ring with conjugation length of 4 to 12, said aromatic ring is contained in a component copolymerized with said polymer, or said aromatic ring is contained in another compound separately added;

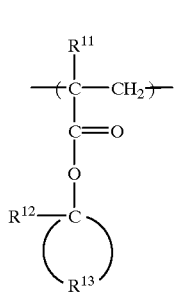

(1B)

wherein $R^{11}$ is a hydrogen atom, an aliphatic hydrocarbon group, an alkoxy group, a halogen atom or a cyano group; $R^{12}$ is an aliphatic hydrocarbon group or a cyclic olefin; $R^{13}$ is either one of (a) a straight chain aliphatic group having 2 to 12 carbon atoms, a cyclic group selected from the group consisting of a cyclobutane ring, a cyclopentane ring, a cyclohexane ring, a cycloheptane ring, a cyclooctane ring, a cyclobutane ring having a crosslinking hydrocarbon group, a cyclopentane ring having a crosslinking hydrocarbon group, a cyclohexane ring having a crosslinking hydrocarbon group, a cycloheptane ring having a crosslinking hydrocarbon group, a cyclooctane ring having a crosslinking hydrocarbon group, a spiro ring, a terpene ring, a steroid bile acid, a digitaloid ring, a camphor ring, an iso-camphor ring, a sesquiterpene ring, a santon ring, a diterpene ring, a triterpene ring and steroid saponins and (b) a hydrocarbon group represented by $-(CH_2)_m$ (m is an integer of 3 to 9).

3. The photosensitive composition according to claim 2, wherein said aromatic ring is naphthalene or a derivative thereof.

4. The photosensitive composition according to claim 2, which further comprises a polymer having a group which is capable of exhibiting an alkali-solubility as it is decomposed by an acid, and a functional group containing an alkali-soluble group.

5. A photosensitive composition comprising a polymer having a repeating segment represented by the following general formula (4) and a compound which is capable of generating an acid by irradiation of an actinic radiation;

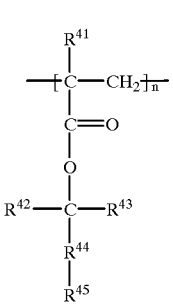

(4)

wherein $R^{41}$ is a hydrogen atom, an aliphatic hydrocarbon group, an alkoxy group, a halogen atom or a cyano group; $R^{42}$ and $R^{43}$ may be the same or different and are individually an aliphatic hydrocarbon or a cyclic olefin; $R^{44}$ is a group selected from the group consisting of cyclobutane ring, cyclooctane ring, a cyclobutane ring containing a crosslinking hydrocarbon group, a cyclooctane ring containing a crosslinking hydrocarbon group, spiro ring, terpene ring, steroid, bile acid, digitaloid ring, camphor ring, iso-camphor ring, sesquiterpene ring, santon ring, diterpene ring, triterpene ring and steroid saponins; and $R^{45}$ is a hydrophilic group.

6. The photosensitive composition according to claim 5, which has an aromatic ring with a conjugation length of 4 to 12, said aromatic ring is contained in a component copolymerized with said polymer, or said aromatic ring is contained in another compound separately added.

7. The photosensitive composition according to claim 6, wherein said aromatic ring is naphthalene or a derivative thereof.

8. The photosensitive composition according to claim 5, which further comprises a polymer having a group which is capable of exhibiting an alkali-solubility as it is decomposed by an acid, and a functional group containing an alkali-soluble group.

9. The photosensitive composition according to claim 5, wherein said repeating segment represented by the general formula (4) is a repeating segment represented by the following general formula (5):

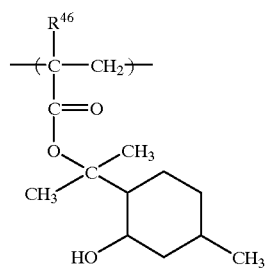

(5)

wherein $R^{46}$ is a hydrogen atom, an aliphatic hydrocarbon group, an alcoxy group, a halogen atom or a cyano group.

10. A method for forming a pattern, which comprises the steps of:

coating a photosensitive composition comprising a polymer having a repeating segment represented by the following general formula (4) and a compound which is capable of generating an acid by irradiation of an actinic radiation on a substrate, and drying the photosensitive composition with heating thereby forming a resin layer;

exposing a predetermined area of said resin layer to a pattern exposure by means of light irradiation;

performing a heat treatment of said resin layer after the pattern exposure; and developing said resin layer after the heat treatment by using a developer;

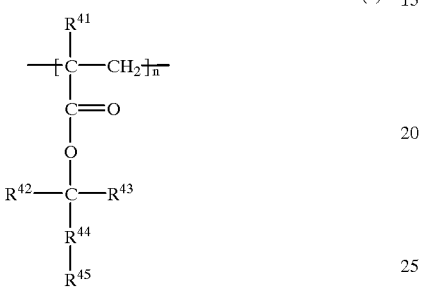

(4)

wherein $R^{41}$ is a hydrogen atom, an aliphatic hydrocarbon group, an alkoxy group, a halogen atom or a cyano group; $R^{42}$ and $R^{43}$ may be the same or different and are individually an aliphatic hydrocarbon or a cyclic olefin; $R^{44}$ is a group selected from the group consisting of cyclobutane ring, cyclooctane ring, a cyclobutane ring containing a crosslinking hydrocarbon group, a cyclooctane ring containing a crosslinking hydrocarbon group, spiro ring, terpene ring, steroid, bile acid, digitaloid ring, camphor ring, iso-camphor ring, sesquiterpene ring, santon ring, diterpene ring, triterpene ring and steroid saponins; and $R^{45}$ is a hydrophilic group.

11. A method for manufacturing electronic parts, which comprises the steps of:

coating a photosensitive composition comprising a polymer having a repeating segment represented by the following general formula (4) and a compound which is capable of generating an acid by irradiation of an actinic radiation on a substrate thereby forming a resist film;

exposing a predetermined area of said resist film to a pattern exposure by means of light irradiation;

developing said resin film after the pattern exposure by using a developer thereby forming a resist pattern; and performing a patterning of the substrate by making use of the resist pattern as an etching mask;

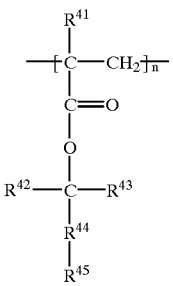

(4)

wherein $R^{41}$ is a hydrogen atom, an aliphatic hydrocarbon group, an alkoxy group, a halogen atom or a cyano group; $R^{42}$ and $R^{43}$ may be the same or different and are individually an aliphatic hydrocarbon or a cyclic olefin; $R^{44}$ is a group selected from the group consisting of cyclobutane ring, cyclooctane ring, a cyclobutane ring containing a crosslinking hydrocarbon group, a cyclooctane ring containing a crosslinking hydrocarbon group, spiro ring, terpene ring, steroid, bile acid, digitaloid ring, camphor ring, iso-camphor ring, sesquiterpene ring, santon ring, diterpene ring, triterpene ring and steroid saponins; and $R^{45}$ is a hydrophilic group.

12. The photosensitive composition of claim 1 wherein said hydrophilic group is a hydroxyl group or a carboxyl group.

* * * * *